United States Patent [19]
Wright et al.

[11] Patent Number: 6,054,894
[45] Date of Patent: Apr. 25, 2000

[54] DIGITAL CONTROL OF A LINC LINEAR POWER AMPLIFIER

[75] Inventors: Andrew S. Wright, Vancouver; Steven J. Bennett, Coquitlam, both of Canada

[73] Assignee: Datum Telegraphic Inc., Vancouver, Canada

[21] Appl. No.: 09/100,568

[22] Filed: Jun. 19, 1998

[51] Int. Cl.[7] ........................................... H03F 1/26
[52] U.S. Cl. ...................... 330/149; 330/124 R; 330/295
[58] Field of Search ............................... 330/149, 124 R, 330/295, 136, 2, 151

[56] References Cited

U.S. PATENT DOCUMENTS

| | | | |
|---|---|---|---|
| 3,777,275 | 12/1973 | Cox | 330/10 |
| 3,896,395 | 7/1975 | Cox | 330/53 |
| 3,906,401 | 9/1975 | Seidel | 330/149 |
| 3,909,742 | 9/1975 | Cox et al. | 330/124 R |
| 3,927,379 | 12/1975 | Cox et al. | 330/124 R |
| 3,978,424 | 8/1976 | Hobo et al. | 331/45 |
| 4,068,186 | 1/1978 | Sato et al. | 330/149 |
| 4,090,147 | 5/1978 | Seidel | 3330/124 R |
| 4,178,557 | 12/1979 | Henry | 330/124 R |
| 4,319,204 | 3/1982 | Weldon et al. | 332/9 R |
| 4,346,354 | 8/1982 | Hanna | 332/9 R |
| 4,420,723 | 12/1983 | de Jager | 330/10 |
| 4,433,312 | 2/1984 | Kahn | 332/22 |

(List continued on next page.)

OTHER PUBLICATIONS

James K. Cavers, Member, IEE –Article Entitled: The Effect of Quadrature Modulator and Demodulator Errors on Adaptive Digital Predistorters for Amplifier Linearization, IEEE Transactions on Vehicular Technology, vol. 46, No. 2, dated May 1997.

(List continued on next page.)

*Primary Examiner*—Robert Pascal
*Assistant Examiner*—Khanh V. Nguyen
*Attorney, Agent, or Firm*—Knobbe, Martens Olson & Bear, LLP

[57] ABSTRACT

The inventive LINC amplifier provides substantially linear amplification from two nonlinear amplifiers by decomposing the original signal into two constant amplitude envelope, phase varying signals, which, when combined, constructively and destructively interfere to re-form the original signal. The output of the LINC amplifier, which is to be transmitted via an antenna, is an amplified form of the original signal. The inventive LINC amplifier utilizes a digital control mechanism to control and adapt a digital compensation network that directly compensates for the imperfections of the analog RF environment, including the amplifiers. The mechanism monitors the combined amplifier output and adjusts the signal components in order to precisely compensate for any differences in the characteristics of the separate signal paths which would cause the combination not to accurately represent the original signal. The mechanism also corrects the component signals using information which can be applied to the amplifiers independent of the signal to be transmitted.

41 Claims, 22 Drawing Sheets

U.S. PATENT DOCUMENTS

| | | | |
|---|---|---|---|
| 4,490,684 | 12/1984 | Epsom et al. | 330/149 |
| 4,540,957 | 9/1985 | Hanna | 332/10 |
| 4,584,541 | 4/1986 | Nossen | 332/16 R |
| 4,656,434 | 4/1987 | Selin | 330/149 |
| 4,835,493 | 5/1989 | Walsh, Jr. | 332/41 |
| 5,093,636 | 3/1992 | Higgins, Jr. et al. | 332/100 |
| 5,107,520 | 4/1992 | Karam et al. | 375/60 |
| 5,148,448 | 9/1992 | Karam et al. | 375/60 |
| 5,249,201 | 9/1993 | Posner et al. | 332/106 |
| 5,264,807 | 11/1993 | Okubo et al. | 330/295 |
| 5,287,069 | 2/1994 | Okubo et al. | 330/10 |
| 5,329,259 | 7/1994 | Stengel et al. | 332/103 |
| 5,365,187 | 11/1994 | Hornak et al. | 330/149 |
| 5,410,280 | 4/1995 | Linguet et al. | 330/10 |
| 5,469,127 | 11/1995 | Hulick et al. | 330/10 |
| 5,568,086 | 10/1996 | Schuss et al. | 330/124 R |
| 5,568,088 | 10/1996 | Dent et al. | 330/124 R |
| 5,574,967 | 11/1996 | Dent et al. | 455/12.1 |
| 5,631,604 | 5/1997 | Dent et al. | 330/124 R |
| 5,638,024 | 6/1997 | Dent et al. | 330/124 R |
| 5,659,272 | 8/1997 | Linguet | 332/151 |
| 5,675,288 | 10/1997 | Peyrotte et al. | 330/149 |
| 5,705,959 | 1/1998 | O'Louglin | 332/151 |
| 5,732,333 | 3/1998 | Cox et al. | 330/149 |
| 5,748,678 | 5/1998 | Valentine et al. | 330/149 |
| 5,760,646 | 6/1998 | Belcher et al. | 330/149 |
| 5,867,065 | 2/1999 | Leyendecker | 330/149 |
| 5,892,395 | 4/1999 | Stengel et al. | 330/124 R |

OTHER PUBLICATIONS

Rui dinis, Paulo Montezuma and Antonio Gusmao, with CAPS, Instituto Superior Tecnico, Av. Rovisco Pais, 1096 Lisboa Codex –Five Page Article Entitled: Performace Trade–Offs with Quasi–Linearly Amplified OFDM through a Two–Branch Combining Technique, dated May 1996.

Lars Sundstrom, Student Member, IEEE –Article Entitled: The Effect of Quantization in a Digital Signal Component Separator for LINC Transmitters, IEEE Transactions on Vehicular Technology, vol. 45, No. 2, dated May 1996.

L. Sundstrom, Department of Applied Electronics, Land University, Article Entitled: Effects of Reconstruction Filters and Sampling Rate for a Digital Signal Component Separator on LINC Transmitter Performance, dated Jul 6, 1995, vol. 31, No. 14.

L. Dundstrom and M. Johnsson, Department of Applied Electronics, Land University, Article Entitled: Effect of Modulatioon Scheme on LINC Transmitter Power EfficiencyThree Page Article from Electronics Letters, dated Sep. 29, 1994, vol. 30, No. 20.

K.Y. Chan, A. Bateman and M. Li with Centre for communications Research, University of Bristol, U.K. –Article Entitled: Analysis and Realization of the LINC Transmitter using the Combined Analogue Locked Loop Universal Modulator (CALLUM), dated Mar. 1994.

Andrew Bateman, Mu Li and K. Chan with Centre for Communications Research, University of Bristol, U.K. – Article Entitled: Implementation of the LINC Transmitter using the Combined Analogue Locked Loop Universal Modulator (CALLUM), form Mobile and Personal Communications, 13–15, dated Dec. 1993, Conference Publication No. 387.

Fernando J. Casadevall, Member, IEEE, and Antonio Valdovinos, Student Member, IEEE –Article Entitled: Performance Analysis of QAM Modulations Applied to the LINC Transmitter from IEEE Transactions on Vehicular Technology, vol. 42, No. 4, dated Nov. 1993.

Dr. A. Bateman with Centre for Communications Research, University of Bristol –Article Entitled: The Combined Analogue Locked Loop Universal Modulator (CALLUM), dated Feb. 1992.

S.A. Hetzel, A. Bateman and J.P. McGeehan with Centre for Communications Research, University of Bristol, U.K. – Article Entitled: A LINC Transmitter, dated 1991.

S.A. Hetzel, A. Bateman and J.P. McGeehan, Centre for Communications Research, University of Bristol, U.K. – Article Entitled: LINC Transmitter, dated May 9, 1991, vol. 27, No. 10.

Fernando Casadevall, Juan J. Olmos with Department de Teoria del Senyal i Comunicacions –Articale Entitled: On The Behavior of the LINC Transmitter, dated 1990.

A. Bateman, R.J. Wilkinson and J.D. Marvill with Communications Research Group –Article Entitled: The Application of Digital Signal Processing to Transmitter Linearisation, dated 1988.

S. Tomisato, K. Chiba, and K. Murota, with NTT Radio Communication Systems Laboratories –Article Entitled: Phase Error Free LINC Modulator, dated Apr. 27, 1989, vol. 25, No. 9.

D.C. Cox with Bell Laboratories –Article Entitled: Linear Amplification with Nonlinear Components, dated Dec. 1974.

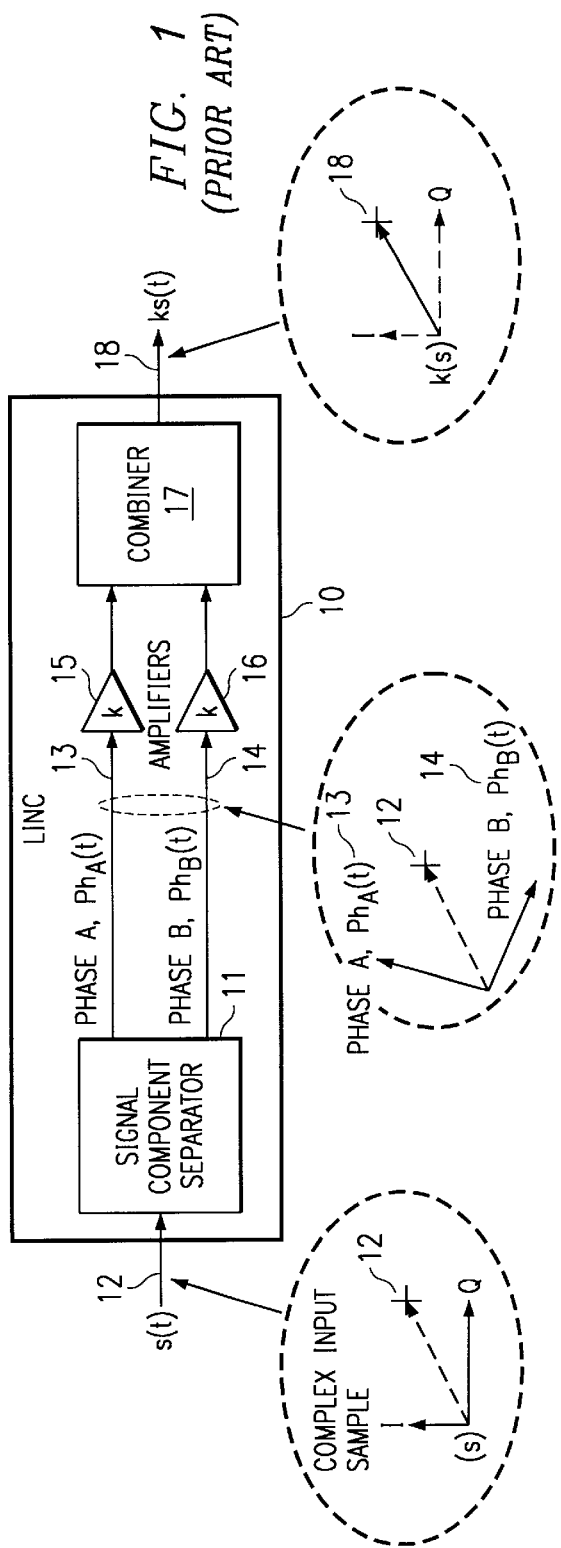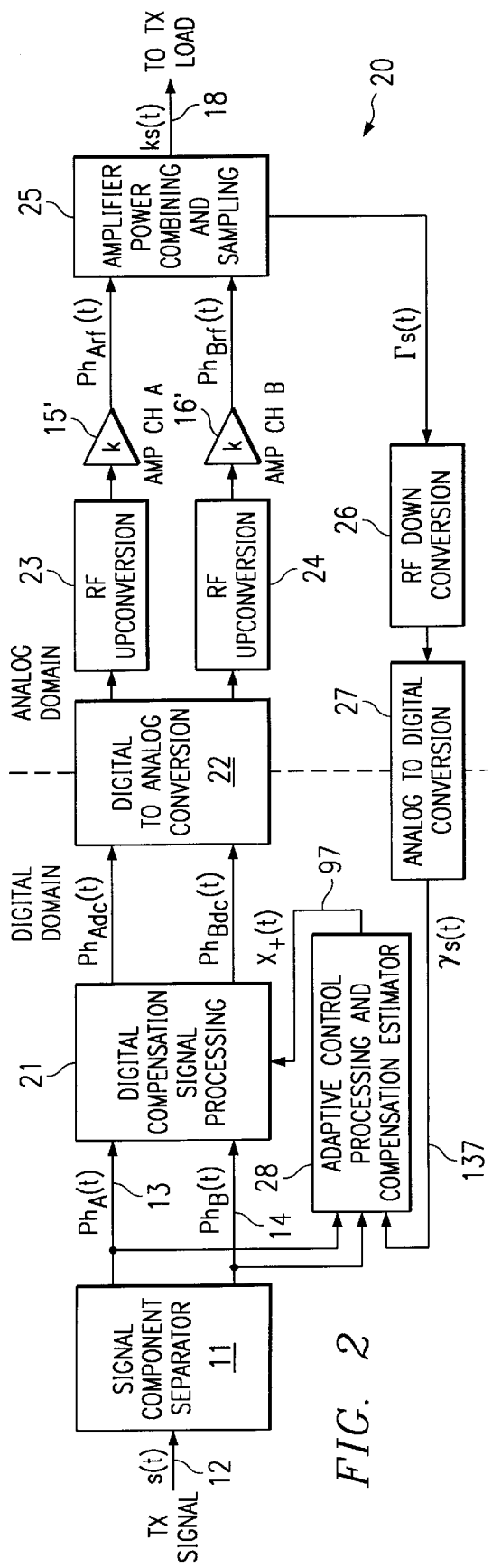

DIGITAL CONTROL OF A LINC LINEAR POWER AMPLIFIER

BACKGROUND OF THE INVENTION

Radio frequency power amplifiers are widely used to transmit signals in communications systems. Typically a signal to be transmitted is concentrated around a particular carrier frequency occupying a defined channel. Information is sent in the form of modulation of amplitude, phase or frequency or some combination of these which causes the information to be represented by energy spread over a band of frequencies around the carrier frequency. In many schemes the carrier itself is not sent since it is not essential to the communication of the information.

When a signal, which contains amplitude variations, is amplified it will suffer distortion if the amplifier does not exhibit a linear amplitude transfer characteristic. This means that the output is not linearly proportional to the input. It will also suffer distortion if the phase shift which the amplifier introduces is not linear over the range of frequencies present in the signal, or if the phase shift caused by the amplifier varies with the amplitude of the input signal. The distortion introduced includes intermodulation of the components of the input signal. The products of the intermodulation appear within the bandwidth of the signal causing undesirable interference, as well as outside the bandwidth originally occupied by the signal. This can cause interference in adjacent channels and violate transmitter licensing and regulatory spectral emission requirements.

Although filtering can be used to remove the unwanted out of band distortion, this is not always practical, especially if the amplifier is required to operate on several different frequencies. Distortion products which are at multiples of the carrier frequency can also be produced in a nonlinear amplifier, but these can typically be removed by filtering.

Intermodulation is also a problem when multiple signals are amplified in the same amplifier even if individually they do not have amplitude variations. This is because the combination of the multiple signals produces amplitude variations as the various components beat with each other by adding and subtracting as their phase relationships change.

Amplifiers can introduce some distortion even if they are well designed. Perfect linearity over a wide range of amplitude is difficult to realize in practice. Moreover, as any amplifier nears its maximum output capacity, the output no longer increases as the input increases and thus it becomes nonlinear. A typical amplifier becomes significantly nonlinear at a small fraction of its maximum output capacity. This means that in order to maintain linearity the amplifier is often operated at an input and output amplitude which is low enough such that the signals to be amplified are in the part of its transfer characteristic which is substantially linear. This method of operation is described as "backed off," in which the amplifier has a low supplied power to transmitted power conversion efficiency. A "Class A" amplifier operated in this mode may be linear enough for transmitting a signal cleanly, but might typically be only 1% efficient. This wastes power and means that the amplifier has to be large and relatively expensive. It also means that the wasted power is dissipated as heat which has to be removed by a cooling system.

Communication schemes using signals which have constant amplitude with frequency and phase modulation can use highly nonlinear amplifiers. These types of signals are unaffected by the distortion and the amplifiers can be smaller, cooler, more power efficient and less expensive. Modulation of this type is used in conventional radio paging systems which use CPFSK modulation.

Many of the newer, bandwidth efficient modulation schemes have both amplitude and phase variations. There is also a desire to be able to transmit multiple signals on different channels through a single amplifier. This reduces the number of separate amplifiers required and avoids the need for large, costly high level output signal combining Filters which have undesirable power losses.

In the prior art, linearized amplifiers can be made by correcting for the nonlinearities of amplifiers using mechanisms such as cartesian feedback, predistortion and feedforward correction.

Cartesian feedback is a mechanism in which a monitoring system looks at the output of the amplifier and attempts to alter the input of the amplifier so that it produces the intended output. This is arranged as a direct feedback loop. The delay in the feedback path means that the correction can be too late to correct effectively, especially at higher bandwidths.

The predistortion mechanism attempts to correct for the nonlinear transfer characteristic of an amplifier by forming an inverse model of its transfer characteristic. This characteristic is applied to the low level signal at the input of the amplifier in a nonlinear filter, to pre-distort it such that when it passes though the amplifier the signal emerges amplified and substantially undistorted. This method is capable of excellent results over a relatively small bandwidth. The filter has to be updated to account for variations in the amplifier transfer characteristic and this is done by monitoring the output and periodically updating the corrections. The filter also has to change its coefficients as often as every sample using the values stored in memory.

The feedforward mechanism derives a signal which represents the inverse of the distortions produced by the amplifier. This is done by comparing the amplifier input and output. A small linear amplifier is used to amplify the distortion signal. This signal is then subtracted from the main amplifier output. This method operates correctly over a wider bandwidth than the predistortion mechanism. However, balancing the amplitude and delay of the distortion signal so that it cancels the main amplifier errors exactly is complicated to perform.

Both predistortion and feedforward are widely used in commercial products which can amplify multiple signals and work over wide amplitude ranges. Both methods are quite complicated and the power efficiencies are still not excellent.

Feedforward amplifiers are typically only 5% efficient. The complicated processing requirements add to the cost and the power used and significant cooling capacity is still required to remove waste heat.

Another prior art amplifier is the LINC (Linear Nonlinear Component) amplifier 10, as shown in FIG. 1. A signal which has amplitude variations can be generated by two signals which vary only in their relative phases. The vector sum of the two signals can represent any amplitude. Thus, it is possible to represent the instantaneous state of any signal or combination of signals. The phase and frequency of the component signals can also be made to represent that of the original so that when combined, the original signal is reconstructed.

In FIG. 1, LINC amplifier 10 amplifies two or more constant amplitude signals, which represent an input signal to be amplified. A LINC amplifier uses a signal separator 11 to split the input 12 into the two components 13, 14, which are constant amplitude, phase varying components. The LINC amplifier may be supplied a complex baseband digitally sampled signal 12. The baseband signals 12 can be a representation of multiple modulated carriers using any modulations. For simplicity, various details such as the need to convert from baseband to a higher frequency and the need to convert from digital into analog have been omitted.

Since amplitude variations do not have to be dealt with, it is possible to build an amplifier which will amplify signals linearly by using the two phase and frequency modulated components. The nonlinearity of the amplifiers is no longer a problem in the amplification of multiple signals or those containing amplitude variations because the constant amplitude of the two components 13, 14 become constant amplified amplitudes as they are amplified by amplifiers 15, 16, while the phase of the components passes through the amplifiers with a constant shift. Although the nonlinear amplifiers produce distortion signals at multiples of the carrier frequency, these can be filtered off.

A problem occurs when the LINC mechanism is used for radio communication transmission at RF. Prior art descriptions which refer to the LINC idea have principally described methods of generation of the two phase component signals from an input signal, as shown in FIG. 1. A very high degree of accuracy in the phases and amplitudes of the two components, 13, 14 is required in order to achieve proper operation. If the two components 13, 14 are not extremely well balanced the distortions seen at the output of combiner 17 (which recombines the amplified signals of components 13 and 14) due to the effect of the imbalances can be worse than the effects of an amplifier non linearity. A typical prior art arrangement might only generate a signal which is 20 dB above its wideband intermodulation noise floor. This is not sufficient for most base station transmitter applications where 60 to 80 dB is often required.

Therefore, there is a need in the art for a modem radio communication system to have power amplifiers for multiple signals and signals which have varying amplitude. Moreover, there is a need for an amplifier unit which is power efficient and inexpensive. Current solutions to this problem are linearized amplifiers which are complicated and not particularly efficient. Prior art LINC amplifiers cannot be used because the two components cannot be accurately combined to the required degree of precision without the deleterious effects of imbalance.

SUMMARY OF THE INVENTION

These and other objects, features and technical advantages are achieved by a system and method which uses a LINC power amplifier for efficient linear amplification of multiple signals and signals containing amplitude variations.

The inventive LINC amplifier includes a circuitry that monitors the combined amplifier output and adjusts the signal components in order to precisely compensate for any differences in the characteristics of the separate signal paths which would cause the combination not to accurately represent the original signal. This arrangement enables the advantages of LINC amplification to be fully realized, particularly for RF signals. Using this system periodic breaks in transmission for re-calibration are not required.

The inventive system converts an input signal into constant amplitude components which allows the amplifier to work correctly and efficiently with a variety of input signal types. The inventive system can use two component signals.

The inventive system also corrects the component signals using training patterns which can be applied to the amplifiers without being transmitted. The circuit may be balanced prior to commencement of transmission when the amplifier has been keyed off or switched off for some time so that the amplifiers will start up balanced for any drift in the parameters of the components which may have occurred. This also means that the system can start transmission pre-heated to normal operating temperature, which especially useful in short burst type transmissions.

The amplifiers in the inventive LINC system operate at a constant power which makes the correction process much simpler than that required in the prior art predistortion and feedforward arrangements of linearization of amplifiers. Those arrangements must correct for the nonlinearities of the amplifiers over a wide range of amplifier operating powers. They also have to correct for secondary distorting effects, such as those due to the varying loading on their power supplies as the amplifier is called upon to output more or less power.

The inventive LINC amplifier can accept any type of signal with any type of modulation without retraining of the correction. The bandwidth of signals which can be amplified is limited by the clocking speed of digital components but cannot exceed one RF octave, which is a limitation of any nonlinear amplifier.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 depicts a schematic diagram of a prior art LINC amplifier arrangement;

FIG. 2 depicts a schematic diagram of the inventive LINC amplifier arrangement;

DETAILED DESCRIPTION OF THE PREFERRED EMBODIMENTS

Figure 3:
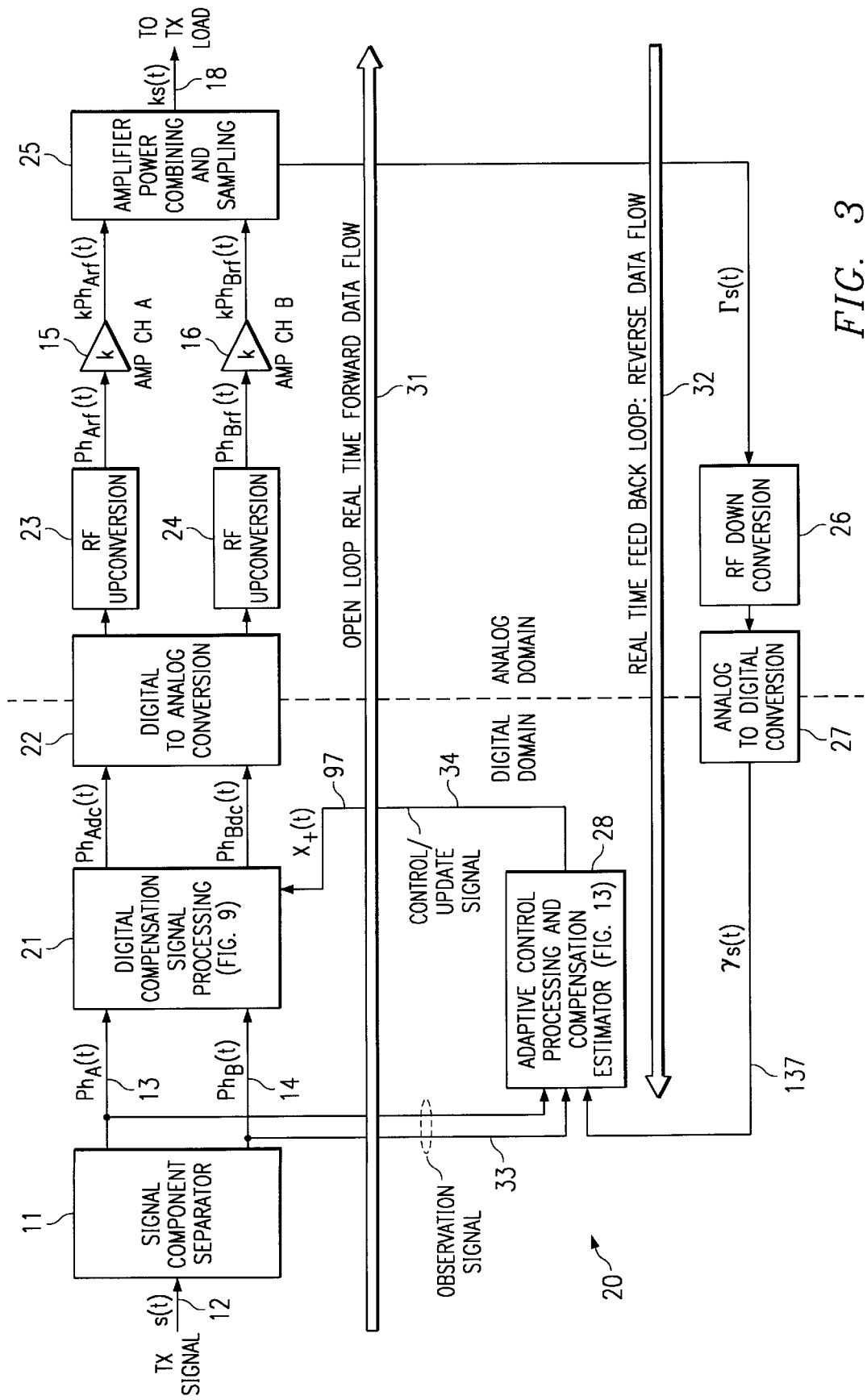
FIG. 3 depicts a schematic diagram of data and control flow of the inventive amplifier of FIG. 2.
Figure 4A:
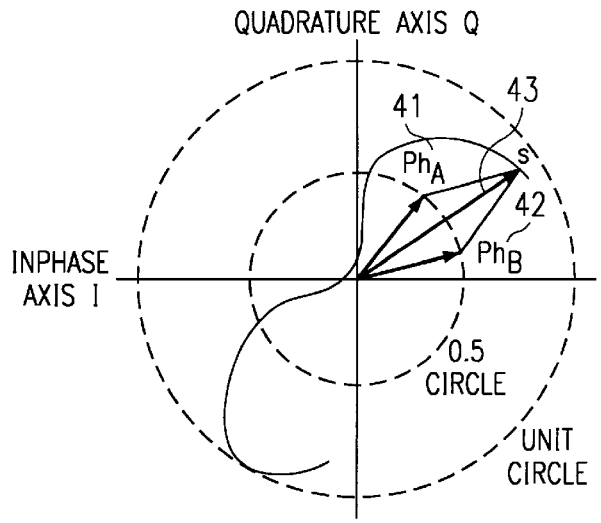
FIGS. 4A–4D depict graphs of the operation of the signal component separator element of FIG. 2.
Figure 4B:
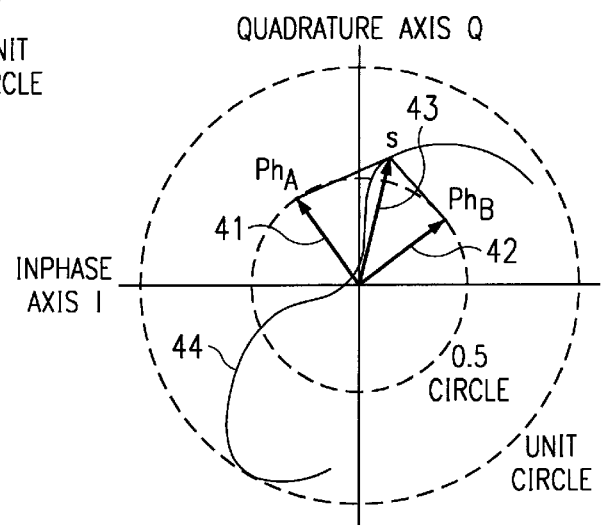
Figure 4C:
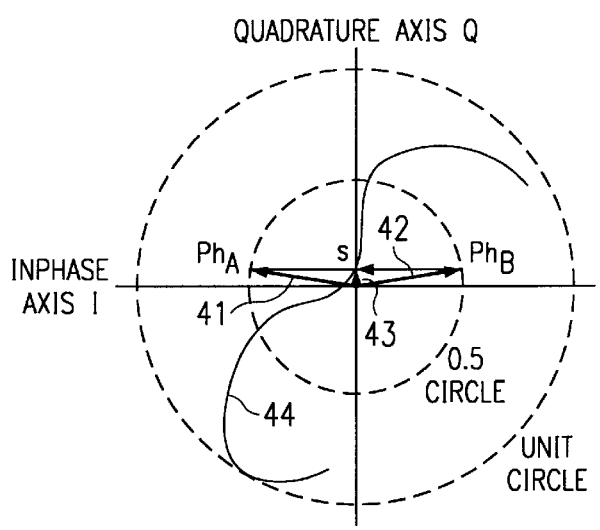
Figure 4D:
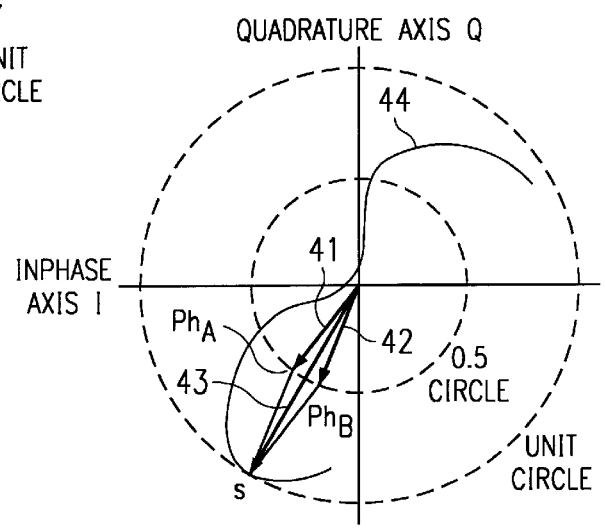

FIG. F 2 depicts the inventive LINC amplifier system and method of operation 20. The amplifier is constructed from the following core components; a signal component separator 11, a digital compensation signal processing block 21, a generalized digital to analog conversion block 22, two RF up conversion chains 23, 24, two non linear amplifiers 15, 16, an amplifier power combining and sampling structure 25, RF down conversion 26, a generalized analog to digital conversion block 27 and an adaptive control processing and compensation estimator block 28.

LINC amplifier 10 provides substantially linear amplification from two non-linear amplifiers 15, 16 by deliberately decomposing the original signal 12 to be transmitted into two constant amplitude envelope, phase varying signals 13, 14, which, when combined, constructively and destructively interfere to re-form the original signal, which represents an amplified form (k=gain) of the original signal, that is to be transmitted. This approach is desirable because constant amplitude envelope, phase varying signals can be amplified to form ks(t) 18 without degradation by nonlinear amplifiers 15, 16. Ordinarily, the amplifier requires that both RF up conversion and amplifier channels are identical and free from imperfections. In practice, it is impossible to build two identical analog circuits, and thus perfect constructive and destructive signal recombining is impossible to achieve. The LINC amplifier is extremely sensitive to phase, delay and amplitude imbalance between the two amplifier chains which has caused the LINC design to be abandoned by many investigators. Th e inventive LINC amplifier utilizes a control technique to control and adapt a digital compensation network that directly compensates for the imperfections of the analog RF environment.

FIG. 3 depicts the data and control flow paths within the system of FIG. 2. The general overall operation of the system of FIG. 2 is described by following these major data flows.

The open loop real time forward data flow path is concerned with the direct flow of data or signals from applied input signal 12 through to amplifiers 15', 16'. This path operates in real time. The signal component separator 11 generates two wideband constant amplitude envelope phase varying signals 13, 14. Note that signal separator 11 could separate input signal 12 into more than two components, if desired. The signal processing sample rate required to do this separation is between 8 and 16 times the bandwidth of the complex bandlimited input signal s(t) 12. Note that the baseband samples could be interpolated up to the higher rate, as needed by the signal component separator. This would generate the two phase modulated component signals at up to 16 times the input sample rate. This allows the signal component separator to operate from sample to sample at that rate. Since system 20 employs analog components, which have manufacturing imperfections, system 20 utilizes feedback control to ensure near-perfect operation. One method of achieving this control is by constructing a feedback loop which operates in real time and provides compensation by using data from the output of amplifier power combiner 25.

Real time adaptive control processing and compensation estimation is not required because the imperfections in the RF upconversion stages and the amplifiers change very slowly as a function of time. This permits off line computation to be achieved by allowing the adaptive control processing and compensation estimator to extract a sample of the amplified output and samples of the two phase signals 13, 14 (obs signal). This data is utilized to compute residual imperfections in the upconversion and amplifier paths and then identify parameter corrections that should be made in the digital compensation signal processing block. The updated parameters are provided to this block 21 via the control update signal path.

The complex baseband signal s(t) 12 that is intended to be amplified is applied to the input of signal component separator (SCS) 11. In the digital design, the SCS 11 requires that s(t) 12 be a bandlimited complex baseband signal. If s(t) is only available as a real passband digital IF or real analog RF passband signal then it must be converted to a complex baseband representation. This modification is performed by utilizing techniques such as Hilbert transforms and digital mixing. SCS 11 decomposes complex signal s(t) 12 into two constant amplitude envelope, phase varying complex baseband signals, $Ph_A(t)$ 13 and $Ph_B(t)$ 14. These two signals are deliberately constructed so that when recombined by simple linear addition, the original transmitted signal s(t) 12 is reconstructed, this is described by equation 1.

$$s(t)=Ph_A(t)+Ph_B(t) \qquad \text{eqn 1}$$

The separate processing of the two signals between SCS 11 and combiner 25 contributes to the total distortions which have to be corrected. Although system 20 removes distortions in the signal paths, it is preferable to use processing techniques which are as free as possible from potential errors.

The signals, $Ph_A(t)$ 13 and $Ph_B(t)$ 14 are passed to digital compensation and signal processing block 21. This block inserts phase rotations, propagation delays, amplitude gains, DC offsets and IQ cross talk into each of the $Ph_A(t)$ and $Ph_B(t)$ signals, as required to correct errors introduced in the signal paths. The amount of compensation is commensurate with that required to cancel the imperfections incurred by the analog up conversion chains. Since each up conversion chain is independent, the corrections for each signal path may be entirely different. The digital compensation and signal processing block then provides two digital compensated signals $Ph_{Adc}(t)$ and $Ph_{Bdc}(t)$ to the digital to analog conversion block 22. Note that the digitally compensated signals, $Ph_{Adc}(t)$ and $Ph_{Bdc}(t)$, are no longer necessarily required to satisfy the constant amplitude envelope condition. This can be seen when the digital compensation signal processing block 21 corrects for frequency dependent amplitude variations in the analog up conversion chain.

Note that the compensation of the two signals which are initially constant envelope amplitude is arranged to make the two phase component signal paths match all the way to the point of combination. This point is at RF inside the quadrature coupler. There can be amplitude variations due to the upconversion, the amplifiers and even in the quadrature coupler itself. The variations may be slight in the last two but they mean that strictly speaking the signals at the inputs and outputs of the amplifiers are not necessarily absolutely constant envelope amplitude. Non-linear amplifiers driven up at saturation do not exhibit significant gain slope over frequency over the bandwidths required. Quadrature couplers have to be chosen to work at a range of frequencies where their characteristics are substantially flat over frequency, however, the existing description assumes perfection. If the correction circuits are to have even a slight effect on the amplifier outputs it is likely that a large amplitude variation will be required at the inputs to the amplifiers. This large variation will be "clipped" and the output of the amplifiers will change only slightly. When analog quadrature modulators are used it is necessary to add the additional corrections for DC offsets, gain balance and I/Q crosstalk. This results in other amplitude variations in the signal paths which cancel out the variations in the quadrature modulator. This means that these variations are canceled before the amplifiers.

Analog quadrature modulation can be direct when done at the RF frequency and in that case there is no upconversion. It can also be done at a lower intermediate frequency and followed by analog upconversion.

The digital to analog conversion block 22 is utilized to capture a variety of possibilities by which a complex baseband signal such as $Ph_{Adc}(t)$ and $Ph_{Bdc}(t)$ can be imposed upon an RF carrier. The output signals of block 22 each pass through a respective RF upconversion block 23, 24 to form the RF signals $Ph_{ARF}(t)$ and $Ph_{BRF}(t)$ which are applied to the input of non linear amplifiers 15' and 16'. Note that direct conversion from complex baseband can be achieved by utilizing a quadrature up convertor. This requires that two standard digital to analog convertors (DACs) are employed to generate an analog complex baseband signal that is applied to the RF or IF and upconversion process. However, this approach is often undesirable because practical analog quadrature modulators incur significant degradations due to DC offsets and IQ crosstalk (IQ phase and amplitude imbalance). An alternative approach is to deliberately generate a digital IF signal by performing a complex baseband to digital IF conversion which generates a real digital IF signal that utilizes a DAC to generate a real passband low IF signal that may be up converted to RF. This approach is desirable because essentially a quadrature conversion is achieved within the digital domain which incurs no imperfection. Furthermore the approach is advantageous because only a single DAC is required per RF channel. The approach may however require a more costly up conversion process.

The two substantially constant amplitude envelope phase varying RF passband signals $Ph_{ARF}(t)$ and $Ph_{BRF}(t)$ are then applied to the inputs of non linear amplifiers 15' and 16'. Since the signals exhibit a constant envelope and the non-linear amplifiers are characterized by AM-AM and AM-PM distortion, the RF passband signals may be amplified without incurring any degradation. The output of the amplifiers is at a significantly higher power level, characterized by the gain of the amplifiers k. Thus, the amplifier outputs are defined as $kPh_{ARF}(t)$ and $kPh_{BRF}(t)$, where k is the gain of the amplifier. The amplifier outputs are then fed to the linear amplifier power combining and sampling block 25 which linearly combines the two RF signals in accordance with equation 1. This may be achieved with standard microwave components by those skilled in the art. Since the digital compensation signal processing block 21 has correctly compensated for all up conversion imperfections, the combined $kPh_{ARF}(t)$ and $kPh_{BRF}(t)$ signals will constructively and destructively combine to form the amplified version, ks(t) of the original input signal, s(t). Ordinarily, in a open loop LINC design the signal ks(t) 18, is fed directly to the amplifier load, typically an antenna. Note that a small sample of signal 18 is coupled into the RF down conversion block 26, which forms part of the real time feedback loop path 32.

This sample, $\Gamma s(t)$, is down converted to complex baseband by the RF down conversion block 26 and analog to digital conversion block 27. As described earlier, various techniques are available which permit cost, complexity and imperfection trade-offs to be made. Thus the real RF passband signal, $\Gamma s(t)$, is translated to a complex baseband equivalent signal, $\gamma s(t)$ 137 which is utilized by the adaptive control processing and compensation estimator block 28. This block 28 is also provided with the complex baseband signals, $Ph_A(t)$ 13 and $Ph_B(t)$ 14 and forms observation signal path 33. Adaptive control processing and compensation estimator block 28 examines these three signals, and determines the remaining level of imperfection in the analog up conversion process which has not been previously corrected. This information is then utilized to compute updates to the existing correction parameters. These new parameters are then provided to the digital compensation signal processing block 21 via $X_+(t)$, which is a vector of the latest estimates of the correction parameter values and forms control/update signal path 34. After each new parameter set has been provided to the digital compensation signal processing block 21, the adaptive control processing and compensation estimator block selects another set of data samples for processing. Thus, the control algorithm block does not need to operate in real time because the rate of change observed in the output signal ks(t) is actually much slower than the rate of control update. This permits the open loop LINC amplifier 20 to be controlled with an off line closed loop controller. Note that an operating bandwidth constraint has not been placed upon system 20. Typical real time closed loop systems are constrained by the loop delay which infers a finite operating bandwidth which is generally 10× lower than the open loop bandwidth.

Signal component separator 11 decomposes a bandlimited complex baseband waveform, i.e., the information bearing signal, s(t) 12, into two complex baseband constant amplitude phase varying signals, $Ph_A(t)$ 13 and $Ph_B(t)$ 14. The decomposition is subject to the requirement that when the two signals, $Ph_A(t)$ and $Ph_B(t)$, are recombined by linear addition, the resultant vector reconstructs the original signal s(t). Thus, non linear amplifiers, such as class AB, C, E, F and S. can be utilized to amplify the constant amplitude envelope phase varying signals, $Ph_A(t)$ and $Ph_B(t)$, without incurring any significant distortion. This can be achieved because amplifiers are characterized by amplitude to amplitude, AM-AM, and amplitude to phase, AM-PM, distortion characteristics. If the amplitude of the waveform/signal that is applied to the amplifier is constant, then no variation in phase or amplitude is observed at the output of the amplifier. Therefore, distortion products are not generated.

Many prior art methods of signal component separation use analog mechanisms which were subject to parameter variation and drift. Using digital signal component separation gives controlled precision defined by the digital resolution. There is quantization error but this is controlled at the design stage and remains unchanged. The stable and precise signal components make the task of correction easier by removing a source of inaccuracy. A digital version of the component separator was published in 1988 in the open literature (*The Application of Digital Signal Processing to Transmitter Linearization*, Authors: A. Bateman, R. J. Wilkinson and J. D. Marvill, IEEE 88CH2607-0, pp. 64–67) and also in 1991 (*A LINC Transmitter,* Authors: S. A. Hetzel, A. Bateman and J. P. McGeehan, IEEE CH 2944-7/91/0000/0133, pp. 133–137; *LINC Transmitter*, Authors: S. A. Hetzel, A. Bateman and J. P, McGeehan, Electronics Letters $9^{th}$ May, 1991 Vol. 27 No. 10, pp. 844–846), and *Performance Trade-Offs With Quasi Linearly Amplified OFDM Through a Two-Branch Combining Technique*, Authors: Rui Dinis, Paulo Montezuma and Antonio Gusmao, IEEE 0-7803-3157-5/96, pp. 899–903. which are all incorporated herein by reference. The mathematical development of the signal component separator is undertaken by examining equation 2 which describes the input signal s(t), which is the signal to be amplified, as samples of a bandlimited complex baseband signal. This description imposes no limits upon the nature of the signal s(t) other than it is bandlimited. Thus, the signal trajectory may migrate to any location within the complex plane provided that the rate of change of amplitude and phase does not violate the bandlimited criteria. Note that the finite output power of the amplifiers will impose an additional constraint upon the signal s(t).

$$s(t)=I(t)+jQ(t) \qquad \text{eqn 2}$$

The signal s(t) 12 may be decomposed into two components $Ph_A(t)$ 13 and $Ph_B(t)$ 14 as described by equations 3a and 3b. Equation 3c represents a common term.

$$Ph_A(t) = \frac{I(t)}{2} - Q(t)\xi(t) + j\left(\frac{Q(t)}{2} + I(t)\xi(t)\right) \qquad \text{eqn 3a}$$

$$Ph_B(t) = \frac{I(t)}{2} + Q(t)\xi(t) + j\left(\frac{Q(t)}{2} - I(t)\xi(t)\right) \qquad \text{eqn 3b}$$

$$\xi(t) = \sqrt{\frac{1}{I^2(t)+Q^2(t)} - \frac{1}{4}} \qquad \text{eqn 3c}$$

Examination of equations 3a,b and c reveals that the signals $Ph_A(t)$ and $Ph_B(t)$ are complex baseband signals with constant amplitude envelopes and phase varying modulation trajectories. Consequently, these signals meet the criteria for distortion free amplification by non linear amplifiers. Equation 4 confirms that the signal component separation has also satisfied the requirement that the original signal can be recovered.

$$s(t)=Ph_A(t)+Ph_B(t)=I(t)+jQ(t) \qquad \text{eqn 4}$$

The above analysis demonstrates that signal component separation can be achieved at complex baseband. However, in practice, each constant amplitude envelope, phase varying signal component is up converted to a real passband RF signal, which is amplified and combined at RF. Consequently, it is appropriate that the recombination process is verified at RF. Equation 5 decomposes the real passband signal $S_{RF_{LINC}}(t)$ into inphase and quadrature components.

$$S_{RF}(t)=I(t)\cos\omega_c t-Q(t)\sin\omega_c t \qquad \text{eqn 5}$$

Equation 6 provides the linear combination of the two real passband signals that would be utilized in the power combining process to form $S_{RF_{LINC}}(t)$ $$S_{RF_{LINC}}(t) = \left(\frac{I(t)}{2} - Q(t)\xi(t)\right)\cos\omega_c t - \qquad \text{eqn 6}$$
$$\left(\frac{Q(t)}{2} + I(t)\xi(t)\right)\sin\omega_c t + \ldots - \left(\frac{I(t)}{2} + Q(t)\xi(t)\right)\cos\omega_c t -$$
$$\left(\frac{Q(t)}{2} - I(t)\xi(t)\right)\sin\omega_c t \ldots$$

Simplification of equation 6 yields equation 7.

$$S_{RF_{LINC}}(t)=I(t)\cos\omega_c t-Q(t)\sin\omega_c t \qquad \text{eqn 7}$$

Note that equation 5 and equation 7 are identical, which indicates that the RF upconversion process will not undermine the efficacy of the signal decomposition provided by the signal component separator.

FIGS. 4A–4D depict the operation of the signal component separator 11, as the signal trajectory varies. These figures illustrate a portion of a signal trajectory in the complex baseband modulation plane which corresponds to a signal s(t). The figures also illustrate that the signal trajectory is constrained within the unit circle. Note that two vectors, $Ph_A$ 41 and $Ph_B$ 42, each of amplitude ½, may be utilized to reconstruct any point upon the signal trajectory. The original signal trajectory point is simply reconstructed by adjusting the phases of the signal component vectors, $Ph_A$ 41 and $Ph_B$ 42, such that an appropriate portion of each vector constructively interferes to reform the vector s 43, while any excess destructively interferes. The equation presented, in the previous section, permits the vectors $Ph_A$ 41 and $Ph_B$ 42 to be directly computed for any point upon the signal trajectory. Note that the time dependence of these vectors has been suppressed. Thus, input signal s 43 is zero when the vectors, $Ph_A$ 41 and $Ph_B$ 42, are adjusted to be in exact antiphase. Alternatively, if the input signal approaches unity amplitude then the vectors, $Ph_A$ 41 and $Ph_B$ 42, are co-phased. Naturally, the instantaneous phase of the signal s 43 is readily reformed by rotating the vectors, $Ph_A$ 41 and $Ph_B$ 42, by a common reference phase.

Figure 5:
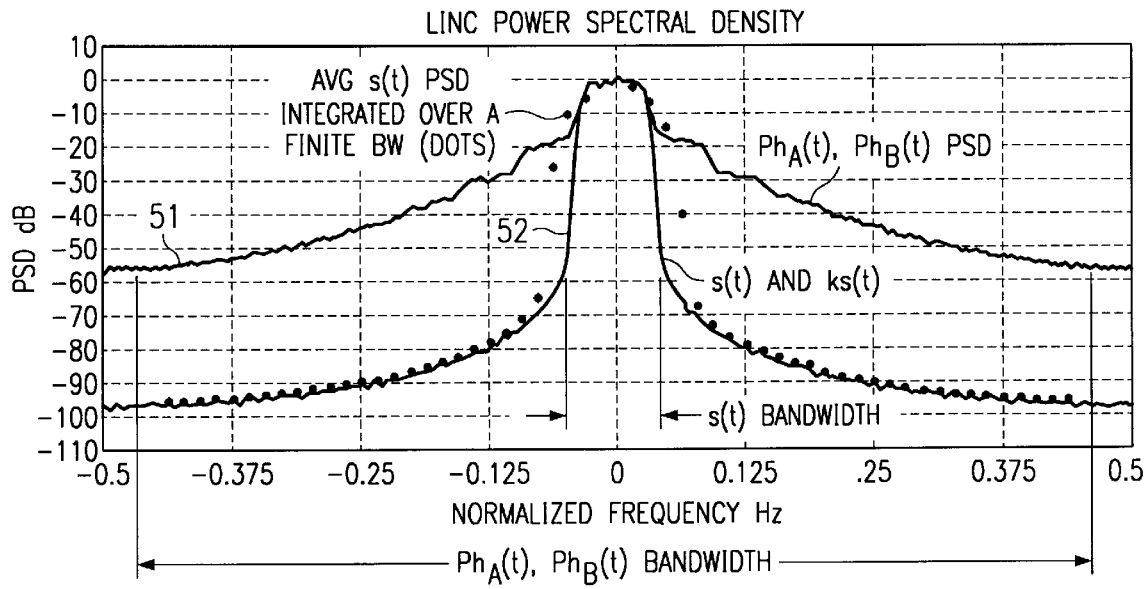
FIG. 5 depicts a graph of the power spectral densities of various signals in the inventive amplifier of FIG. 2.

Any bandlimited complex baseband signal could be decomposed by the signal component separator into two constant amplitude envelope phase varying signals. However, a penalty associated with this technique is that the signal components $Ph_A(t)$ and $Ph_B(t)$ undergo a significant bandwidth expansion. FIG. 5 illustrates this effect, wherein the power spectral density 51 is significantly wider than the PSD 52 of the original signal s(t) 12. Note that after recombination the power spectral density 52 of the amplifiers combined outputs ks(t) 18 is identical to the original signal, assuming that the amplifier gain has been normalized. This permits a dual frequency domain interpretation of the LINC operation which is identical to the time domain. That is, co-phased information within the signal components $Ph_A(t)$ and $Ph_B(t)$ that constructively interferes is constrained within the original signal bandwidth, while the anti-phase information which destructively interferes lies outside the original signal bandwidth. This permits frequency domain amplifier efficiency analysis to be performed by simply integrating the PSD over these two regions.

A significant contribution to the generation of spectral energy beyond the bandwidth of the complex baseband signal s(t) is shown in FIGS. 6A–6D. These figures depict a portion of the complex envelope signal trajectory s(t) 64 as it migrates across the complex modulation plane. The path of the trajectory is such that the loci directly passes through the origin, invoking a 180 degree phase change. This does not cause bandwidth expansion in the original signal s(t) 12 because the transition is associated with a zero amplitude. However, if the behavior of the signal component separator wherein equations 3a, b and c are utilized, then the two signal components $Ph_A(t)$ and $Ph_B(t)$ must undergo an almost instantaneous 180 degree phase shift, if the original signal s(t) is to be correctly reconstructed. This effect is observed by comparing FIGS. 6B and 6C in FIG. 6. Since the component signals, $Ph_A(t)$ and $Ph_B(t)$, have a constant amplitude and hence finite power, the rapid phase change will cause high frequency power spectral components to be generated.

This problem can be avoided by using a mechanism to identify 180 degree phase transitions of the complex modulation plane by the original signal. Rapid phase transitions in the signal components can be eliminated by switching the context of the signal components, so that the rapid phase change in the signal components does not occur. Note that it is irrelevant from a system perspective if the resultant recombined signal s(t) is formed from two vectors that have switched context or not, provided that the resultant signal vector exactly follows the original signal trajectory, s(t). This approach is depicted in FIG. 7.

Figure 7A:
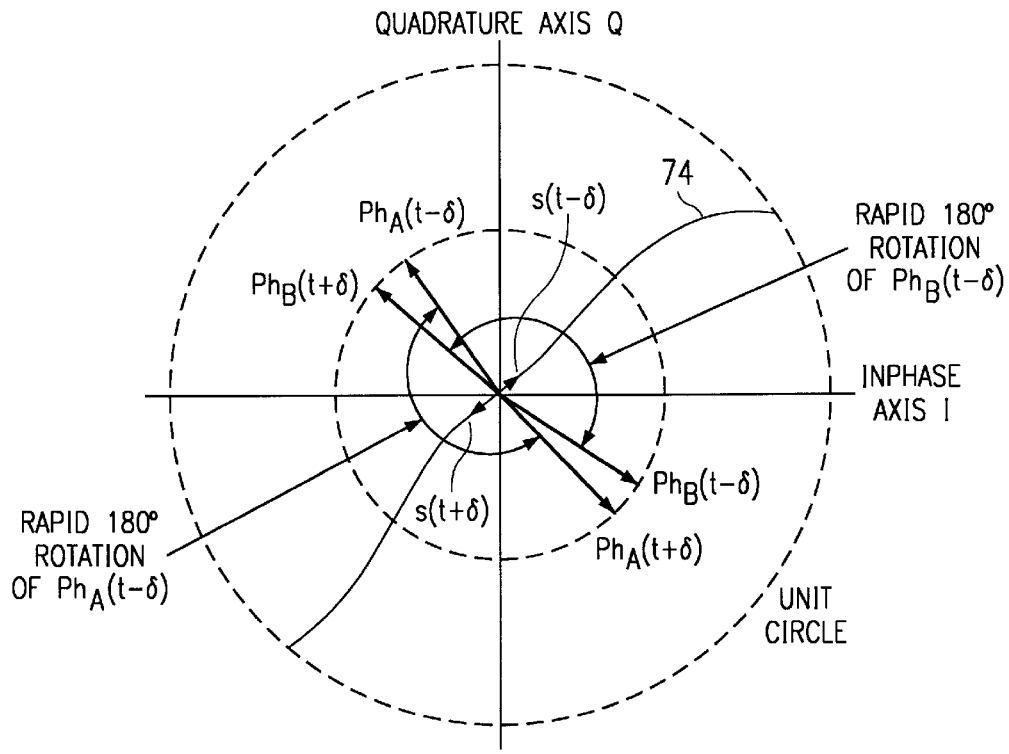
FIGS. 7A–7B depict graphs of the operation of the signal component separator element of FIG. 2 without the rapid phase changes of FIG. 6.
Figure 7B:
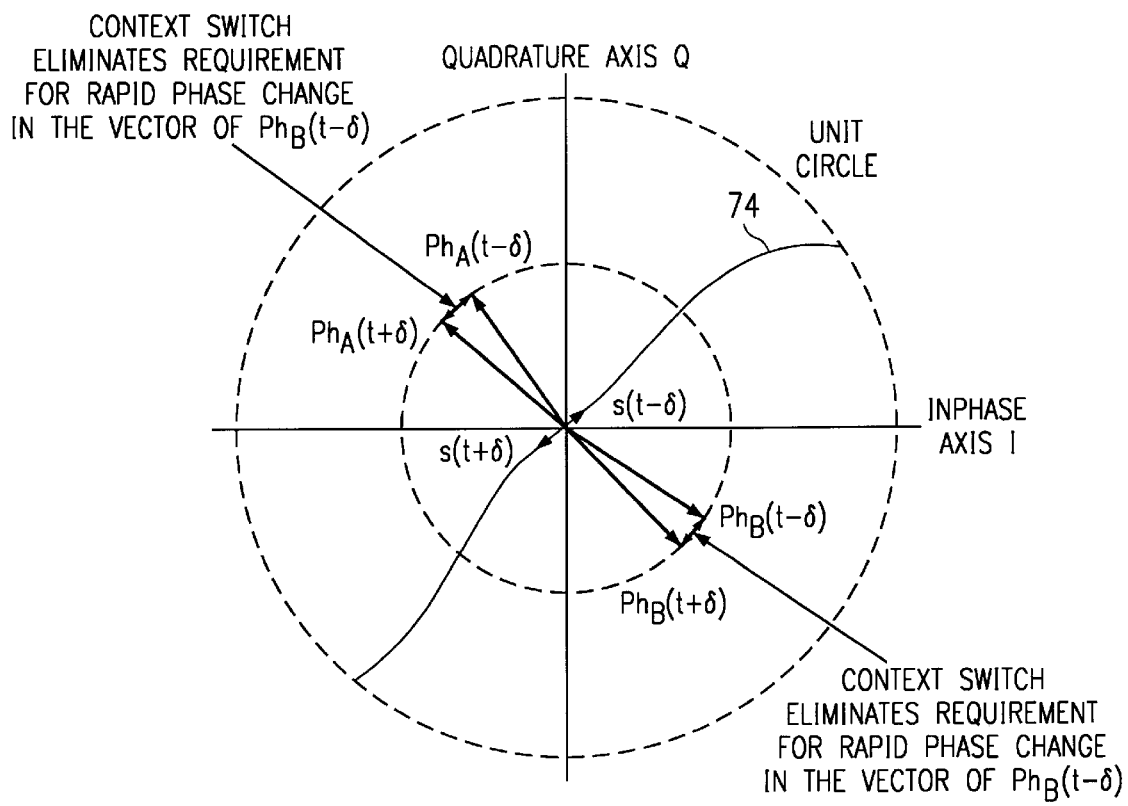

FIGS. 7A and 7B show a trajectory which crosses the origin of the complex plane. This is represented by the two components $Ph_A$ and $Ph_B$. As the trajectory gets close to the origin, the two components move to a position at 180 degrees apart, where flip would actually occur. Note that it is assumed that this occurs at a time (t). The signal component separator works on samples in and gives samples out. This means that the positions are seen at discrete instants. In this case, there are two sets of samples of the two phase components at times an amount delta before and after (t). That is (t−δ) before and (t+δ) after the point, which is typical of how the samples would be generated by the signal component separator.

FIG. 7A shows the movement required to follow the paths. This means that successive samples of the two components have a large phase difference which generates a burst of a high modulation frequency in their respective upconversion and amplification paths. This is a frequency component which deviates a long way from the center of the signal band. This is seen in the individual signal paths of the successive sample values. A swap of the source signals at the output of the signal component separator produces the situation as seen in FIG. 7B. The resultant trajectory is the same but the amount of movement from one sample to the next in each individual upconversion path is much smaller which results in a much lower frequency deviation.

This is enhancement is incorporated into the component separator 11 by including DSP logic, firmware or digital ASIC switches or analog switches that simply alternate $Ph_A(t)$ and $Ph_B(t)$ between the two RF and amplifier chains for each phase crossing that occurs.

Figure 8:
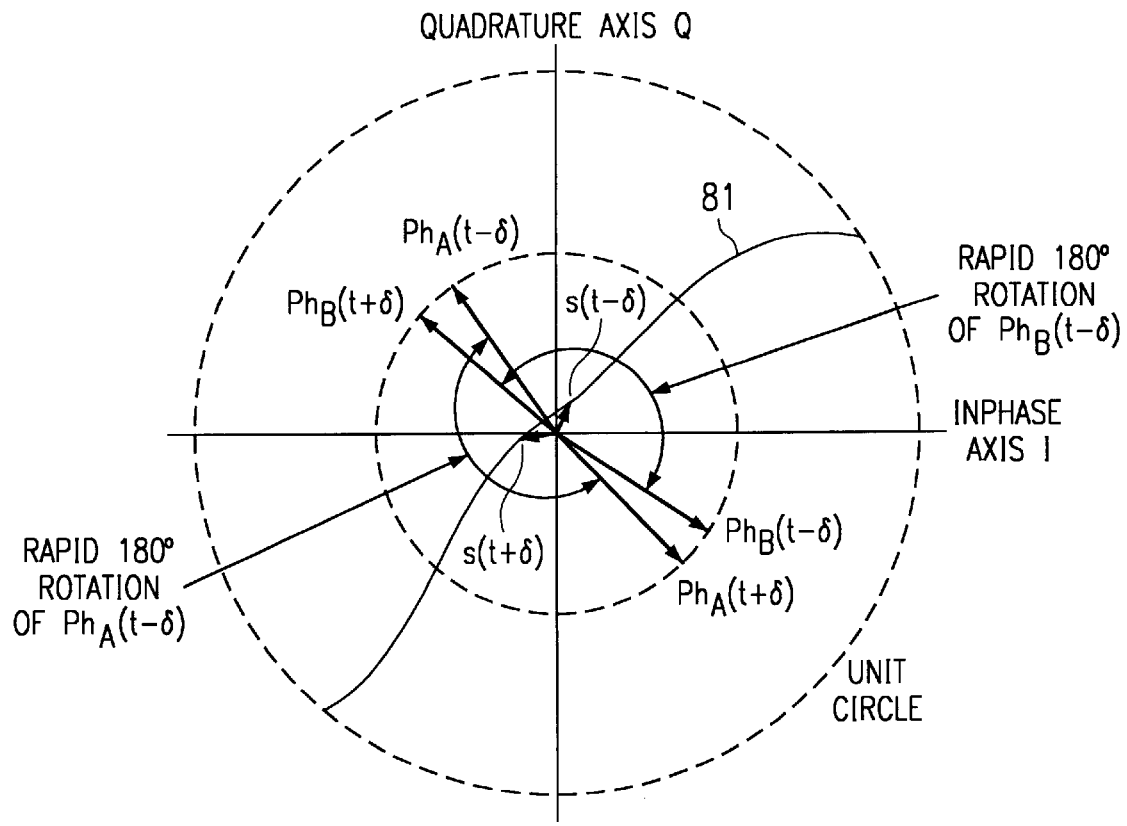
FIG. 8 depicts a graph of the operation of the signal component separator element of FIG. 2 with context switching enabled, but still having a rapid phase change of the signal components.

Note that context switching does not eliminate all situations that may cause the signal components, $Ph_A(t)$ and $Ph_B(t)$, to traverse a rapid phase change in the complex modulation plane. As shown in FIG. 8, a signal trajectory 81 does not exhibit a 180° phase change, but does exhibit a trajectory that causes the components to rapidly swing through a massive phase shift. Context switching will not eliminate the phase shift in this situation. Therefore, rapid phase transitions in the signal components, $Ph_A(t)$ and $Ph_B(t)$, will occur when the underlying signal trajectory, s(t) undergoes rapid phase changes when the signal amplitude approaches but does not cross zero. Thus, despite context switching, rapid phase changes may still occur in the signal components, $Ph_A(t)$ and $Ph_B(t)$. This in turn causes a significant level of wide band energy to still occur. Consequently, for accurate reconstruction of the signal trajectory s(t) the signal component separator must over sample by a rate that is approximately 8 to 16 times greater than that required to generate the signal bandwidth. This imposes a maximum limit on the operation bandwidth of the inventive LINC amplifier if a digital component separator is utilized, because the maximum sampling rate is limited by the speed of ASIC DSP technology.

Figure 9:
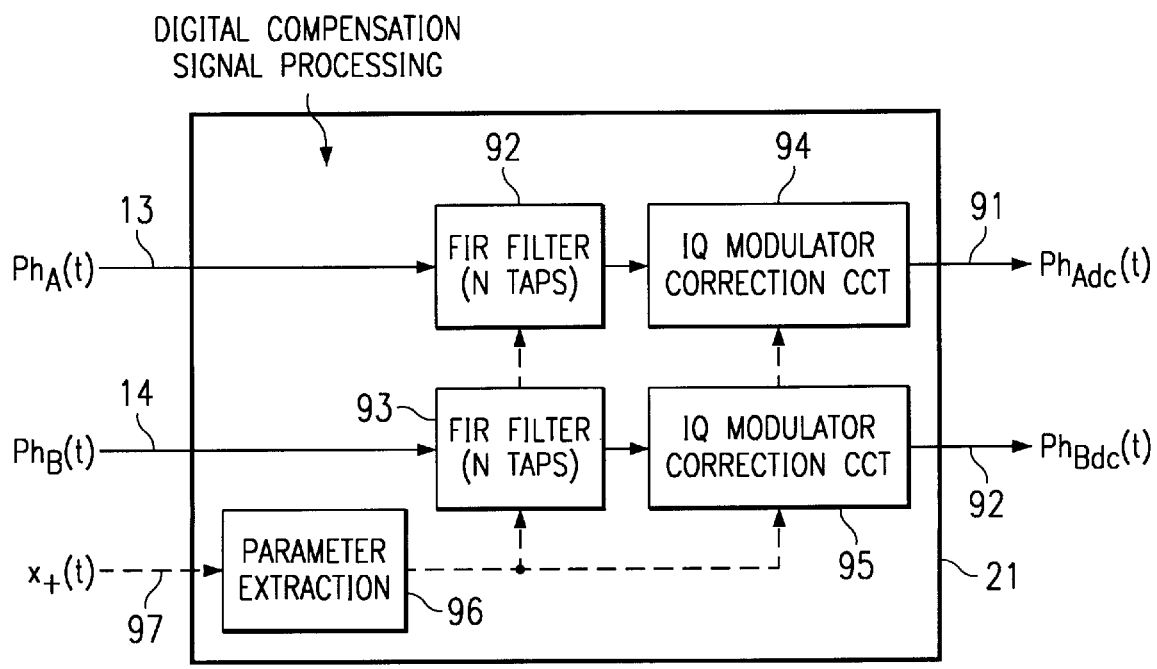
FIG. 9 depicts a schematic diagram of digital compensation signal processing element of the inventive amplifier of FIG. 2.
Figure 32A:
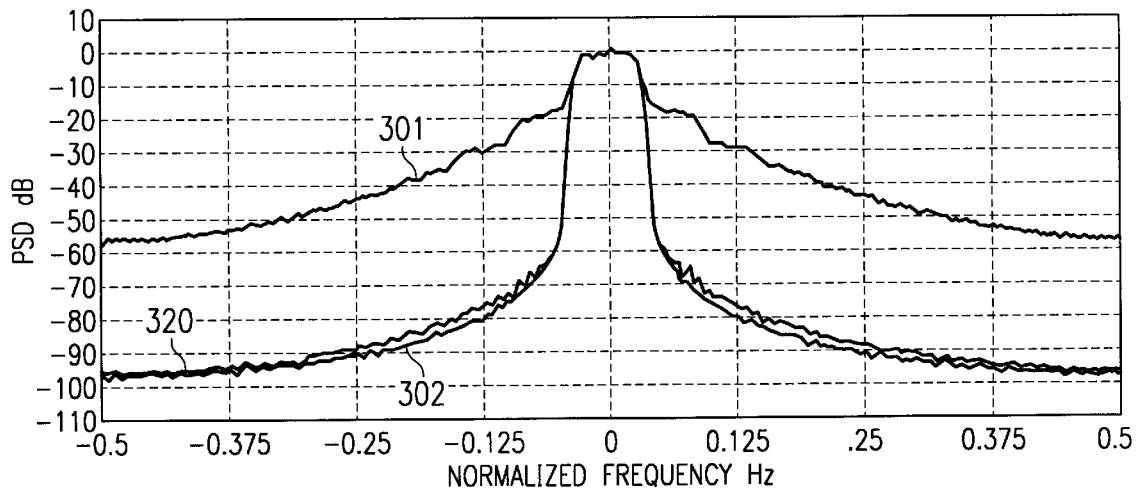
FIGS. 32A–32C depict graphs of the power spectral densities of the amplifiers with various amplitude imbalances.
Figure 32B:
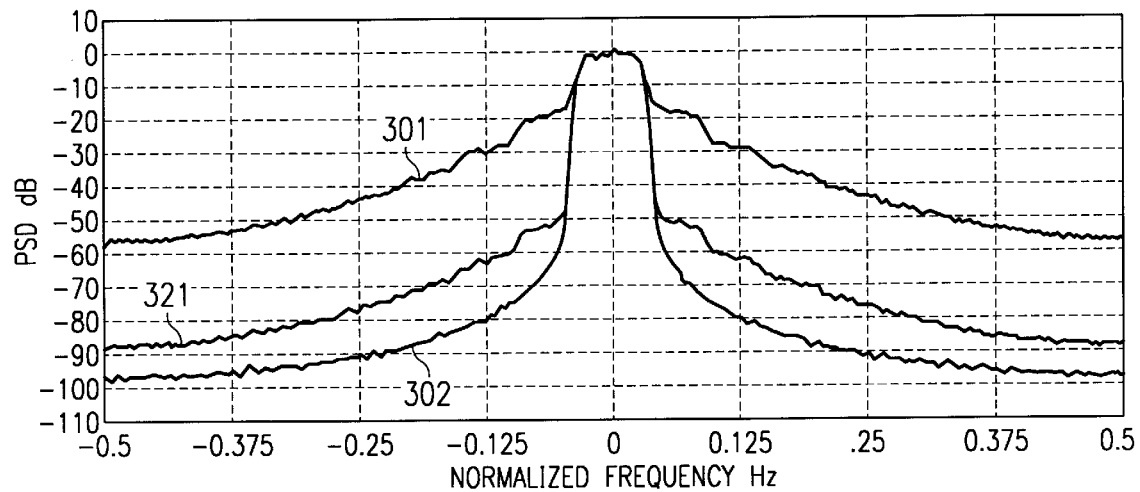
Figure 32C:
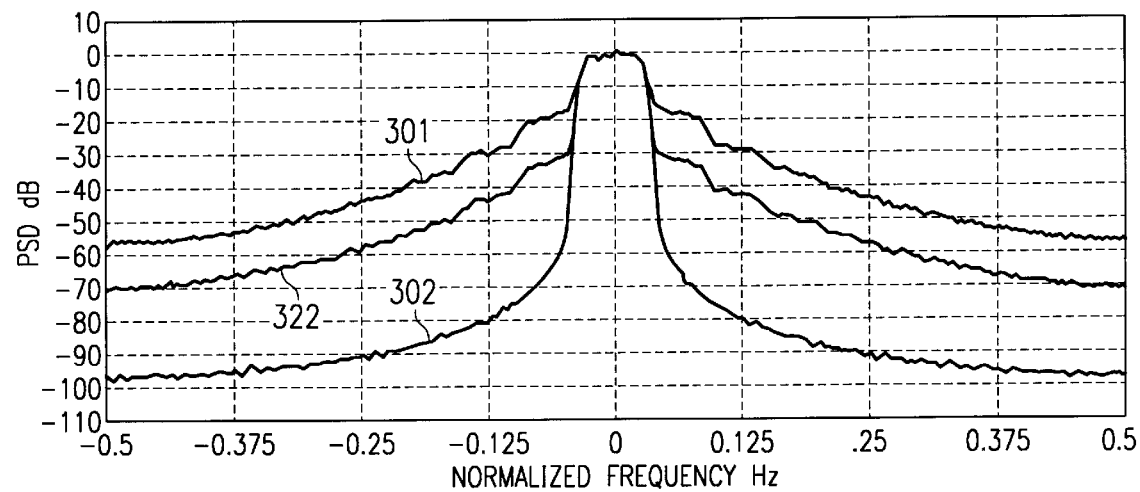

FIG. 9 depicts the digital signal processing block 21, which is utilized to compensate for all imperfections that are incurred during the up conversion process. The block operates at real time with samples of the signal components, $Ph_A(t)$ 13 and $Ph_B(t)$ 14, being predistorted to form signal components, $Ph_{Adc}(t)$ 91 and $Ph_{Bdc}(t)$ 92, which after RF upconversion, nonlinear amplification and power combining will linearly combine to form an amplified replica of the signal s(t) 12. The digital compensation network is required because manufacturing tolerances of analog components make it impossible to construct two identical RF upconversion, amplification and power combining chains. In addition to this, the characteristics of each chain will change differently from each other over time and temperature. As shown in FIGS. 32A–32C, fractions of a dB in gain imbalance cause rapid degradations in the performance of the LINC amplifier with respect to the reference PSD shown in FIG. 30. Thus, the digital compensation signal processing block should provide, via compensation circuits, which are a FIR filter and IQ modulator correction circuits, complimentary distortions that are equal and opposite to those imperfections incurred in the analog chains.

The parameter extraction block 96 separates out the information, which has been generated by the Adaptive Control Prosessing and Compensation Estimator 28 ("ACPCE") describing the distortions in the two paths, into the parts which are to be applied to make up the individual correction to be applied to each path. In the case where digital quadrature modulators are used, the FIR filters alone are used. In the case where analog quadrature modulators are used, the additional IQ modulator correction circuits 94, 95 are required. In the analog quadrature modulator case, there are possible interactions between the corrections which require the application of adjustments to the two mechanisms to take account of this. The parameter extraction block would prevent the two corrections from working against each other or exceeding their control ranges. In all cases, the correction is applied to share the amount of correction between the paths to achieve balance. If more information is known about the individual path distortions, more correction can be applied to one path if it needs it due to measured deficiencies. Note that only one of the phase signal paths need be corrected.

The FIR filters work on complex baseband values with complex coefficients, they correct for delay, amplitude scaling and phase shift. They can also correct for frequency dependent distortions of those parameters.

The IQ modulator correction circuits are intended to correct only the specific distortions in the analog quadrature modulators. Some of these distortions are actually correctable in the FIR filters but the crosstalk needs a cross linkage between I and Q in each signal path which is not a feature of the complex FIR structure.

Figure 28:
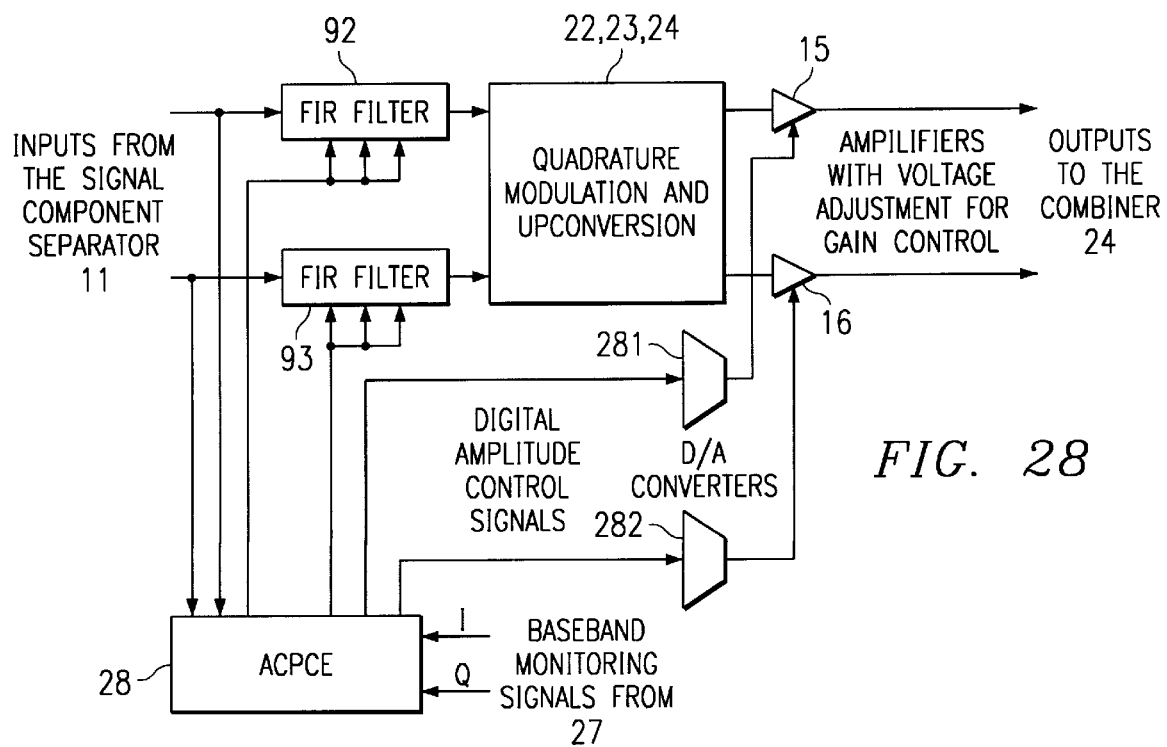
FIG. 28 depicts an arrangement for controlling the component amplifier gain in the LINC amplifier of FIG. 2.

Although it is described in relation to FIG. 28, note that the ability of the FIR filters to have any effect on the gain of the amplifiers is small to non-existent if they are close to saturation. In this case, if the amplifiers have different gain then they need to be controlled directly as shown in FIG. 28. This type of control has no effect on any frequency dependent gain variation and that would need to be controlled in the FIR filters. In practice, two amplifiers of the same type would be likely to have similar gain slope with frequency and this minimizes the required degree of correction because in the first instance, it is a match that is important even if the overall gain still has a slope. This is no worse than a single conventionally applied non-linear amplifier for FM, MSK or CEPSK having a gain slope over frequency. Gain control could also be applied to compensate in the upconversion paths In practice, each analog chain will exhibit different group delay variation, propagation delay, gain and phase rotation characteristics which must be compensated. Furthermore, if analog IQ (quadrature) modulators are utilized within the system to permit direct complex baseband to RF conversion then, additional imperfections due to IQ gain and phase imbalance (crosstalk) and local oscillator feedthrough and baseband DC offsets will invariably be observed. These will be eliminated by utilizing correction circuits as illustrated in FIG. 9, which advantageously can perform the function of digital compensation signal processing circuit 21. However, configuration of these circuits requires parameter values to be provided which precisely compensate for the analog imperfections. Since the digital compensation signal processing block operates in real time, the evaluation of these parameters is the responsibility of the adaptive control processing and compensation estimator block 28 (FIG. 3) which provides updated, more accurate coefficient values for the circuit parameters when they are available.

Note that the new parameters cannot be simply updated or switched into use when provided. This could cause an instantaneous step in the phase and amplitude trajectory of the recombined signal. If such a step occurs, then undesirable power spectral responses that exceed the signal bandwidth may arise. This effect may be eliminated or significantly attenuated by providing interpolation between the current parameter values and the new updated estimates. The interpolation is performed by the ACPCE.

Figure 10A:
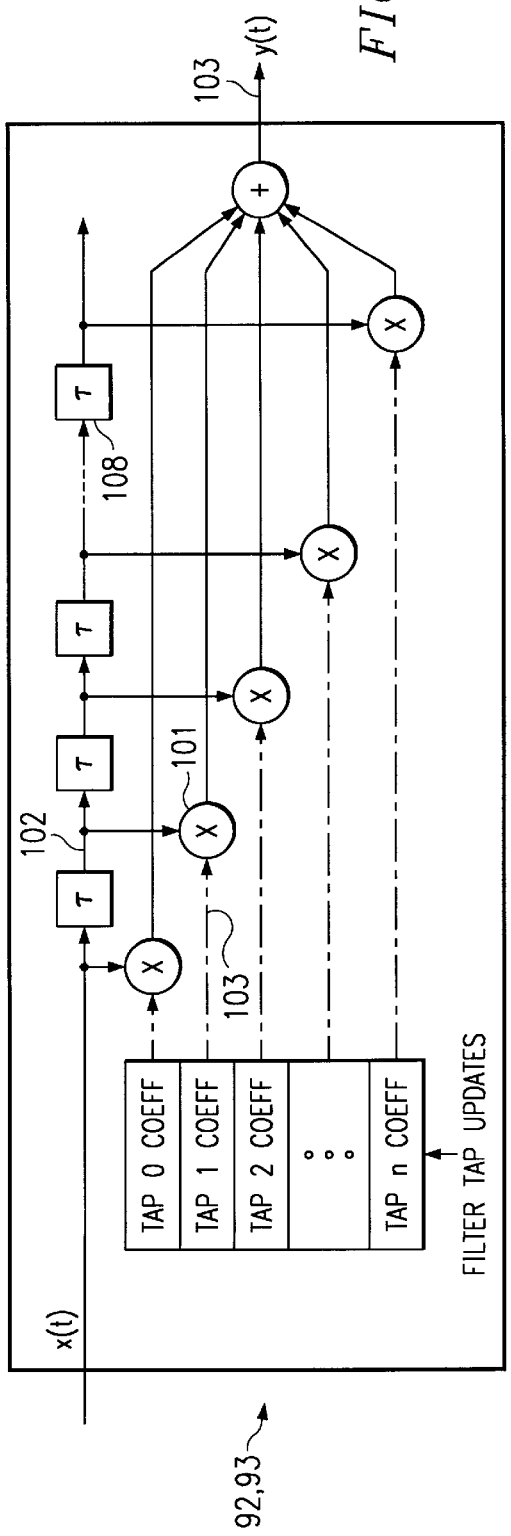
FIGS. 10A–10B depict the FIR filter element and IQ modulator element of the digital compensation signal processing element of FIG. 9.

FIG. 10A illustrates a FIR filter compensation circuit 92, 93, which is utilized to correct for different group delay variation, propagation delay, gain and phase rotation characteristics of the analog circuits. The FIR filter has an input x(t), which is actually a complex value made up of an I and a Q component. Note that the tap coefficients are also complex values. Thus, the actual implementation requires four times as many multipliers as commonly used in a FIR filter which only operates with real values and real coefficients. Specifically, each multiplier 101 multiplies a value a+jb 102 with a coefficient c+jd 103. This results in (ac+bd)+j(ad+bc) as the output of that stage. The complex output y(t) 103 is the sum of all of the individual complex multiples. The FIR filter takes the complex input and delays it one sample time (tau) in each of the boxes 108. At each sample interval, the values which are in the delay chain are multiplied by the tap coefficients 103 which have been placed there by the ACPCE. The products are all summed together to give the output y(t) 103 which changes with each sample interval. The input values shift across the structure and get multiplied by each tap coefficient before being discarded.

The length of the filter 92, 93 is shown as variable. The actual number depends on the type of distortions seen in different implementations of the LINC amplifier.

Figure 10B:
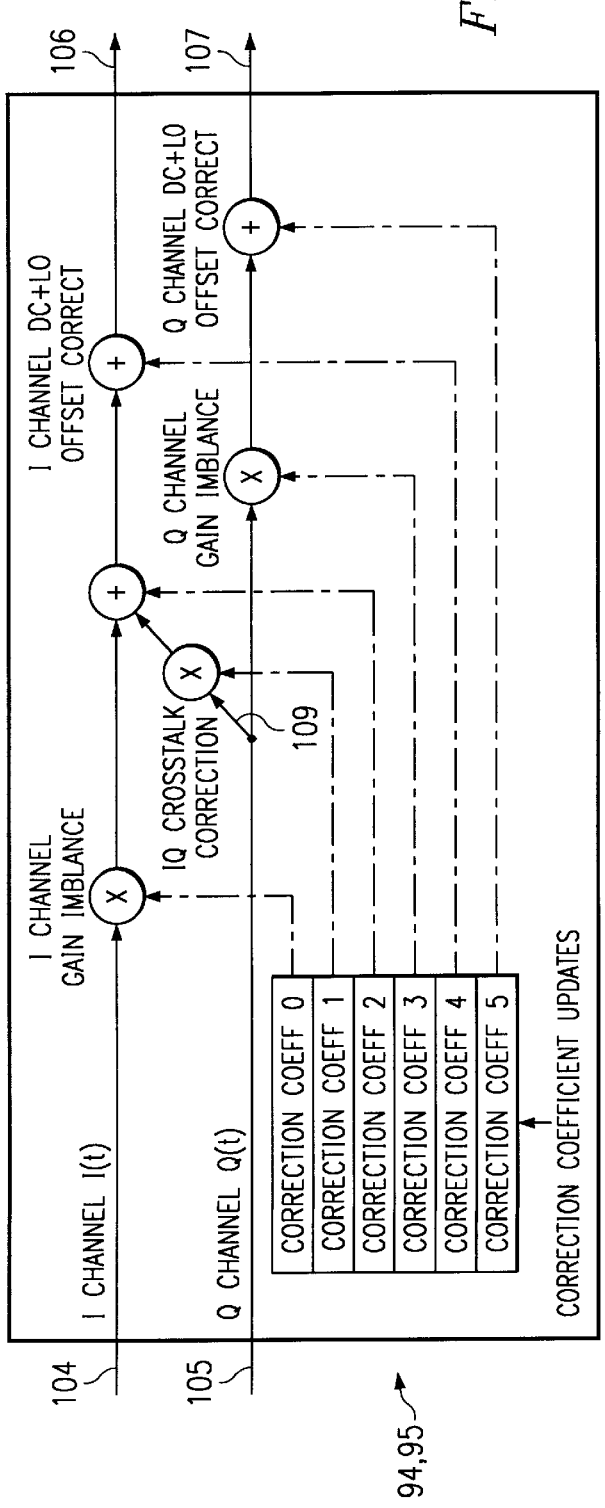

FIG. 10B illustrates an IQ modulator correction circuit 94, 95, which is documented in *The Effect of Quadrature Modulator and Demodulator Errors on Adaptive Digital Predistortors for Amplifier Linearization,* Author: James K. Cavers, IEEE 0018-9545/97, pp. 456–466. The circuit 94, 95 may be utilized to compensate for IQ gain and phase imbalance (crosstalk) and local oscillator feedthrough and baseband DC offset imperfections of the IQ modulator. FIG. 10B shows the complex inputs as separate paths I 104 and Q 105 and originate in FIG. 10A as y(t). The 10B outputs 106, 107 are shown separated into complex components. The complex values combine to form one of 91, 92 in FIG. 9.

The IQ modulator 94, 95 is similar to the FIR filter but incorporates simple scalar multiplication of the I and Q values to adjust their gains separately for imbalance. The crosstalk connection 109 takes one channel (in this case Q but the inverse arrangement is a valid alternative) and scales it before adding it to the other channel. The last adjustment is a shift up or down to counteract DC offset in each channel. These adjustments are interactive and the coefficients have to be calculated to take this into consideration. Note that the compensation circuits may be utilized to compensate for analog circuit imperfections. However, the coefficient values of the parameters that characterize the compensation circuit must be permitted to be updated during the course of operation by adaptive control processing and compensation estimator block 21. Thus, the parameter values are dynamic and subject to change. However, only one set of parameters is required at any time and they do not have to be changed on a sample by sample basis as can be required in predistortion linearizers. Note that the parameter values are not necessarily just context switched, but a smooth change between the new and existing values may be undertaken by interpolation if it is deemed necessary.

Parameter updates may be applied to the signals relatively infrequently, with the amplifiers running continuously at their full power operating points, as the distortion characteristics do not change quickly. Overall this is a simpler correction problem than in predistortion and feedforward mechanisms where the amplifier characteristics have to be corrected for the full range of powers that they operate over. In the inventive system the amount of out of band distortion can be monitored to trigger the calculation of new parameters or it can be done periodically. The monitoring of the baseband demodulated signal can provide information on the purity of the signal being transmitted by the use of digital filtering to observe the out of band energy.

The adaptive control processing and compensation estimator (ACPCE) 28 contains the control algorithms for the LINC transmitter. This circuit is responsible, under all operating conditions, to identify and maintain the validity of the compensation parameters that are utilized by the digital compensation signal processing block 21. The control and data flow algorithms used within this block encompass substantially all operating condition from initial calibration procedures through to on-line parameter update and estimation. The ACPCE also ensures that the operation of the power amplifier is substantially free from spurious emissions when required to switch on and off and also when ramping on and off transmissions. Switch on involves powering up the amplifiers gradually by controlling their power supplies and/or bias while sending antiphase signals through them. Once switched on and running at full power, the use of the antiphase signals provides the additional advantage because the ACPCE may switch between normal transmission and an antiphased chirp or polyphase sequence. This mechanism may be utilized to ensure distortion free transmission ramp-on and ramp-off characteristics. The mechanism of utilizing an antiphase sequence also allows training to be invoked while the power amplifier is powered up but transmitting no signal. This is useful for insuring that compensation parameters are always optimal.

Figure 11:
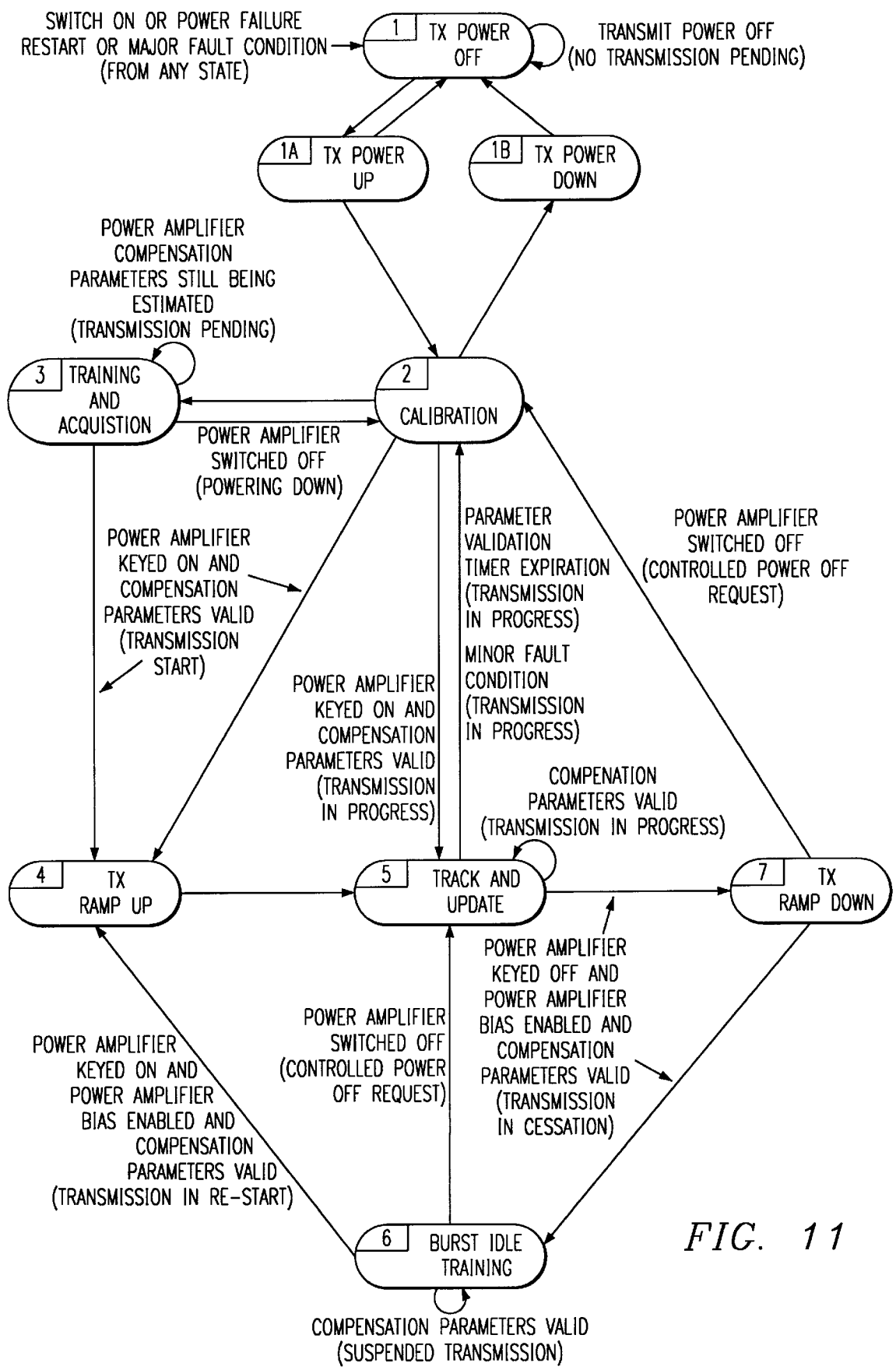
FIG. 11 depicts a flowchart of the operational states of the adaptive control processing and compensation estimator element of the inventive amplifier of FIG. 2.

FIG. 11 depicts the state diagram of the power amplifier control algorithm. Many of the states utilize core numerical and signal processing algorithms that operate upon stored sample data sequences recovered from the output of the signal component separator 11 and the power combiner 25 output Γs(t). To ensure clarity these data processing algorithms are detailed separately and are only referred to as data processes within the definition of the control algorithm.

The following description provides a detailed operation of the control algorithms required for the digital control of the LINC amplifier. The data processing algorithms utilized by each state are described in a later section. The control operation assumes that the employed power amplifier has independent bias and keying control.

In the TX POWER OFF STATE(1) the Adaptive Control Processing and Compensation Estimator is required to ensure that amplifier 20 is turned off with the output stage bias removed and that no RF emission from the amplifiers occurs. A further requirement is that previously computed compensation parameters, $X_+(t)$ 97 are stored in memory for future utilization. Note that when the power is switched off completely the parameters are held in non-volatile memory. The storage media is not important, but it must support fast access. Typical implementations may employ RAM for storage while powered up and FLASH ROM, EEPROM, hard disk, magnetic storage media etc. for non-volatile storage. The exact control state machine within this state is outlined under the following conditions:

IF a bias on signal is applied to the power amplifier OR IF a control signal is enabled indicating that transmission is pending.

THEN the ACPCE controller shall exit the TX POWER OFF STATE(1) and enter the TX POWER UP STATE (1A).

ELSE the ACPCE controller shall remain in the TX POWER OFF STATE(1).

The TX POWER UP STATE(1A) is a state in which the Adaptive Control Processing and Compensation Estimator, ACPCE 28, is required to ensure that no RF emission from the amplifiers occurs while the bias to the amplifiers is applied in a controlled ramp. The exact control state machine within this state is outlined under the following conditions:

IF a bias on signal is applied to the power amplifier OR IF (a control signal is enabled indicating that transmission is pending AND the bias has reached the normal point for operation).

THEN the ACPCE controller shall exit the TX POWER OFF STATE(1A) and enter the CALIBRATION STATE(2).

ELSE IF a bias signal has been removed from the power amplifier or if a control signal is disabled OR IF the amplifier has been switched off.

THEN the ACPCE controller shall exit the TX POWER UP STATE (1A) and reenter the TX POWER OFF STATE(1).

ELSE the ACPCE controller shall remain in the TX POWER UP STATE(1A).

The TX POWER DOWN STATE(1B) is a state in which the Adaptive Control Processing and Compensation Estimator, ACPCE 28, ensures that the amplifier bias is removed in a controlled manner so that no RF emission from the amplifiers occurs. The exact control state machine within this state is outlined under the following conditions:

IF the bias to the power amplifier has been fully removed
THEN the ACPCE controller shall exit the TX POWER DOWN STATE(1B) and enter the TX POWER OFF STATE (1).

ELSE the ACPCE controller shall remain in the TX POWER DOWN STATE(1B).

In the CALIBRATION STATE (2) the ACPCE controller 28 is responsible for examining the state of the stored compensation parameters and determining if these are still valid. This requirement captures a large breadth of conditions that may include initial provisioning of a new power amplifier. While in this state the ACPCE controller is also responsible for determining if a transmission power ramp is required or whether the signal s(t) has a power ramp already embedded within its structure. This may also be a user programmable option. The exact control state machine within this state is outlined under the following conditions:

IF it is determined that the existing compensation parameters are no longer accurate or valid OR IF the power amplifier is being provisioned with the first transmission test and the compensation values are set to inaccurate manufacturing default values OR IF compensation parameter value time stamps, if employed, have expired OR IF (the amplifier has been switched off AND the option of recalibration on power down has been selected by the user)

THEN the ACPCE controller shall exit the CALIBRATION STATE(2) and enter the TRAINING AND ACQUISITION STATE(3).

ELSE IF IF the ACPCE controller determines that the compensation parameters are still valid, that is they are sufficiently accurate to ensure power spectral emission requirements are not exceeded AND the transmission request indicates that the transmission signal s(t) does not require a transmission ramp AND the power amplifier key up signal is enabled AND no fault conditions are present.

THEN the ACPCE controller shall exit the CALIBRATION STATE(2) and enter the TRACK AND UPDATE STATE(5).

ELSE IF the ACPCE controller determines that the compensation parameters are still valid, that is they are sufficiently accurate to ensure power spectral emission requirements are not exceeded AND the transmission request indicates that the transmission signal s(t) does require a transmission ramp AND no fault conditions are present.

THEN the ACPCE controller shall exit the CALIBRATION STATE(2) and enter the TX RAMP UP STATE (4).

ELSE IF the ACPCE controller determines that the power amplifier enable control signal has been disabled indicating that the pending transmission has been terminated OR IF (the amplifier has been switched off AND the option for re-calibration on power down has not been selected) OR IF (the amplifier has been switched off AND the option for recalibration on power down has been selected AND a recalibration has just been performed).

THEN the ACPCE controller shall exit the CALIBRATION STATE(2) and re-enter the POWER DOWN STATE(1B).

ELSE IF the ACPCE controller determines that a major fault condition has occurred.

THEN the ACPCE controller shall report the fault condition to a power amplifier management entity and exit the CALIBRATION STATE(2) and re-enter the TX POWER DOWN STATE(1 B).

ELSE the ACPCE controller shall remain in the CALIBRATION STATE(2).

In the TRAINING AND ACQUISITION STATE(3) the ACPCE controller 28 is responsible for examining the state of the stored compensation parameters, the performance of the LINC amplification process, via monitoring the recovered power amplifier samples and identifying the characteristics of each RF up conversion chain and amplifier. ACPCE 28 is also responsible for computing valid initial compensation parameters which are then uploaded via the parameter update vector $X_+(t)$ to the digital compensation signal processing block. A set of compensation parameters are considered valid for use, if the resulting power spectral emission profile satisfies the regulatory spectral emissions mask and if the modulation signal, s(t), accuracy is sufficient to meet a predefined system specification. While in this state, the ACPCE controller may be required to evaluate the compensation parameters utilized for a single, multiple or a complete set of RF frequency channels that might fall within the amplifier's operating range. The exact evaluation requirements are dependent upon the operating scenario of the amplifier. For example, during amplifier commissioning, all channels may require compensation parameter estimation. Alternatively, during normal operation, compensation parameters will remain current by virtue of the operation of the TRACK AND UPDATE STATE(5), however, channels that are not exercised upon a regular basis may require exercise of the Training and Acquisition routines.

To enable the ACPCE to identify the imperfections of each individual analog RF up conversion, amplification and power combining chain several algorithms have been developed. These algorithms utilize one or more TRAINING sequences that may be utilized in conjunction with various estimation techniques to compute the initial estimates of the compensation parameters. Each algorithm has unique attributes that provide different advantages that are utilized in different commercial environments. The exact control state machine within this state is outlined under the following conditions;

IF the ACPCE controller determines that the power amplifier bias or power amplifier enable control signal has been disabled indicating that the pending transmission has been terminated OR IF (the amplifier has been switched off AND the option for recalibration on power off has been selected AND the compensation parameter values are valid for all frequency channels that have been specified for calibration) OR IF (the amplifier has been switched off AND the option for recalibration on power off has not been selected)

THEN the ACPCE controller shall exit the TRANG AND ACQUISITION STATE(3) and re-enter the CALIBRATION STATE(2).

ELSE IF the ACPCE controller determines that a major fault condition has occurred.

THEN the ACPCE controller shall report the fault condition to a power amplifier management entity and exit the TRAINING AND ACQUISITION STATE(3) and re-enter the CALIBRATION STATE(2).

ELSE IF the ACPCE controller determines that compensation parameter values are invalid for one or more frequency channels of operation that have been specified for calibration.

THEN the ACPCE controller shall execute the following compensation parameter estimation procedure.

STEP 1: stimulate the analog RF up conversion, amplification and power combining circuitry with one or more of the following test sequences a) independently transmit a narrowband cpm (continuous phase modulation) bandlimited transmission sequence on each amplifier up conversion chain b) concurrently transmit a narrowband cpm bandlimited transmission sequence on each amplifier up conversion chain.

c) independently transmit a wideband cpm bandlimited transmission sequence on each amplifier up conversion chain.

d) concurrently transmit a wideband cpm bandlimited transmission sequence on each amplifier up conversion chain.

e) transmit a narrowband bandlimited white noise signal that has been subjected to signal component separation and consists of two constant envelope phase varying transmission signals.

f) transmit a wideband bandlimited white noise signal that has been subjected to signal component separation and consists of two constant envelope phase varying transmission signals.

g) independently transmit a discrete or continuous frequency chirp sequence constructed from constant envelope phase varying modulation on each amplifier up conversion chain.

h) independently transmit a discrete or continuous polyphase sequence constructed from constant envelope phase varying modulation on each amplifier up conversion chain.

i) concurrently transmit a discrete or continuous frequency chirp sequence constructed from constant envelope phase varying modulation on each amplifier up conversion chain.

j) concurrently transmit a discrete or continuous polyphase sequence constructed from constant envelope phase varying modulation on each amplifier up conversion chain.

k) transmit a sequence of random modulation sequence s(t) signal that has been subject to signal component separation.

l) concurrently transmit a discrete or continuous anti-phased frequency chirp sequence constructed from constant envelope phase varying modulation on each amplifier up conversion chain.

m) concurrently transmit a discrete or continuous anti-phased polyphase sequence constructed from constant envelope phase varying modulation on each amplifier up conversion chain.

n) concurrently transmit a discrete or continuous anti-phased (pseudo) randomly frequency hopped sequence constructed from constant envelope phase varying modulation on each amplifier up conversion chain.

it is important to note that this stage may require the ACPCE to isolate the amplifier from an antenna and direct the generated RF energy to a dummy load to prevent undesirable power emission during training. This requirement is eliminated if training sequences of type "l", "m", or "n" are utilized. These important sequences that have been specifically designed for this application are described in detail later.

STEP 2: for each transmitted sequence the ACPCE shall collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t).

STEP 3: the ACPCE shall compute from the ensemble of received data samples estimates of all up conversion imperfections. This may be done by utilizing one or more of the following algorithms.
a) correlation
b) LMS system identification
c) RLS system identification
d) nonlinear Kalman filter system identification algorithms
e) any signal processing algorithm that is capable of system identification in nonlinear signal processing, e.g. distortion analysis by wavelet multi signal resolution.

STEP 4: compute estimates of the signal compensation parameters that are required to counteract the imperfections identified in the previous step(3).

STEP 5: upload compensation parameters to the Digital Signal Compensation Processing block via the parameter state vector $X_+(t)$.

STEP 6: for each transmitted sequence the ACPCE shall continue to collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t).

STEP 7: determine if the error between the desired transmitted sequence $s(t)=Ph_A(t)+Ph_B(t)$ and the observed sequence ks(t) is below an acceptable level.

STEP 8: IF the error is below an acceptable level THEN store update compensation parameters and proceed to step 9 ELSE repeat steps 1–7.

STEP 9: IF all channels have been calibrated THEN finish ELSE repeat steps 1–8 for the next channel. The channels to be calibrated may be defined as a user option.

ELSE IF the ACPCE controller determines that compensation parameter values are valid for all frequency channels of operation that have been specified for calibration AND the power amplifier key enable has been set.

THEN the ACPCE controller shall exit the TRAINING AND ACQUISITION STATE(3) and enter the TX RAMP UP STATE(4)

ELSE the ACPCE controller shall remain in the TRAINING AND ACQUISITION STATE(3) and transmit one of the following signals: [an antiphase discrete or continuous polyphase, discrete or continuous antiphase frequency chirp signal, a discrete or continuous antiphase frequency hopped signal or transmit a static antiphase null signal if these specialized sequences are unavailable.]

In the TRANSMISSION RAMP UP STATE(4), ACPCE controller 28 is responsible for ensuring a smooth bandlimited transition between the transmitted training sequence state and the start of the modulation signal. In practice the ACPCE is required to ensure that during the transition the gradients of the amplitude, phase and frequency trajectories are continuous and bandlimited. This is very similar to the ordinary problem of amplifier "clicks" known to those skilled in the art since the inception of telegraphic keying, morse code. However, note that this effect is more pronounced in a LINC transmitter, because the amplifiers are running at full power and any step or disturbance in the modulation trajectory will cause distortion power spectra to be generated. Thus, the ACPCE controller is required to provide a smooth transition between the normal transmission state and the burst training state, as mentioned earlier, and is achieved by interpolation in the amplitude, phase and frequency domains. The ACPCE controller leaves this state under the following conditions:

IF the amplifier has been switched off.
THEN the ACPCE controller shall exit the TX RAMP UP STATE(4) and enter the TRACK AND UPDATE STATE(5).

ELSEIF the ACPCE controller determines that a major fault condition has occurred.
THEN the ACPCE controller shall report the fault condition to a power amplifier management entity and exit the TRANSMISSION RAMP UP STATE(4) and enter the TRACK AND UPDATE STATE(5).

ELSE IF the ACPCE controller determines that the power amplifier bias or power amplifier enable control signal is still enabled indicating that the transmission has started.
THEN the ACPCE controller shall execute the power ramp algorithm and exit the TX RAMP UP STATE(4) and enter the TRACK AND UPDATE STATE(5).

Power ramp down can suffer identical spectral emissions problems to those incurred when an amplifier is ramped up in power. The algorithm utilized for power ramp up, which is subsequently discussed, is also directly applicable to the power ramp down scenario. The ACPCE controller leaves this TRANSMISSION RAMP DOWN STATE (7) under the following conditions:

IF the ACPCE controller determines that the power amplifier has been switched off AND the amplifier is still transmitting THEN the ACPCE controller shall execute the power ramp algorithm and exit the TRANSMISSION RAMP DOWN STATE(7) and enter the CALIBRATION STATE(2).

ELSE IF the ACPCE controller determines that a major fault condition has occurred.

THEN the ACPCE controller shall report the fault condition to a power amplifier management entity and exit the TRANSMISSION RAMP DOWN STATE(7) and re-enter the CALIBRATION STATE(2).

ELSE IF the ACPCE controller determines that the power amplifier bias or power amplifier enable control signal has been disabled indicating that the transmission has finished.

THEN the ACPCE controller shall execute the power ramp down algorithm and exit the TRANSMISSION RAMP DOWN STATE(7) and enter the BURST IDLE STATE(6).

The TRACK AND UPDATE STATE (5) represents the normal operational state of the LINC amplifier 20. In this state the applied signal s(t) is decomposed by the signal component separator into two constant amplitude envelope phase varying signals which are independently amplified and combined. During this operation, the ACPCE controller is required to monitor the quality of the transmitted signal ks(t) and adjust the coefficient values of the compensation parameters to ensure that the power spectral density of the distortion products is minimized and that the modulation accuracy error is minimized. As the new and updated coefficients are utilized, these are used to overwrite the outdated coefficients which have been previously stored. Furthermore, to insure that amplitude, phase and frequency imperfections are not introduced to the transmitted signal, new estimates of the compensation parameters may be directly uploaded to the digital signal compensation processing block or if it is determined that the parameters have significantly changed, then a sequence of parameter changes may be provided. This sequence will consist of a set of parameter values that are interpolated between the existing and new parameters. In this way, a smooth transition is enabled that will not invoke distortion products to arise. Each set of new compensation parameters that is computed and utilized is uploaded to the digital signal compensation processing block via the state vector $X_+(t)$.

To enable the ACPCE to continually improve the accuracy of the compensation parameters during on-line operation, several algorithms have been developed. These algorithms employ the random transmit signal s(t) as a training sequence that may be utilized in conjunction with various estimation techniques to compute the updated estimates of the compensation parameters. Each algorithm has unique attributes that provide different advantages that are utilized in different commercial environments. The exact control state machine within this state is outlined under the following conditions:

IF the ACPCE controller determines that a major fault condition has occurred.

THEN the ACPCE controller shall report the fault condition to a power amplifier management entity and exit the TRACK AND UPDATE STATE(5) and enter the TRANSMIT RAMP DOWN STATE(7).

ELSE IF the ACPCE controller determines that a minor fault condition has occurred.

THEN the ACPCE controller shall report the fault condition to a power amplifier management entity and exit the TRACK AND UPDATE STATE(5) and enter the CALIBRATION STATE(2)

ELSE IF the ACPCE controller determines that the amplifier has been switched off AND transmission is in progress OR IF (the amplifier has been switched off AND (no transmission or a special training pattern is in progress)).

THEN the ACPCE controller shall exit the TRACK AND UPDATE STATE(5) and enter the TX RAMP DOWN STATE(7).

ELSE IF the ACPCE controller determines that the transmission has been temporarily suspended for TDM burst mode procedures.

THEN the ACPCE controller shall exit the TRACK AND UPDATE STATE(5) and enter the TRANSMIT RAMP DOWN STATE(7).

ELSE IF the ACPCE controller determines that compensation parameter values are valid for the frequency channel of operation and that normal transmission/operation is in progress.

THEN the ACPCE controller shall execute the following compensation parameter update and monitor procedure.

STEP 1: from the transmitted signal sequence, s(t), the ACPCE shall collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t).

STEP 2: the ACPCE shall compute update estimates of the compensation parameters from the ensemble of received data samples. This may be done by utilizing one or more of the following algorithms.

a) LMS (Least Mean Square) system adaptation and gradient update algorithms.

b) RLS (Recursive Least Squares) system adaptation and gradient update algorithms.

c) nonlinear Kalman filter system adaptation and gradient update algorithms.

d) any signal processing algorithm that is capable of adaptation such that the updated compensation parameters are more accurate than the existing parameters.

STEP 3: upload compensation parameters to the Digital Signal Compensation Processing block via the parameter state vector $X_+(t)$.

STEP 4: for each transmitted sequence the ACPCE shall continue to collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t).

STEP 5: determine if the error between the desired transmitted sequence $s(t)=Ph_A(t)+Ph_B(t)$ and the observed sequence ks(t) is below an acceptable level.

STEP 6: if the error is below an acceptable level THEN store update compensation parameters and proceed to step 7 ELSE repeat steps 1–5.

STEP 7: finish.

ELSE the ACPCE controller shall remain in the TRACK AND UPDATE STATE(5).

The BURST IDLE TRAINING STATE (6) is only utilized when the LINC power amplifier system 20 is utilized in a time division multiplexed mode. That is, in applications when the system is required to provide bursts of RF modulated signal energy that are interspersed with short dormant periods in which RF energy is not generated. Typical commercial scenarios where this mode of operation is required are for the IS-54 TDMA digital cellular system, packet data networks such as the Federal Express system, PHS and DECT PCS systems. Ordinarily, in these systems the power amplifiers remain biased but the transmit key is not enabled. This keeps the power amplifier transistor silicon devices thermally stable, but still subject to significant change of operating point on resumption of full power transmission. This rapid change in the operating point of the transistor causes short term transient distortion products to be generated until the transistor is operating at full power and has re-acquired an operational stable thermal state. The generation of short term distortion products can be eliminated in the LINC system because the power amplifiers can be permitted to remain operating at full RF power if the antiphase polyphase, chirp or frequency hopped (discrete or continuous frequency) training sequences are transmitted. Furthermore, the antiphase sequences permit on-line updates to the compensation parameters to be computed from the sampled data in a manner that is identical to that utilized in the TRACK AND UPDATE STATE(5). The exact control state machine within this state is outlined under the following conditions:

IF the ACPCE controller determines that a major fault condition has occurred.

THEN the ACPCE controller shall report the fault condition to a power amplifier management entity AND exit the BURST IDLE TRAINING STATE(6) and enter the TRACK AND UPDATE STATE(5).

ELSE IF the ACPCE controller determines that the power amplifier enable control signal has been disabled indicating that the pending transmission has been terminated OR IF the amplifier has been switched off.

THEN the ACPCE controller shall exit the BURST IDLE TRAINING STATE(6) and re-enter the TRACK AND UPDATE STATE (5).

ELSE IF the ACPCE controller determines that compensation parameter values are valid for the frequency channel of operation AND the power amplifier key enable has been set.

THEN the ACPCE controller shall exit the BURST IDLE TRAINING STATE(6) AND enter the TX RAMP UP STATE(4).

ELSE IF the ACPCE controller determines that compensation parameter values are valid for the frequency channel of operation and that transmission/operation of the antiphase sequence has commenced.

THEN the ACPCE controller shall execute the following compensation parameter update and monitor procedure.

STEP 1: from the transmitted antiphase signal sequence the ACPCE shall collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t).

STEP 2: the ACPCE shall compute update estimates of the compensation parameters from the ensemble of received data samples. This may be done by utilizing one or more of the following algorithms.
 a) LMS system adaptation and gradient update algorithms
 b) RLS system adaptation and gradient update algorithms
 c) nonlinear Kalman filter system adaptation and gradient update algorithms.
 d) any signal processing algorithm that is capable of adaptation such that the updated compensation parameters are more accurate than the existing parameters.

STEP 3: upload compensation parameters to the Digital Signal Compensation Processing block via the parameter state vector $X_+(t)$.

STEP 4: for each transmitted sequence the ACPCE shall continue to collect a finite sequence of data samples of the transmitted signal components $Ph_A(t)$ and $Ph_B(t)$ (prior to digital signal compensation processing) while simultaneously collecting a concurrent finite sequence of data samples from the recovered down converted power amplifier combining output circuit via the ADC circuits, ks(t).

STEP 5: determine if the error between the desired transmitted sequence $s(t)=Ph_A(t)+Ph_B(t)$ and the observed sequence ks(t) is below an acceptable level.

STEP 6: if the error is below an acceptable level THEN store update compensation parameters and proceed to step 8 else repeat steps 1–5.

STEP 7: finish.

ELSE the ACPCE controller shall remain in the BURST IDLE TRAINING STATE(6).

Figure 12:
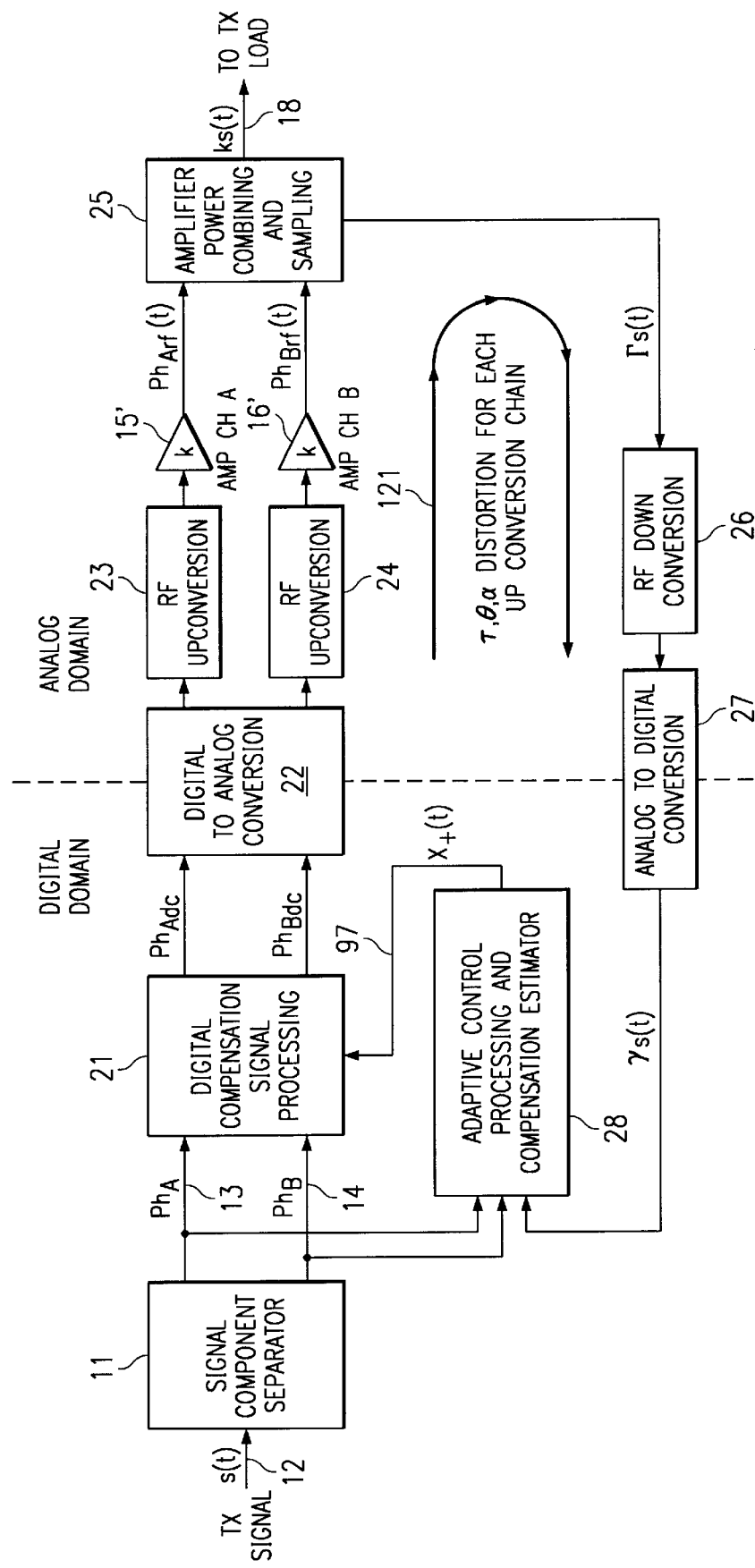
FIG. 12 depicts inputs and outputs and distortion to be corrected by the adaptive control processing and compensation estimator element of the inventive amplifier of FIG. 2.

FIG. 12 illustrates the problem facing the LINC system. As mentioned earlier for distortion free operation each up conversion and amplification chain must be identical as it combines in the amplifier power combining and sampling block. In practice, manufacturing tolerances will not permit this requirement to be achieved. Typically gain, phase and propagation differences are observed for each of the two chains. As described earlier, the purpose of the digital compensation signal processing block is to introduce appropriate levels of propagation delays, amplitude gains and phase rotations, such that the two up conversion and amplification chains become identically balanced. It is the responsibility of the adaptive control processing and compensation estimation, circuit 28 to compute the exact values of the compensation parameters that are utilized by the digital compensation signal processing block 21. It is also important to note that identifying and correcting the gain, phase and delay imbalances 121 between the two up conversion and amplification chains is only a subset of the imperfections that may require estimation and subsequent compensation. For example, if quadrature modulators for direct RF up conversion are utilized, additional compensation parameters and correction circuits to handle IQ gain and phase imbalance IQ crosstalk, LO feed through and DC offsets may be required, these were illustrated in FIG. 10.

The following, algorithms are utilized to identify initially, maintain and refine the compensation parameter values. Two sets of algorithms are required because the physical characteristics of the up conversion and amplification chains are never static but drift with age, temperature and operating point. The first set of algorithms identify initial operating values for the compensation parameters, while the second set of algorithms are utilized to enhance these estimates and track the changes in the up conversion and amplification chains. The first step in these processes is the capturing of samples for use in the algorithms.

Figure 13:
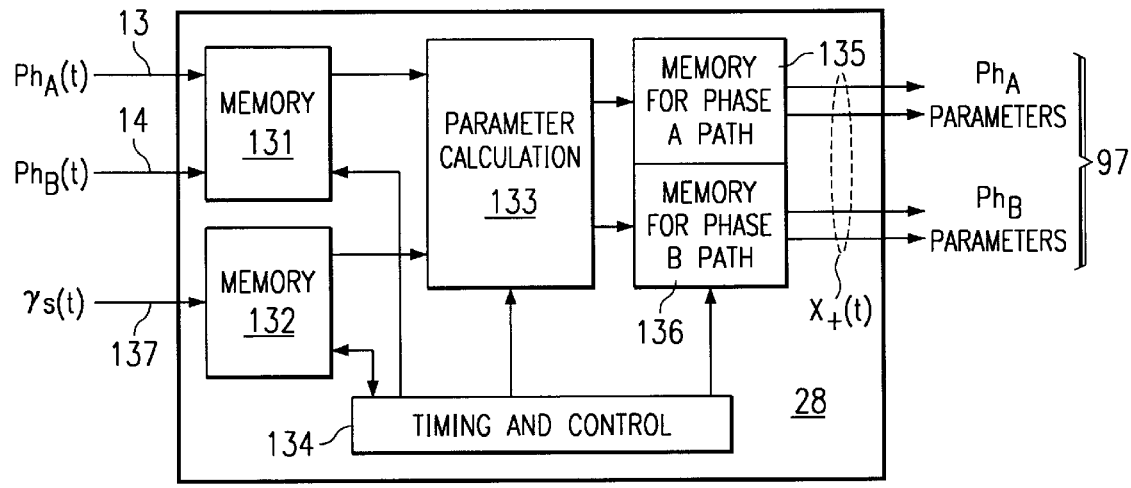
FIG. 13 depicts a schematic diagram of the adaptive control processing and compensation estimator element of the inventive amplifier of FIG. 2.

FIG. 13 depicts adaptive control processing and compensation estimator 28. The ACPCE operates on sets of samples taken from the signal component separator and the receiver output, which is the analog to digital conversion block 27 in FIG. 2. The capturing of the samples is done at the individual sampling rates. This process is controlled by the ACPCE, which fills the memory 131, 132, to hold the blocks of samples. When a block of samples is ready, the ACPCE analyzes the data and makes calculations of the necessary parameters for correction of the errors via calculator 133. This can be carried out at a speed which is determined by the capabilities of the processing hardware and software. There is no need for this to be done at the sample rates of the individual signals, it is a lower priority task which is done periodically. The calculated parameters for $Ph_A$ and $Ph_B$ are stored in memories 135 and 136, respectively. Timing and control block 134 coordinates the collection of samples and the calculation of the correction parameters and their storage and application to the FIR filters and the amplifiers. It is important to sample a reasonably long block of time to increase the amount of information available for the calculations. A preferred signal time segment for this purpose would contain a broad range of frequencies covering the range which can be generated by the signal component separator. The total amount of samples captured and the frequency and time interval between captures can be optimized for a particular type of signal. For example, a signal which frequently covers the full range of frequencies could be sampled for a shorter time. An advantage to sampling longer periods is the averaging effect of any measurement or quantization errors in the samples which accrues even if they contain repetitive information. Note that the output of memories 135 and 136 forms $X_+(t)$ 97 which is fed into the digital compensation signal processing block 21 of FIG. 2. Further note that the $\gamma s(t)$ 137 could be represented by I and Q components.

Figure 14:
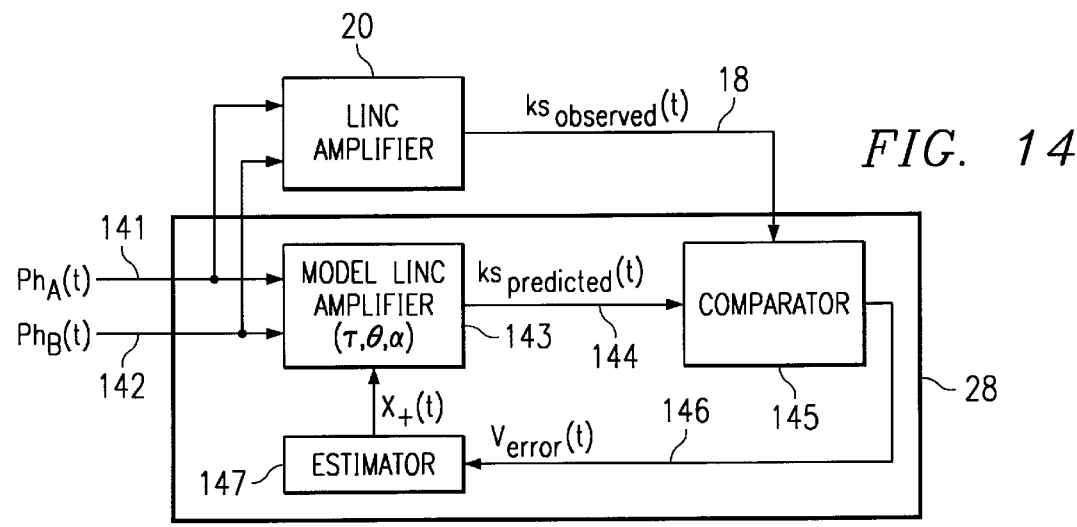
FIG. 14 depicts a schematic diagram of an arrangement for determining system identification.

FIG. 14 depicts a system for making the initial identification that must be made by the ACPCE system identification algorithms. This system operates as part of ACPCE 28. The ACPCE causes the SCS 11 to stimulate the LINC amplifier 20 with waveforms $Ph_A(t)$ 141 and $Ph_B(t)$ 142 and records the associated output $ks_{observed}(t)$ 18. However, observation of particular elements within the individual up conversion chains are not permitted. Consequently, the ACPCE utilizes a parallel numerical model 143 that mirrors the expected processes of the real analog LINC amplifier 20 and produces $ks_{predicted}(t)$ 144. To identify the initial values of the compensation parameters, the coefficients of the numerical model must be adjusted so that the predicted waveform, $ks_{predicted}(t)$ 144, is identical to the real observed signal, $ks_{observed}(t)$ 18. Comparator 145 compares $ks_{predicted}(t)$ and $ks_{observed}(t)$, the difference of which forms $V_{error}(t)$ 146. This error signal is sent to estimator 147 which adjusts values of the model 143. Note that waveforms 141 and 142 are special sequences generated by the SCS 11 as required. Once the model of the LINC amplifier has been successfully adjusted the compensation parameters may be directly computed to ensure that the compensation network introduces equal and opposite imperfections to the up conversion and amplification process. It is important to note that the identification of a system model is a well defined control problem that has many solutions in the robotics and control field. LMS, RLS, Kalman and extended Kalman algorithms are well known to those skilled in the art of solving this class of problem. It is also important to realize that the bulk imperfections for each up conversion and amplification chain are defined by delay, phase and amplitude gain variations. Smaller but less significant effects correspond to the imperfections associated with direct RF conversion which utilizes analog IQ quadrature modulators.

The first time that a transmitter is switched on, the FIR filters and other parameter adjustments can be set to have no effect on the signals passed through them. This might only be performed at the factory, or by an operating option selected manually or under certain predetermined conditions. Performing a training of this type could involve the disconnection of the antenna and manual connection to a dummy load. If this to be done in an operational installation, then an antenna switch might be used in the amplifier output to prevent unwanted transmissions by automatically connecting a dummy load in place of the normal transmitting antenna. Alternatively, default values for the correction parameters previously stored could be used and taken into consideration in the calculations. Spurious transmissions due to non-ideal parameters are still a potential problem even if one of the special training sequences which does not transmit a signal to the antenna is used as subsequently described. A training under any of these conditions can be made to perform a system identification which will measure the imperfections and make a correction intended to correct all measurable error. In practice, the application of the correction may also slightly alter the power operating point of the amplifiers by adjusting the power of the applied signal. This may result in a slight residual error. There is also a possibility that unless one of the special training sequences is used, the captured data will not fully exercise all distortions, resulting in an inaccurate estimate of the errors. In order to achieve the best possible correction, training processes should be made to iterate slowly towards the ideal correction and handle anything which might have changed in the time since the last training. This is depicted in the ACPCE control flow in FIG. 11.

Figure 15:
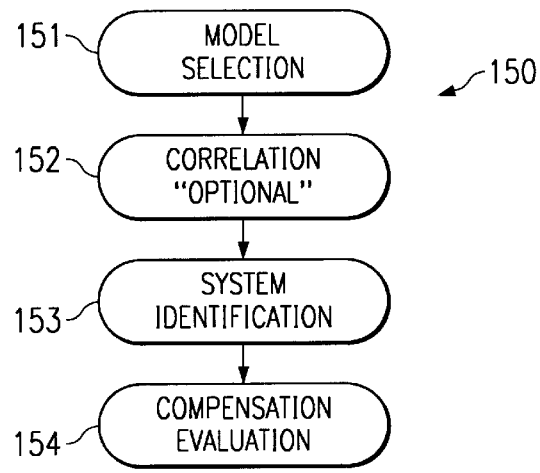
FIG. 15 depicts a flowchart of the operational states of the identification process performed by the element of FIG. 14.

FIG. 15 illustrates the algorithm flow 150 for the system identification process. Four operation steps are required, model selection 151, an optional correlation stage 152, system identification 153 and compensation parameter evaluation 154. The first stage 151 is utilized to determine the range of imperfections that are required to be compensated. In general, this is usually fixed at the design stage, because the power amplifier designer will be cognizant of the range of imperfections introduced by the specifics of the selected RF upconversion and amplification process. For example, a digital IF, analog RF up conversion and amplification design will not exhibit quadrature modulator imperfections, while a direct conversion scheme will. The model that is utilized in the system identification process should capture the effect of all known imperfections. However, it is conceivable that a computer aided model selection algorithm that examines the output of the LINC amplifier and identifies the complexity and order of the numerical model could be utilized.

The second step, correlation 152, is an optional stage that may be utilized to accelerate the subsequent system identification stage. This stage stimulates the amplifier with known transmission sequences and correlates these with the recovered amplifier output, i.e., the "observed signal" $s_{observed}(t)$. This permits the bulk amplitude gain imbalance, propagation delay and phase rotation of each arm to be identified and employed as initial estimates of the system model parameters utilized in the system identification stage. Although optional, this approach does permit the third step, system identification 153, to rapidly acquire model parameters. The third stage is utilized to identify the imperfections of the LINC amplifier by adjusting the parameters of the parallel numerical model such that the observed amplifier output and predicted amplifier output are identical. Once this has been achieved the parameters of the numerical model may be utilized to compute the initial compensation parameters of the digital compensation signal processing block. For simple imperfection models this may be simply achieved by numerical inversion but in general more complicated imperfection models will require more intricate techniques. These approaches are addressed in the following sections.

The second step, correlation 152, assesses the bulk propagation delay, amplitude gain and phase shift incurred through each up conversion and amplification chain by transmitting test sequences independently on each up conversion chain. Assessment of the imperfections listed above is immediately possible by simply correlating the received reference sequence with the transmitted sequence. Alternatively, two test sequences may be concurrently transmitted on each up conversion and power amplifier chain. To permit the bulk imperfections to be assessed on each chain, the two sequences should be orthogonal to each other under all phase shifts and delays. This enables their effects to be measured separately although the receiver path sees their combined effects. Such transmission sequences are readily constructed using the Gram-Schmitt orthogonalization construction that is known to those skilled in the art. The approach described is only applicable for initial calibration in a manufacturing or test environment, for field commissioning or if utilization of an antenna switch is permitted to isolate the power amplifier from the antenna load. This occurs because the power amplifier does generate energy while performing these correlation tests.

Alternatively, the amplitude gain, phase rotation and delay of each upconversion and amplifier chain may be computed by selecting the maximum correlation peak associated with the correlation calculation. This optional correlation approach may be used to accelerate the training or tracking process using one of the other algorithms described in following sections. It would do this by providing the bulk delay, and average differential delay, phase and amplitudes as initial starting points for the more complicated calculations.

Note that there will be a bulk delay in each transmit path and the shared receive paths, which will result in the received samples representing a slightly later time interval than the input samples. A correlation process may be used to find the time alignment of the transmitted and received sets of samples, even if no other information is calculated. This correlation should be clearly defined for a random signal, but if the signal is a regularly repeating pattern, there could be more than one alignment. Any alignment of an identically transmitted pattern within the duration of the sample block could be accurate enough for estimation of the other parameters. The correct alignment is preferred.

If the correlation step is used and no clear match between the transmitted and received sample sets can be found, this would indicate a major fault. This determination would be used as a fault detection mechanism for the amplifier control system.

When the bulk delay is known, it is possible to offset the start and finish of subsequent transmitted and received sampling block timings, so that the samples have ideal time overlap. This is because the overall delay in terms of sampling intervals is unlikely to change substantially. For any specific design of amplifier this could be made into a fixed parameter.

The bulk delay and the differential delay between the transmit upconversion paths is unlikely to match an exact number of sample intervals. It is important for the timing alignment to be accurate. If the sampling rate is high enough the resulting slight misalignment does not cause any significant degradation in the accuracy of the parameter estimation. The transmit path has a sample rate of approximately 16× the bandwidth of the signal transmitted as described earlier. If the sampling rate is not high enough or the sampling rates are different between the transmit and receive signals, one set of samples may be interpolated to match the other. This is a practical task to implement because the whole training process can run at a much slower relative clock rate than the real time sample rate, which allows for calculation time.

The imperfections of the upconversion and amplification chains may be considered to be constructed from the linear addition of a set of imperfections such as delay, amplitude scale (gain) and phase rotations. Thus, an estimator can be used to adjust the coefficients of a linear parameter vector to minimize the difference between the observed output sequence of the real amplifier and the predicted output sequence of the model, for the same stimuli. Adaptive LMS, RLS and linear Kalman filtering are examples of such approaches that may be employed. The identification of the amplifier imperfections proceeds by capturing a sequence of stimuli sequences and amplifier responses and then utilizing the algorithms to adjust the LINC model parameters such that the error between the predicted and observed signal flows is minimized. When this has been achieved, the vector of parameters may be employed to compute initial estimates for the compensation parameters.

Figure 16:
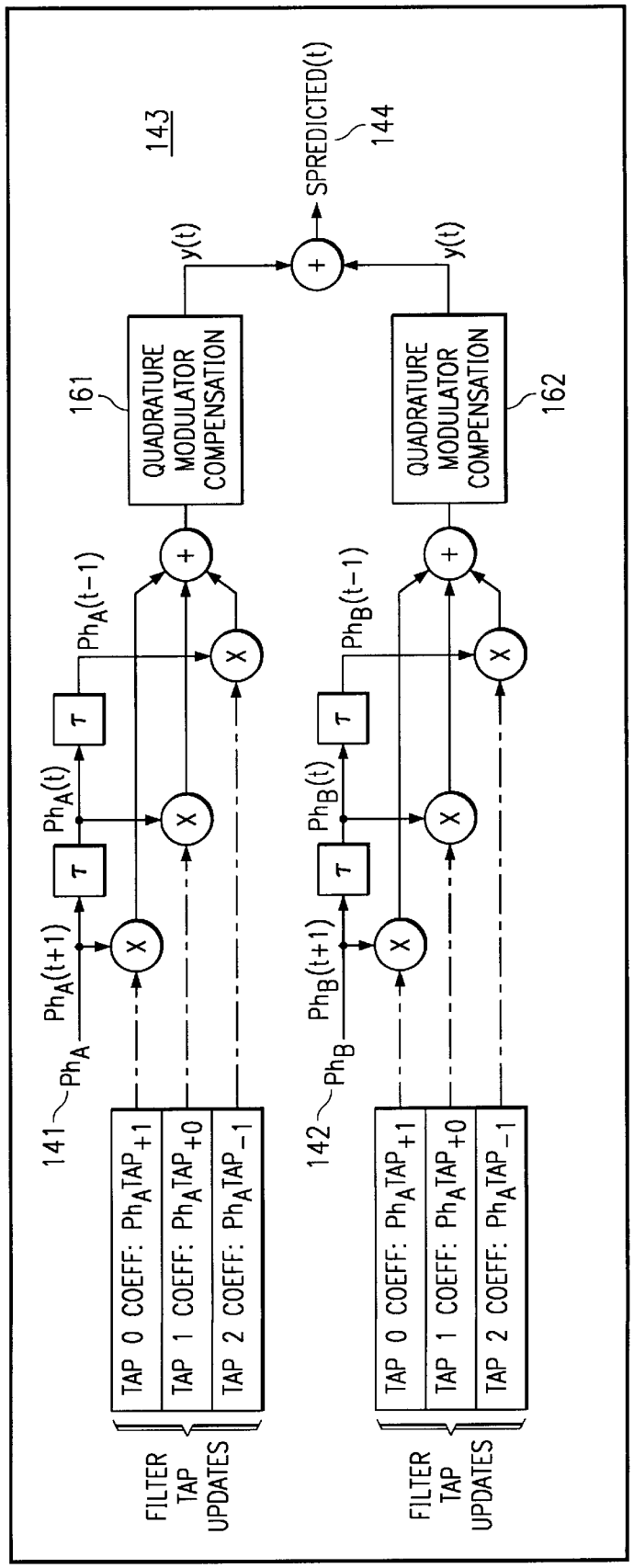
FIG. 16 depicts a schematic diagram of the LINC model amplifier element of the arrangement of FIG. 14.

FIG. 16 depicts a mathematical model structure of the whole of the distortions of the pair of upconversion and amplification paths and the down conversion and monitoring path. This is used to match the distortion produced when the correction circuits (as shown , in FIG. 9) are set to introduce no correction. Note that it is assumed that the distortions produced can be corrected by the structures in FIG. 9. Thus, all of the distortions should be modeled by what is in FIG. 9. Note that FIG. 16 shows only three taps in the FIR filters, although a different number could be used. Note that the structures are complex although they are shown in simplified form. The addition of the quadrature modulator compensation blocks 161 and 162 to the diagram is necessary only if analog quadrature modulators are used. Their structures would be the same as in FIG. 10B. The inputs are $Ph_A$ 13 and $Ph_B$ 14 exactly as for the digital compensation signal processing block 21 in FIG. 2. The output $s_{predicted}(t)$ is the calculated equivalent of the output of the analog to digital conversion 27 in FIG. 2 and that is what is compared with it in the comparator 145 in FIG. 14.

Figure 18:
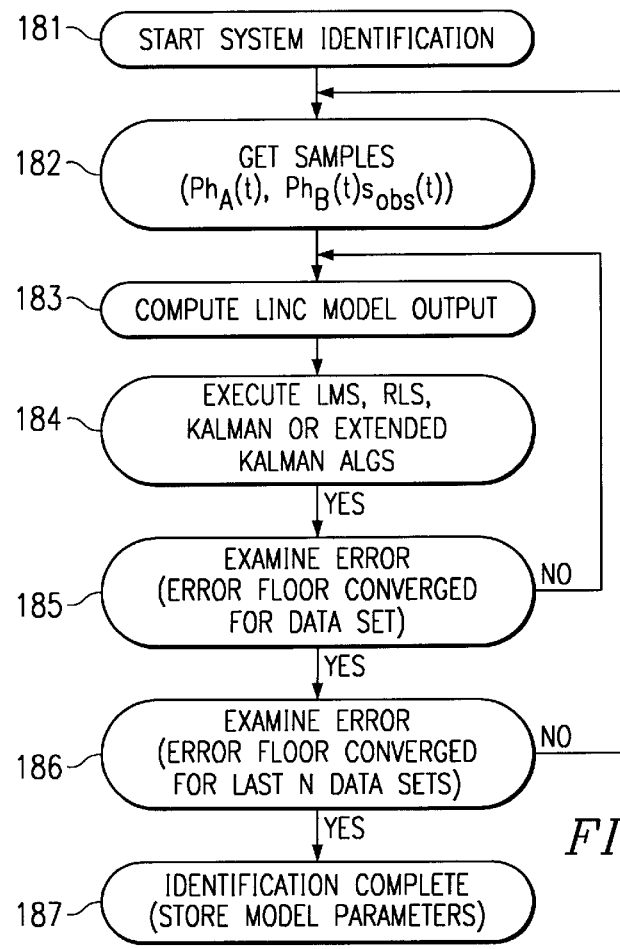
FIG. 18 depicts a flowchart of the operation of system identification.
Figure 6A:
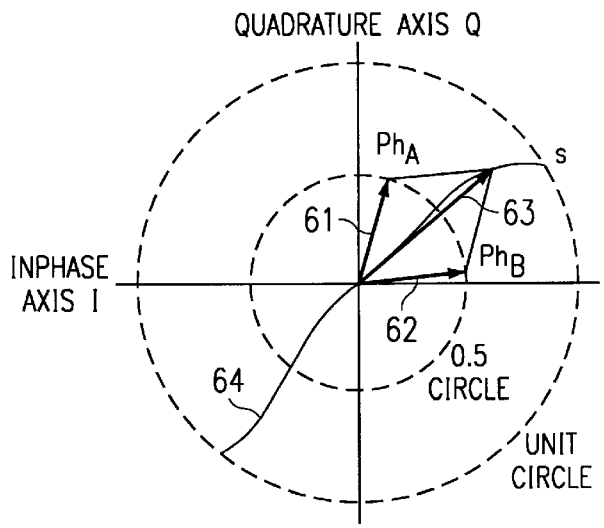
FIGS. 6A–6D depict graphs of the operation of the signal component separator element of FIG. 2 having rapid phase changes in the signal components.
Figure 6B:
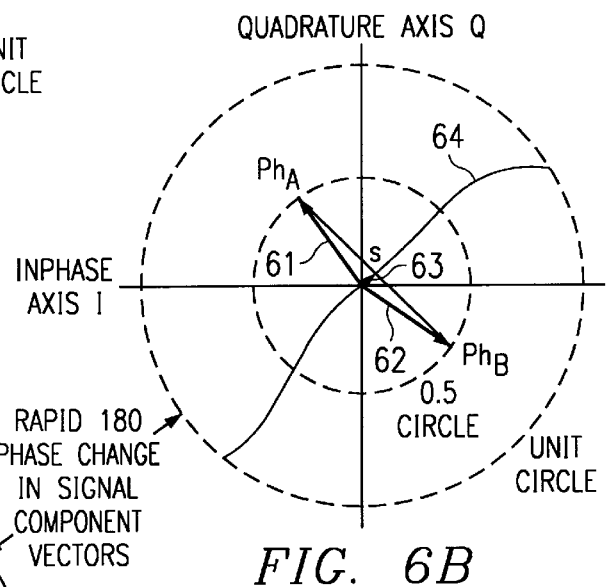
Figure 6C:
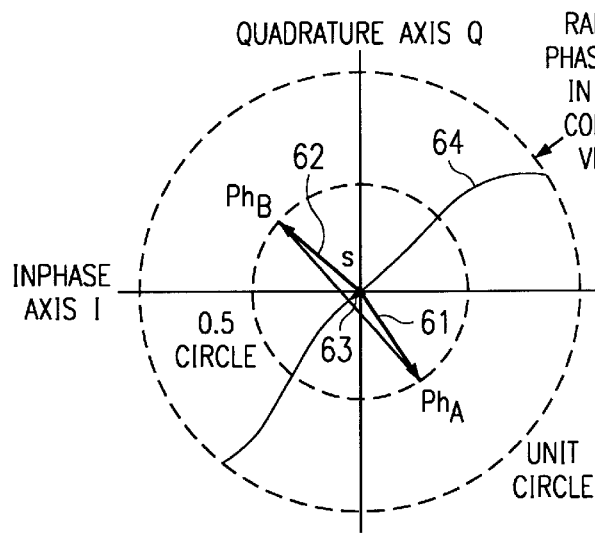
Figure 6D:
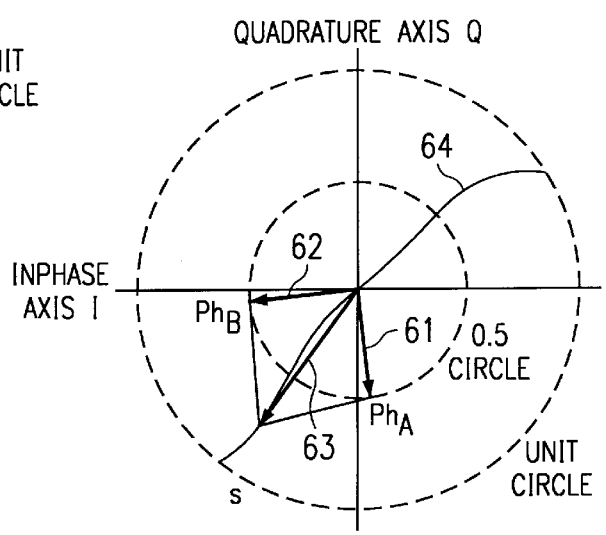
Figure 17A:
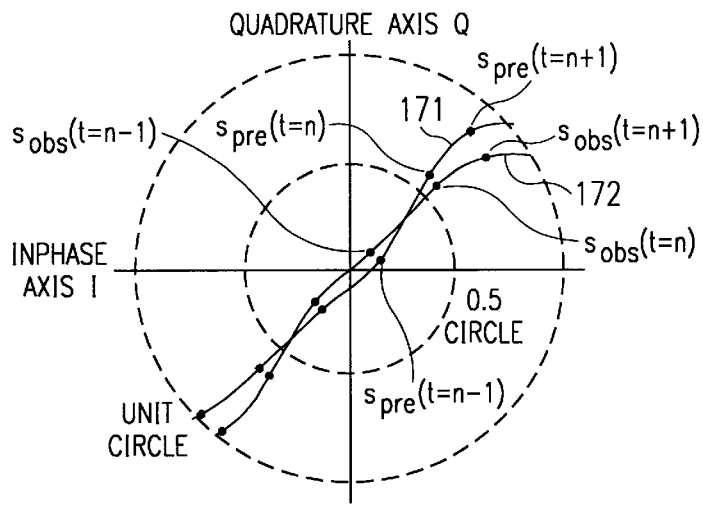
FIGS. 17A–17D depicts graphs of the LINC model amplifier element of FIG. 16 with various settings.
Figure 17B:
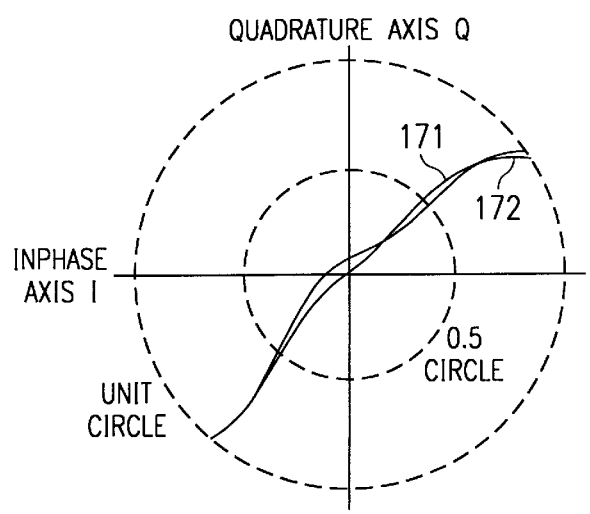
Figure 17C:
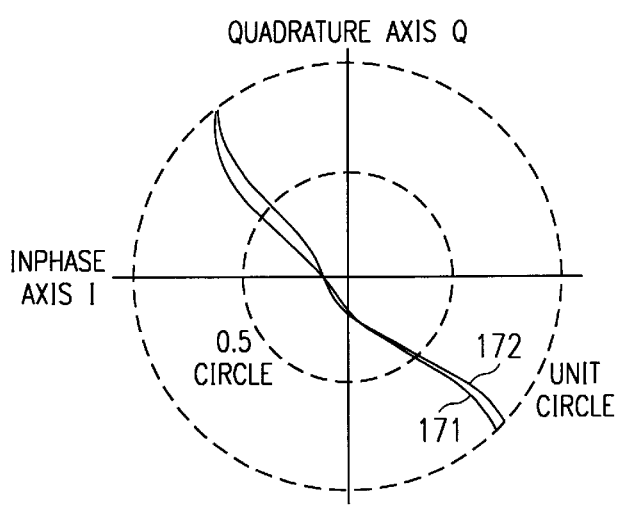
Figure 17D:
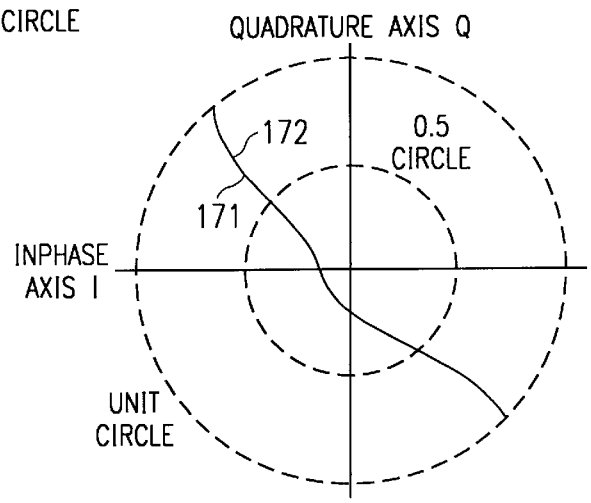

An example of the utilization of the LMS technique in this role is illustrated. Consider the scenario when a three tap compensation FIR filter is determined to be sufficient to accurately represent the imperfection incurred in each up conversion and amplification chain. Note that the distortions which naturally occur need to be corrected by a structure which is capable of reproducing their inverse. If the structure can produce the inverse distortions it can also reproduce the actual distortions. The amount of delay, phase rotation and amplitude slope which can be modeled is determined by the capabilities of the structure. The amount of frequency dependent amplitude, delay and phase ripple which can be modeled and the total delay correctable is dependent on the number of taps in the FIR filters. The more complicated the details that need to be modeled (and ultimately corrected) the longer the filter. The requirements of the system identification algorithm are illustrated in FIGS. 17A–17D. FIGS. 17A–17B depict the first data set, while 17C and 17D depict the subsequent or last data set. This control process is illustrated in FIG. 18. The system identification algorithm 181 is required to capture a sequence of input data samples, $Ph_A(t)$ and $Ph_B(t)$ 182, to the analog up conversion and power amplification chains and the corresponding power amplifier output $s_{obs}(t)$ 172. The algorithm 184 then utilizes these data sequences 183 to generate a predicted sequence $s_{pre}(t)$ 171 from the parallel numerical model. The algorithm will then adjust the parameters of the numerical model to minimize the difference between the observed signal trajectory and the predicted trajectory. Note in FIG. 17B the prediction error is reduced as data sequences become closer. The algorithm iterates over the data set until the RMS error has been minimized 185. However, since the data set is constructed from a finite sequence of observation and stimuli samples this minimal RMS error value does not ensure that the global minima has been reached for all trajectories. Consequently, subsequent data sets are extracted and the process repeated until the RMS error floor from data set to data set has been minimized 186. Note in FIG. 17D the prediction error between observed and predicted trajectories is eliminated. If this error approaches zero it is a good indication that the model selection 187 has captured all imperfection details of the analog design.

The six complex coefficients of the two filters (3 per chain) represent the parameter values that have to be determined, this may be achieved by utilizing equations 8 and 9. Note that the number of coefficients as well as their values are by way of example only.

$$V_{error}(t) = s_{predicted}(t) - s_{obs}(t) \qquad \text{eqn 8}$$

$$[X_+(t)] = [X_-(t)] + \Delta Verror(t)[Ph_A(t), Ph_B(t)]^* \qquad \text{eqn 9}$$

X(t) is the state vector of estimated parameters and the +/– nomenclature is utilized to indicate update vector parameters and current vector parameters. $V_{error}(t)$ is the current difference between the observed recombined signal sampled from the analog down conversion and the expected output that was predicted by the LINC model utilized for system identification. $\Delta$ is a update rate control parameter and $[Ph_A(t), Ph_B(t)]$ is a vector of captured stimuli samples that were used to drive the input to the numerical model at the same time instant as the implemented amplifier. For the three tap example equation 9 would be represented as equation 10.

$$\begin{bmatrix} Ph_A tap_{-1_+}(t) \\ Ph_A tap_{0_+}(t) \\ Ph_A tap_{1_+}(t) \\ \ldots \\ Ph_B tap_{-1_+}(t) \\ Ph_B tap_{0_+}(t) \\ Ph_B tap_{1_+}(t) \end{bmatrix} = \begin{bmatrix} Ph_A tap_{-1_-}(t) \\ Ph_A tap_{0_-}(t) \\ Ph_A tap_{1_-}(t) \\ \ldots \\ Ph_B tap_{-1_-}(t) \\ Ph_B tap_{0_-}(t) \\ Ph_B tap_{1_-}(t) \end{bmatrix} + \Delta Verror(t) \begin{bmatrix} Ph_A(t-1) \\ Ph_A(t) \\ Ph_A(t+1) \\ \ldots \\ Ph_B(t-1) \\ Ph_B(t) \\ Ph_B(t+1) \end{bmatrix}^* \qquad \text{eqn 10}$$

This algorithm is a direct implementation of the standard LMS algorithm. The key to successful utilization in this environment is to ensure that the time index of the captured stimuli and observation waveforms is consistent and the delays in the compensation network are properly handled.

This iteration explicitly defined within equation 8 and 9 is repeatedly executed over the sampled data set until the residual RMS value of the error voltage Verror(t) has finished converging. To ensure that the best estimate for the system parameters has been identified it is appropriate to repeat the operation of gathering more transmit samples and recovered down conversion samples and repeating this process. The process is terminated when the overall RMS error from sample set to sample set does not exhibit any further degradation.

Although the computational simplicity of the LMS algorithm is very attractive, its convergence speed can be prohibitively slow. This can be overcome by utilizing the recursive least squares (RLS) or Kalman filter algorithms. These algorithms exhibit significantly faster convergence rates but at the expense of increased computational complexity. These algorithms may be utilized within the LINC amplifier as a direct replacement for the LMS algorithm and employed in an identical manner. These algorithms are de fined and explained in *Digital Communications*, second edition, John G. Proakis, Chapter 6 pages 519–693, McGraw Hill 1989, 1993 ISBN 0-07-050937-9; *Adaptive Filter Theory*, second edition, Simon Haykin, Chapter 6, pages 186,236, Chapter 7, pages 244–273, Chapter 8, 9, 10, 11, pages 274–402, Prentice Hall 1991, 1996 ISBN 0-13-013236-5; *Applied Optimal Estimation*, Arthur Gelb, chapter 4 pages 102–142, chapter 6 pages 180–216, The M.I.T. Press ISBN 0 262 70008- 5, incorporated herein by reference, consequently the algorithm will simply be defined below using the nomenclature of Proakis as a matter of record and without further explanation.

$$s_{obs}(t) = Y_N^T(t)C_N(t-1) \qquad \text{eqn 11}$$

$$Verror(t) = s_{true}(t) - s_{obs}(t) \qquad \text{eqn 12}$$

$$K_N(t) = \frac{P_N(t-1)Y_N^*(t)}{w + Y_N^T(t)P_N(t-1)Y_N^*(t)} \qquad \text{eqn 13}$$

$$P_N(t) = \frac{1}{w}[P_N(t-1) - K_N(t)Y_N^T(t)P_N(t-1)] \qquad \text{eqn 14}$$

$$C_N(t) = C_N(t-1) + P_N(t)Y_N^*(t)Verror(t) \qquad \text{eqn 15}$$

Figure 19:
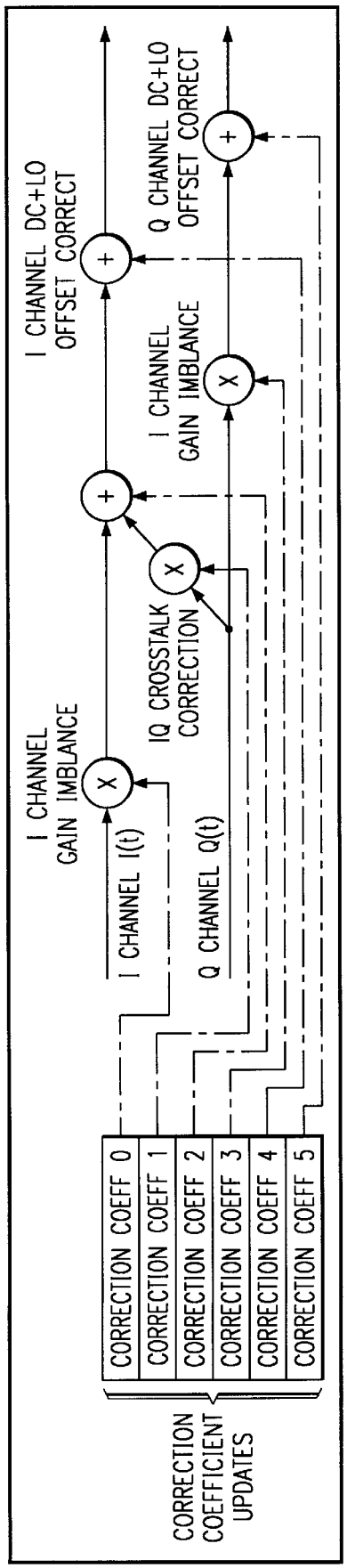
FIG. 19 depicts a schematic diagram of a IQ modulator correction element of the LINC model of FIG. 16.

FIG. 19 is similar to FIG. 10A, except that this figure is a mathematical model and does not work on samples in real time. It models the actual quadrature modulator rather than applying the inverse characteristic, and is part of the ACPCE. This is only used in an implementation which has analog quadrature modulators. Examination of FIG. 19 reveals that the structure of the compensation circuitry may have internal interactions that cause the linear LMS and RLS algorithms to fail to correctly identify the true system parameters. This occurs because the adjustment of the IQ modulator parameters will modify the gain and phase response of the circuit which is compensated for by the FIR filter coefficients. This interaction does not necessarily have to exhibit a linear characteristic and as such will cause the linear estimation algorithms to fail. This deficiency may be overcome by employing the extended Kalman filter algorithm. The algorithm may be directly implemented in the data flow and control structure illustrated in FIG. 18. The ability of the extended Kalman filter to identify the system components despite the nonlinear interactions is achieved because the algorithm identifies the interactions between parameters as well as the parameters themselves. This causes a significant increase in computational complexity. Consequently, this algorithm is only utilized, if it can be identified that nonlinear interactions between compensation parameters do occur for a particular implementation.

The extended Kalman filter algorithms for non linear estimation environments is widely defined and explained in, *Adaptive Filter Theory*, second edition, Simon Haykin, Chapter 6, pages 186,236, Chapter 7, pages 244–273, Chapter 8, 9, 10, 11, pages 274–402, Prentice Hall 1991, 1996 ISBN 0-13-013236-5; *Applied Optimal Estimation*, Arthur Gelb, chapter 4 pages 102–142, chapter 6 pages 180–216, The M.I.T. Press ISBN 0 262 70008-5, consequently the algorithm will simply be defined below using the nomenclature of Proakis as a matter of record and without further explanation.

$$s_{obs}(t) = h_N(t)\{t, C_N(t-1)\} \quad \text{eqn 16}$$

$$Verror(t)s_{true}(t) - s_{obs}(t) \quad \text{eqn 17}$$

$$C_N(t) = C_N(t-1) + Y_N^*(t)[Verror(t)] \quad \text{eqn 18}$$

$$P_N(t) = [1 - Y_N H_N(C_N(t-1))]P_N(t-1) \quad \text{eqn 19}$$

$$Y_N = P_N(t-1) \quad \text{eqn 20}$$
$$H_N^T(C_N(t-1))[H_N(C_N(t-1))P_N(t-1)H_N^T(C_N(t-1)) + R_N]^{-1}$$

$$H_N(C_N(t-1)) = \frac{\partial h_N(C_N(t-1))}{\partial C_N(t-1)} \quad \text{eqn 21}$$

Figure 20:
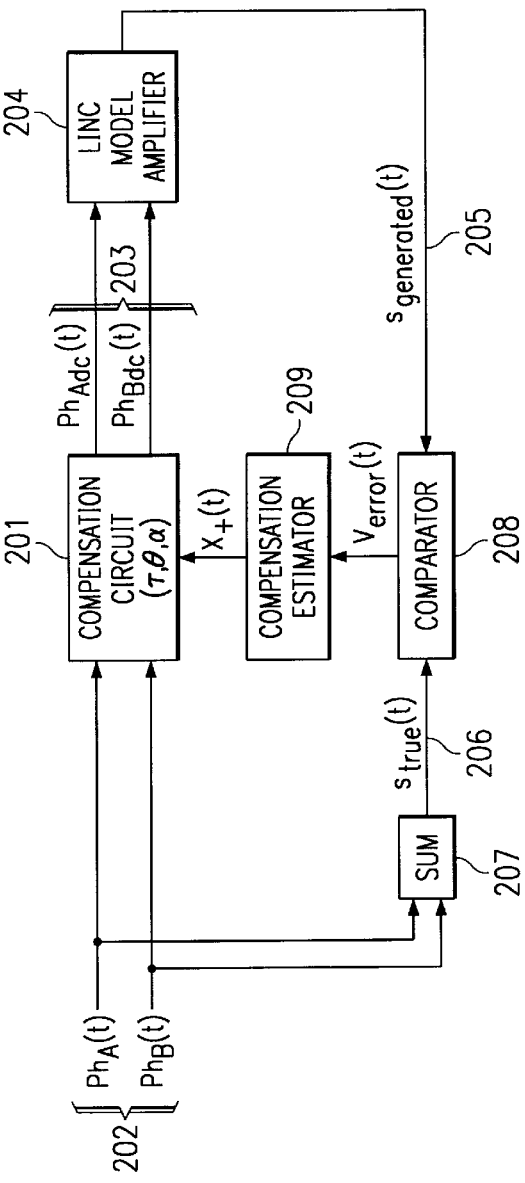
FIG. 20 depicts a schematic diagram of an arrangement to estimate initial compensation parameter values using a LINC model.

The last stage of the initialization procedure is to determine the values of the compensation circuit compensation parameters. This is achieved by using the off-line initial compensation parameter estimation from imperfect model parameters process that is illustrated in FIG. 20, which can be part of ACPCE 28. The previous section explained how to construct and calibrate a numerical model that replicates the behavior of the actual analog electronics. The LINC model is now utilized in conjunction with the compensation circuit to model the entire system design. The compensation circuits 201 are then stimulated with a sample data stream of signal components, $Ph_A(t)$ and $Ph_B(t)$ 202 from the signal component separator. The digital compensated signal components, $Ph_{Adc}(t)$ and $Ph_{Bdc}(t)$ 203, are then applied directly to LINC model amplifier 204 which outputs, $s_{generated}(t)$ 205, a replica of the transmit signal. This signal initially deviates from the original signal trajectory, $s_{true}(t)$ 206 because the compensation parameters are initially set to default values which assume a perfect LINC amplifier. Signal $s_{true}(t)$ is generated from summer 207 which combines the input signals 202. Note that the input signals 202 can be a test sequence from the signal component separator of signal components of decomposed random modulation s(t).

The comparator 208 generates an error vector which is utilized by the compensation estimator 209 to compute adjustments to the compensation parameters. The update compensation parameters are provided to compensation circuit 201 via the parameter vector $X_+(t)$. The compensation estimator is a direct implementation of the LMS, RLS or Kalman filter algorithms which were discussed previously. Furthermore, it should be recognized that if it is identified that the compensation circuit is constructed such that one or more of the parameters exhibit nonlinear interactions then, the extended Kalman filter should be utilized to adjust the values of the compensation parameters.

The above numerical off-line process is executed until the RMS value of the error vector falls to a sufficiently low value. An acceptable RMS value is such that when the compensation parameters are utilized in conjunction with the physical LINC amplifier, (as opposed to the LINC model), the generated power spectra will not violate regulatory requirements and that the modulation accuracy is sufficient not to impair system performance. When this system criteria, and/or additional system dependent criteria are met, then the compensation parameters are stored and on-line transmission may commence. The above process may be accelerated by simply pre-loading the compensation circuit compensation parameters with values that are computed from the direct inverse of the amplitude gain, phase delay and propagation delay values that were determined by correlation. Furthermore, in some applications where regulatory emission requirements are relaxed, this direct inversion of the correlation values may be sufficient to initiate transmission.

Figure 21:
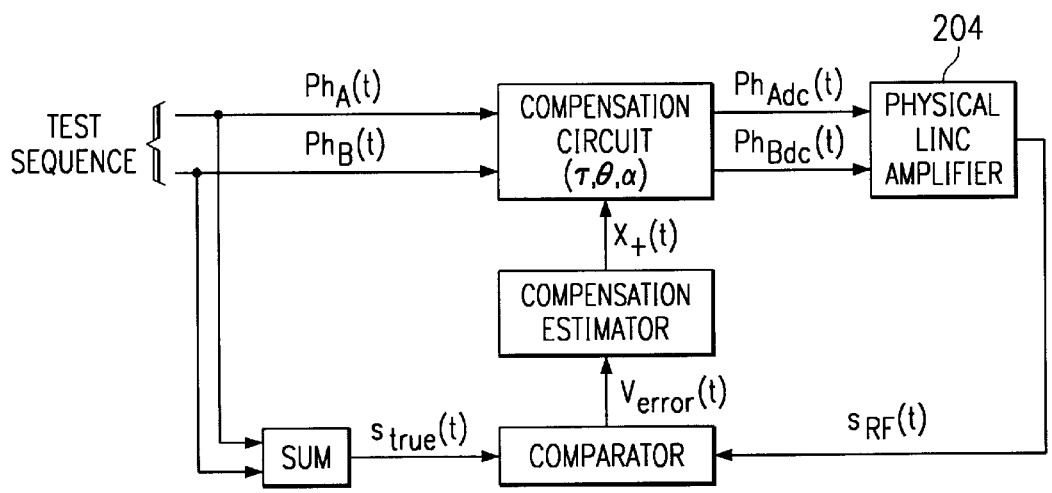
FIGS. 21 depicts a schematic diagram of an arrangement to estimate compensation parameter values using a LINC amplifier.

Upon entrance to the track and update state (5) of FIG. 11, the ACPCE controller loads the previously computed compensation parameter values into the compensation circuit. During the lifetime of the transmission event, the physical characteristics of the analog components may change as a function of temperature, aging, power supply droop etc. Consequently, the compensation parameters must be adjusted to continually track and compensate for these changes. The algorithms required to support this functionality are identical to those utilized in the previous section which described their initial evaluation of the compensation parameters. However, examination of FIG. 21 reveals one difference from FIG. 20.

This difference is that the actual physical amplifier 214 is utilized as opposed to a model 204. As a consequence, it is impossible for the compensation estimation algorithms to keep up with the large data rate and numeric processing power associated with a real time process. However, as previously identified, sets of data samples may be captured and processed off-line. This is permissible because the amplifier characteristics change very slowly, at a rate that is orders of magnitude slower than the data rate of the transmitted signal.

The compensation circuits are then stimulated with a continuous data stream of signal components, $Ph_A(t)$ and $Ph_B(t)$ from the signal component separator. These components are generated from s(t) the complex baseband information signal that is to be transmitted. The digital compensated signal components, $Ph_{Adc}(t)$ and $Ph_{Bdc}(t)$, are then applied directly to the LINC amplifier which outputs, $S_{RF}(t)$, a replica of the transmit signal. Initially, this signal should not deviate from the original signal trajectory, $s_{true}(t)$ because the compensation parameters are set to accurate values which assume a properly compensated LINC amplifier.

Off-line, captured data sample sequences of $s_{RF}(t)$, $Ph_A(t)$ and $Ph_B(t)$ are fed to the comparator which generates an error vector which is utilized by the compensation estimator to compute adjustments to the compensation parameters. The update compensation parameters are provided to the compensation circuit via the parameter vector $X_+(t)$. The compensation estimator is a direct implementation of the LMS, RLS or Kalman filter algorithms which were previously discussed. Furthermore, it should be recognized that if it is identified that the compensation circuit is constructed such that one or more of the parameters exhibit nonlinear interactions then, the extended Kalman filter should be utilized to adjust the values of the compensation parameters.

This process of capturing observed data sequences, combined with numerical off-line computation is repetitively utilized to ensure that the current values of the compensation parameters are sufficiently accurate to ensure that regulatory power spectral emission, system modulation accuracy and amplifier NPR requirements are maintained.

The accuracy of the parameter estimation can be enhanced by iterative updating of the parameters. Rather than calculate new parameters based on only the information in one training sample capture, the amount of change of the parameters can be controlled by calculating a weighted average of the current calculated values with progressively smaller contributions from previous parameter calculations. Thus the newly calculated parameters do not change significantly or suddenly on each training calculation due to non-ideal characteristics of the data of particular sample sets. This type of long term averaging helps to achieve a better overall correction rather than one that "jumps" around the ideal position.

In addition to this, the transition from one parameter set to the next may be applied in steps spread over an interval of time to avoid sudden changes in the amplifier outputs. This would be done by looking at the new and previous parameter values, after the averaging described above (if used), and generating a sequence of parameter values on an interpolated path between the two sets of values. These would then be programmed into the filters and other correction systems in succession at intervals such that the change is made smooth and gradual.

The algorithms utilized for system identification and compensation parameter estimation are summarized as follows:

LMS Update:

$$Verror(t) = s_{true}(t) - s_{obs}(t) \quad \text{eqn 22}$$

$$C_{k+1} = C_k + \Delta e_k V_k^* \quad \text{eqn 23}$$

$$[X_+(t)] = [X_-(t)] + \Delta Verror(t)[Ph_A(t), P_B(t)]* \quad \text{eqn 24}$$

Recursive Least Squares (direct form) also known as the Kalman Filter update:

$$s_{obs}(t) = Y_N^T(t) C_N(t-1) \quad \text{eqn 25}$$

$$Verror(t) = s_{true}(t) - s_{obs}(t) \quad \text{eqn 26}$$

$$K_N(t) = \frac{P_N(t-1) Y_N^*(t)}{w + Y_N^T(t) P_N(t-1) Y_N^*(t)} \quad \text{eqn 27}$$

$$P_N(t) = \frac{1}{w}[P_N(t-1) - K_N(t) Y_N^T(t) P_N(t-1)] \quad \text{eqn 28}$$

$$C_N(t) = C_N(t-1) + P_N(t) Y_N^*(t) Verror(t) \quad \text{eqn 29}$$

Extended Kalman Filter for Non Linear Estimation Scenarios:

$$s_{obs}(t) = h_N(t)\{t, C_N(t-1)\} \quad \text{eqn 30}$$

$$Verror = s_{true}(t) - s_{obs}(t) \quad \text{eqn 31}$$

$$C_N(t) = C_N(t-1) + Y_N^*[Verror(t)] \quad \text{eqn 32}$$

$$P_N(t) = [1 - Y_N H_N(C_N(t-1))] P_N(t-1) \quad \text{eqn 33}$$

$$Y_N = P_N(t-1) \quad \text{eqn 34}$$
$$H_N^T(C_N(t-1))[H_N(C_N(t-1)) P_N(t-1) H_N^T(C_N(t-1)) + R_N]^{-1}$$

$$H_N(C_N(t-1)) = \frac{\partial h_N(C_N(t-1))}{\partial C_N(t-1)} \quad \text{eqn 35}$$

As an enhancement to the training of the signal component correction, there is the possibility of transmitting special signals optimized for allowing the ACPCE to make a good estimate of the correction parameters. The best signal is one which, within the duration of a single training sample block, covers the whole frequency range of interest. Such a signal would ideally not be transmitted out of the antenna but would require a period of time during which no other transmissions could be sent.

The description of the state diagram FIG. 11 lists a large number of possible training sequences "a" to "n". While the sequences "a" to "k" would all be excellent for training purposes they require that the amplifier output is not connected to an antenna. This may be practical for testing purposes, but the only way they would be acceptable for operational use is if an antenna switch were built into the output path to switch the output to a dummy load during testing. A switch is undesirable because of cost and the power loss in such devices. The antiphase tests, e.g., "1", "m" and "n" are good examples, would be preferred because the only emitted signal to the antenna would be due to residual imbalance between the two phase components.

FIGS. 22A–22D show how an antiphase signal gives no resulting output when balanced and how phase and amplitude imbalances result in a small output due to the errors. When there is perfect balance, all of the power is sent to the dummy load. If the amplifiers are badly unbalanced at the outset, this could result in some unwanted emission of energy from the antenna. Under these circumstances the method might not be acceptable and an antenna switch might still be needed. If the amplifiers are already close to balance then the power emitted may be small enough to be acceptable.

In order to cover the full range of frequency and provide training information which maps frequency dependent variations the antiphase signals should be made to cover the entire band that is occupied by the signal components. This is a much wider band than that occupied by the normal transmissions. The antiphase signal is generated internally to the signal component separator and the trainer is configured to run a training calculation on samples taken during this process. The sweep can be run whenever the transmitter is keyed off such as in a TDMA or burst system.

Figure 23:
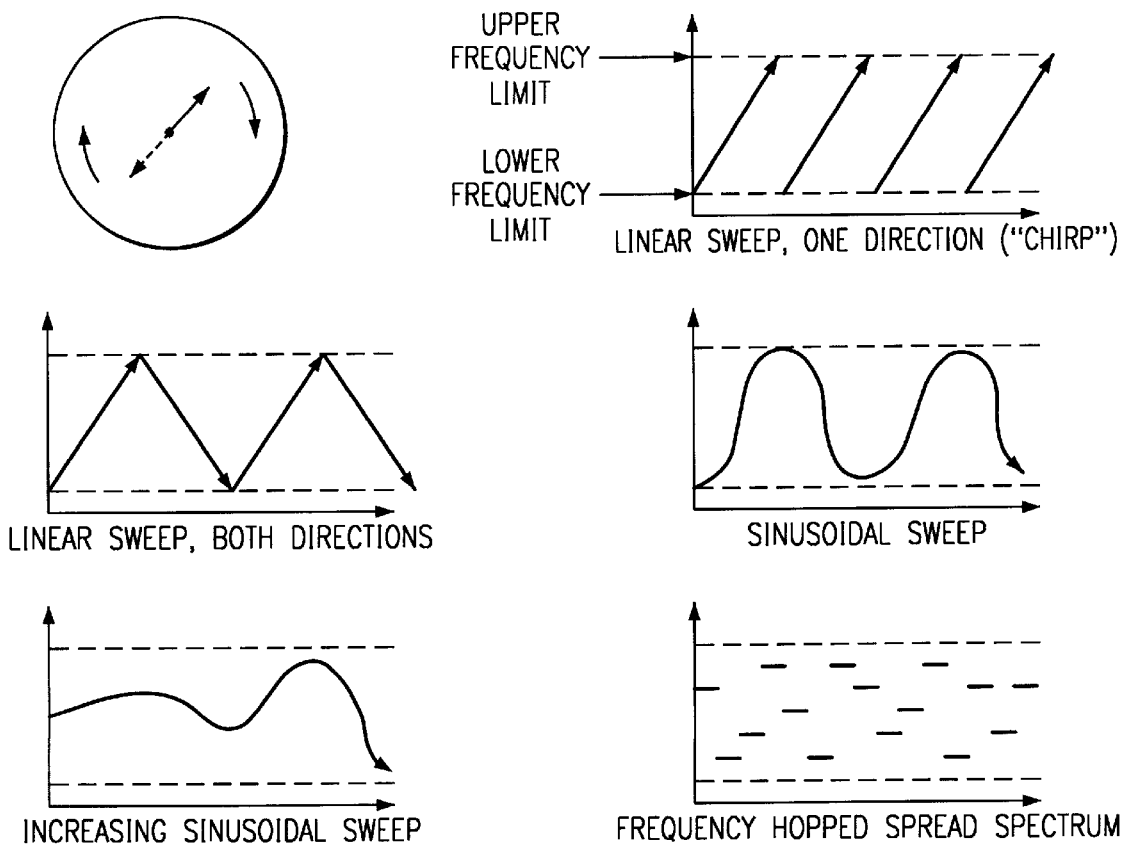
FIG. 23 depicts frequency sweeping antiphase training sequences.
Figure 22A:
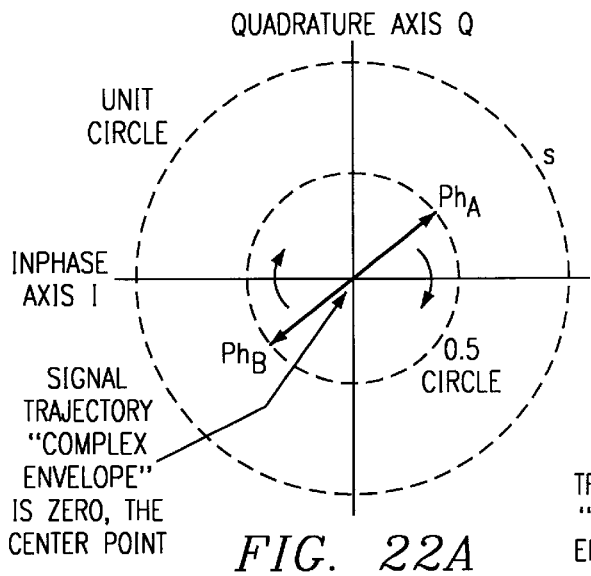
FIGS. 22A–22D depicts graphs showing balanced antiphase signals with no resulting output, and a small output from phase and amplitude imbalances.
Figure 22B:
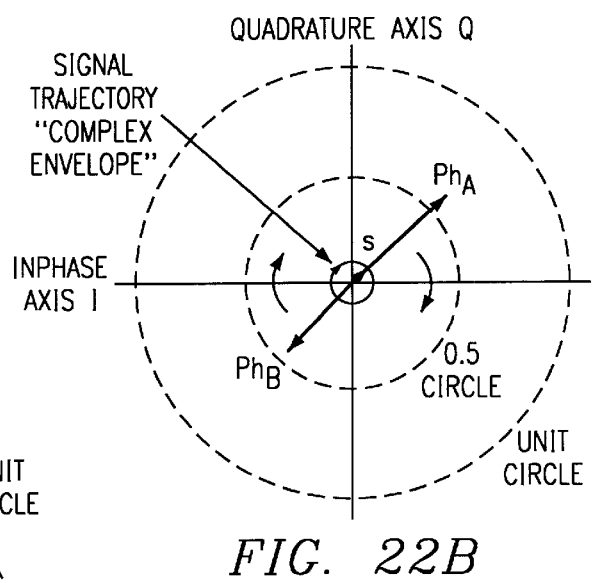
Figure 22C:
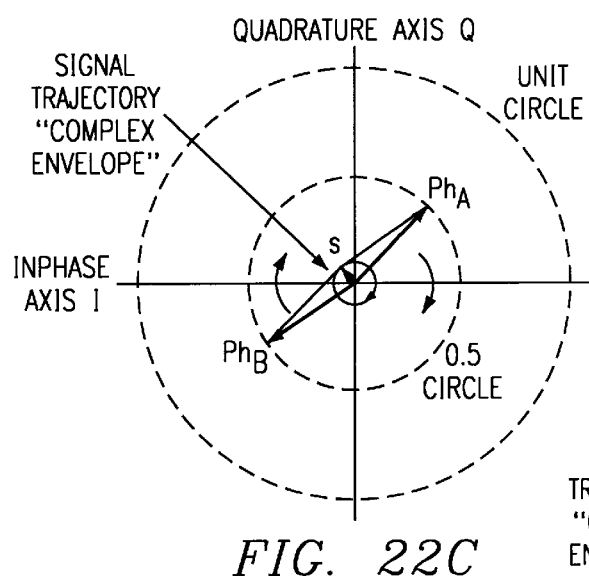
Figure 22D:
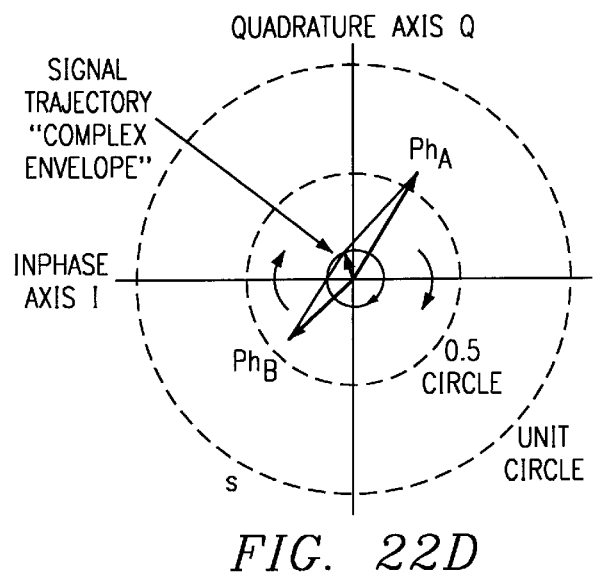

Any antiphase signal has to be generated inside the signal component separator. The frequency rotation of the two antiphase components cannot be mapped by any baseband input. The corresponding complex baseband input is nothing in all cases. Antiphase signals can be linear sweeps in frequency in one direction as shown in FIG. 23, linear sweeps up and then down, or sinusoidal variation in frequency. The limits of frequency sweeping can start within the bandwidth of the transmitted signal and then slowly increase over the period of several training sample runs to cover frequencies over the range covered by the phase component signals.

The test pattern has the two signal components in antiphase and the rotation represents the frequency which is swept, chirped or hopped across the band in use. FIG. 23 illustrates some different frequency patterns over time. The frequencies generated through the amplifiers sweep across the band. At baseband this signal is represented by a negative frequency at the lower limit and DC in the middle. This means that the rotation is first in one direction, slows down to a stop and then speeds up in the other direction.

The frequency hopping scheme is the best because residual transmitted energy is less perceptible. It appears as background noise.

An alternative to chirps and sweeps is a polyphase signal which is a series of discrete frequencies transmitted one after the other. Such a signal could be a series of frequencies in increasing or decreasing order. An ideal sequence would be either a randomly frequency hopped antiphase pattern or an antiphase signal generated from a noise input to a frequency modulation process, because any unwanted emissions would appear only as background noise.

In amplifiers for burst transmission, it would be an advantage to run antiphase test transmissions to keep the training up to date in idle periods. It would also be an advantage to run this test prior to commencement of any transmission and especially after a channel change to make sure that the training is up to date before starting to transmit the real signal. An option of running a test after switch off before actually powering down would also help to keep the parameter tables up to date.

Another advantage of running the antiphase test signal in keyed off periods is that the amplifiers are kept at a constant power operating point, which avoids the need to try to track temperature dependent changes in performance which if uncorrected can cause degradation, in output quality in the first moments after start up.

If transmission start is required during any antiphase training, the amplifier can start to transmit a signal at any time because the training can use whatever signals are available.

A factor in keying up any amplifier is the need to avoid spectral splatter when ramping the input up and also ramping down at the end of transmission. This would ideally be a function to be controlled in the scaling and amplitude control block subsequently described.

Application of power readies the amplifier for transmission, then the input signal is applied (or "keyed") on to initiate transmission. Another degree of control is adjustable bias, which, after the power has been applied allows the operating point of the amplifier to be adjusted. This has the effect of changing the power output and operating point of the amplifier. It can also be used to control the starting up and shutting down rate of the amplifier. When the input signal is keyed on and off this also has the effect, in many amplifiers, of changing the bias. The ideal operating point is set for the type of signal being transmitted. Ramping of a signal to be applied to an amplifier may be (lone in signal processing at baseband. A smooth shaped start up and shut down (key up/down) may be applied to the signal such that the LINC amplifier does not have to control this itself Nevertheless the individual amplifiers in a LINC transmitter are the same as any other and need to be controlled in the ways described herein. However, the LINC amplifier allows an additional different approach to the control of its amplifiers than that normally used for transmitter amplifiers.

The ability to put the two amplifiers into antiphase allows the amplifier output level to be controlled while leaving them individually keyed up at full power. This is an advantage over other types of amplifiers since power, bias and keying on by application of a signal to the amplifiers can be done without any transmission occurring. This means that bias, key up and bias re-optimization can be set up without any potentially undesirable effects being seen at the start of transmission as would normally be the case. The amplifiers can be allowed time to stabilize their thermal state (fully warm up) and fine tuning of bias can be performed.

The process of bringing the amplifiers up and ramping them down as opposed to ramping the signal to be transmitted is different in the LINC transmitter in that the adjustment of bias and antiphase signal key up needs to be controlled to avoid any unwanted transmission during these states of operation. This means that the rate of bias increase as the antiphase signal is applied to the amplifiers needs to avoid the possibility of one amplifier starting up at a different rate from the other even momentarily. This would cause the stronger one to emit an unwanted signal since although being driven in antiphase the cancellation would not be accurate.

When ready to actually key up the signal to be transmitted the ramping of this signal can be done by taking the two amplifiers smoothly out of antiphase and changing to the signal to be transmitted which is scaled to zero initially and then smoothly increased in amplitude up to the normal operating point. Scaling of this type is commonly done using a Gaussian envelope shape which has no sharp discontinuities. The time from start to full power is usually set to meet the licence requirement for the spectral emissions of the particular transmitter application. The scaling, which is done in an AGC functional block in advance of the SCS, is applied to the SCS which varies the relative phases of the component signals to effect the amplitude increase. Keying down is done similarly with a smooth transition to the antiphase condition. If the signal supplied to the baseband input is already smoothly amplitude shaped then there is no need for the amplitude block to apply ramping control in addition. The input signal can be applied directly to the SCS. Whichever process is used to control amplitude still requires phase and frequency control as subsequently described.

If an antiphase chirp, polyphase or frequency hopped training signal as detailed earlier is running, at the point of key up commencement, the arbitrary training signal phase at the point of start of transmission can be used as the starting phase for the signal to be transmitted. This requires a shift of the reference phase of the input signal in the AGC block to match the SCS output, which can be applied using information from the SCS because it is generating the test pattern internally. The information would be applied to rotate the input signal before to match the SCS. This has the advantage of preventing a phase discontinuity at the start of transmission. Amplitude is ramped as stated previously.

The frequency of the antiphase training signal at the point of change over to the modulating signal is also likely to be different from the instantaneous frequency of the modulating signal. The speed of the change of frequency should ideally be controlled as the signal component separator changes over to the frequency of the modulating signal. This will help to prevent any spurious output at the start of key up. A short delay before the amplitude ramp up might be required to accommodate this.

Keying down the signal to be transmitted involves the reverse process as the signal to be transmitted is amplitude ramped and the antiphase training signal is smoothly started by matching the transmitted signal frequency and phase at the point where it reaches zero amplitude. The training signal then continues independently.

If the amplifier is to be powered down then the power ramp down involves ramping the two amplifier bias controls and, finally, removal of the antiphase signals in a manner which avoids spurious emissions.

Figure 24:
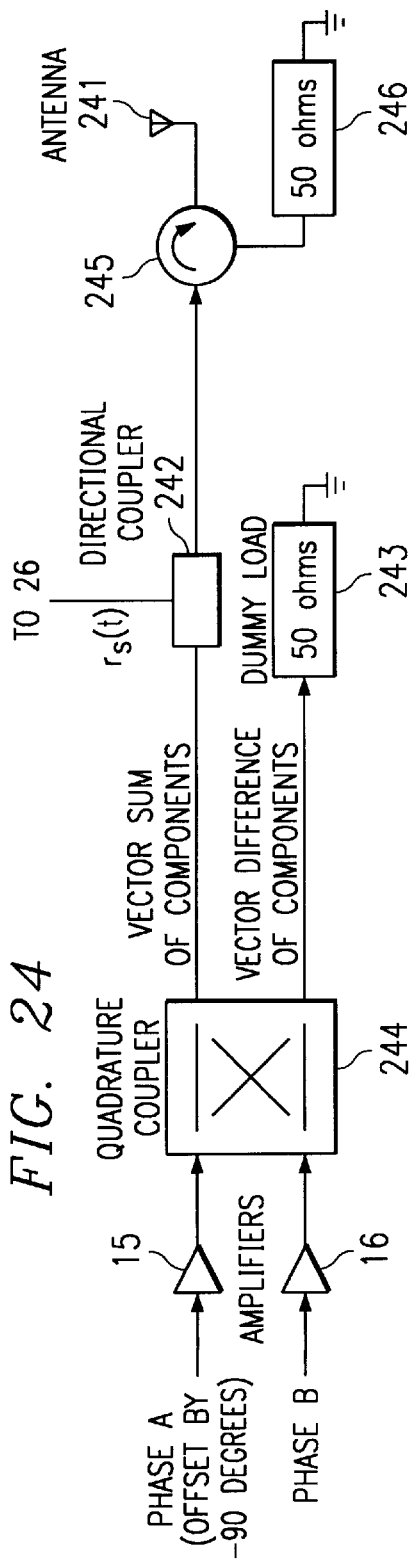
FIG. 24 depicts the amplifier combining and sampling element of FIG. 2 coupled to an output antenna.

FIG. 24 depicts the internal parts of block 25 in FIG. 2, and includes the antenna 241 which attaches to ks(t) 18 and the amplifiers 15 and 16. Directional coupler 242 feeds a small amount of the RF signal back to the down conversion 26. FIG. 24 also depicts circulator 245, which prevents received or reflected signals from antenna 241 from entering the system. The individually amplified constant envelope phase modulated component signals are combined to produce the vector sum of the two via a quadrature coupler 244 which has two separate outputs. When the LINC amplifier generates maximum output power, this is done by having the two components in phase with each other. A practical consideration in the use of a quadrature coupler is the need for the components to actually be offset so that they are 90 degrees apart in order to co-phase at the main output. Other types of coupler require a 180 degree offset. This can be arranged in the digital signal component separator. When this is done, all of the combined power is seen at the main combiner output. No power is seen at the second output. The LINC amplifier outputs minimum power by having the two signals exactly out of phase with each other. No power is seen at the main output. All of the power goes to the second quadrature combiner output. This can be connected to a terminating "dummy" load 243 of sufficient power handling capability. Al intermediate power levels are generated by the difference in phase between the two component signals. Both of the amplifiers run at full power continuously and their combined power is continuously shared between the main output and the dummy load.

The use of nonlinear amplifiers, which are inherently more efficient, means that the amplifiers themselves do not generate as much heat as other types of linear amplifier. The waste energy from the combination of the outputs is dissipated in the dummy load which can be remote from the amplifiers and other circuits. This means that cooling of the amplifiers and other components of the amplifier is simpler and can run at a lower temperature and in a smaller enclosure and with potentially higher reliability. The amount of waste energy sent to the dummy load is dependent on the peak to average power ratio of the signal amplified. Some modulation schemes which have less amplitude variation will not require the phases to cancel as much as others and will generate less heat in the load.

The generation of the two phase modulated components in the SCS as complex baseband digital signals has been described in the foregoing explanations. There is an alternative method of direct generation of real signals which vary in frequency about a carrier or intermediate frequency. This method is described in some prior art patents, for example, VCOs are used to generate the components and basic feedback is used. This option would require us to implement the correction at that frequency. This is not a preferred option because in a digital implementation the sample rate would be higher than for baseband operation.

An example of a digital method of generation of the SCS output is a Numerically Controlled Oscillator (NCO) which is known to those skilled in the art. This uses a memory look up table containing digital samples of a single cycle of a sine wave. A counter is used to access the samples in sequence to output to a D/A converter. The resulting analog signal is then filtered to remove the sampling frequency. The frequency of the resulting analog sine wave depends on how many of the available samples in the look up table are skipped at each sample interval. As in any sampled representation it is essential to have at least two samples per cycle of the sine wave to be represented. Quadrature baseband signals are generated by accessing one sample for the "I" component and another one at a position 90 degrees separated from it for the quadrature component at each sample instant. Baseband representations of signals result in sequences of samples which appear to rotate in clockwise or counterclockwise directions.

Complex baseband signals must be converted to real signals using quadrature modulators. This can be done by direct modulation of the carrier or a lower intermediate frequency. The analog method used to do this results in various undesirable distortions and unwanted products. In particular there is phase and amplitude imbalance resulting in crosstalk between the I and Q components and DC offset between them. This can be corrected as described earlier. Digital quadrature modulators are free from these effects. The preferred method of signal generation is to use digital techniques as much as possible to reduce distortions.

Whenever digital techniques are used in the signal component separator and in the correction filters, at some point the signals have to be converted from digital samples to analog form in digital to analog (D/A) converters. If complex baseband analog signals are to be generated for an analog quadrature modulator this requires a total of four converters, for the in-phase and quadrature components of each of the two phase modulated signals. If real sampled signals from a digital quadrature modulator are generated then only one converter is required for each of the two phase modulated signals.

Figure 25:
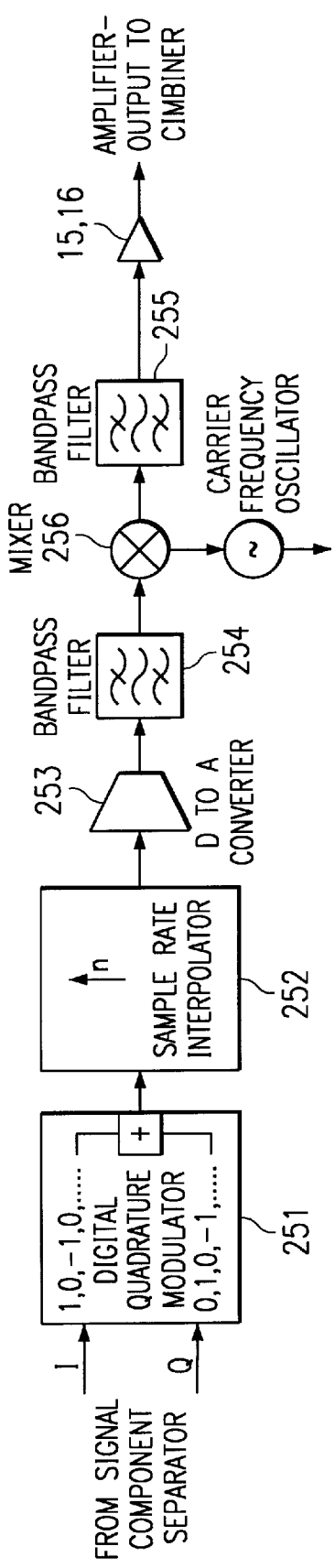
FIG. 25 depicts the modulation and upconversion of one of the two signal paths of the LINC amplifier of FIG. 2.

If digital quadrature modulation is used the frequency at the output of the D/A converters will be relatively low when compared with the hundreds of megahertz typically used in modem wireless communications systems. The low intermediate frequency needs to be upconverted to the carrier frequency used for transmission. This upconversion process is done using analog techniques which are well known in the art. FIG. 25 illustrates a typical preferred path but many other combinations are possible.

FIG. 25 depicts an expansion of one half of 22 from FIG. 2 and either 23 or 24, and an amplifier, either 15 or 16. FIG. 25 depicts the path of one of the phase component signals.

The inputs "From Signal Component Separator" are the I and Q complex components of either $Ph_{A_{dc}}(t)$ or $Ph_{B_{dc}}(t)$. The digital quadrature modulator 251 is depicted to be the simplest type, however. More complicated types use a sampled sine wave lookup table and multipliers and could be used. The sample rate interpolator 252 raises the sample rate to ease the reconstruction filtering requirements. Following that there is the actual DAC 253 and the first bandpass filter 254 is the reconstruction filter, it may also be a lowpass filter. The resulting signal is at an intermediate frequency. The mixer to RF and RF image rejection bandpass filter 255 follows before the amplifier. Other implementations may use mixing 256 to additional stages of intermediate frequencies before mixing to the RF which passes through the non-linear amplifiers 15 or 16. Note that the necessary buffer amplifiers between the DAC and filter and between the filters and the mixer (not shown) are to provide isolation between the various components and to adjust the signal levels appropriately at each stage.

Once the two component signals have been separately upconverted to the frequency required they can be amplified by the two amplifiers. The need for two amplifiers within a LINC amplifier is not a practical limitation. For higher power output, conventional amplifiers are often made up of many smaller amplifying devices in parallel and serial combinations. It does not matter in the LINC amplifier what type of configuration is used or what the ultimate power output is.

In order to implement the monitoring and correction mechanism a small amount of the output signal of the quadrature combiner is directed to a receiver, using a directional coupler. The receiver converts the RF signal down to complex baseband samples which can be compared with samples of the ideal signal. This monitoring process enables the ACPCE to calculate the amount of inaccuracy which exists through the whole of the two upconversion paths.

Figure 26:
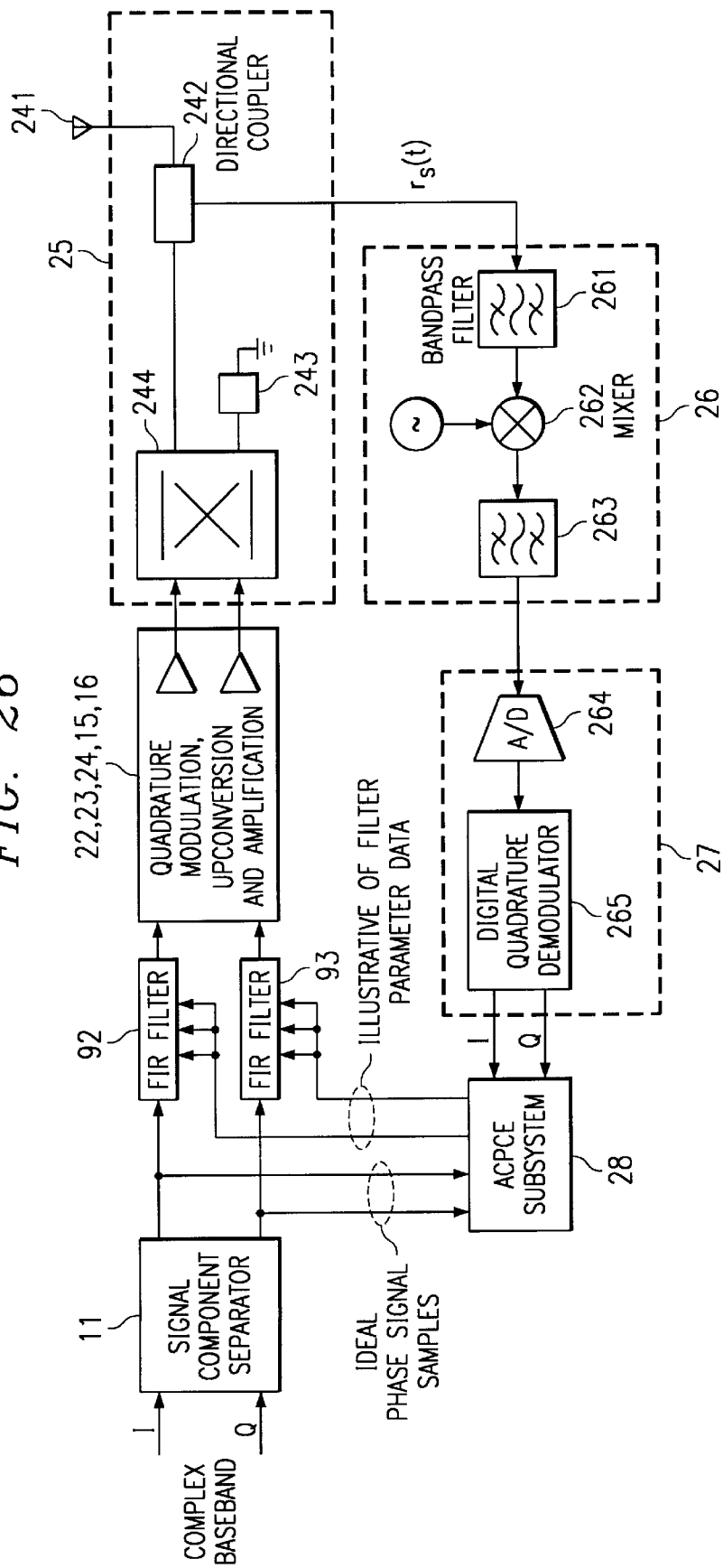
FIG. 26 depicts an arrangement for monitoring the output of the LINC amplifier of FIG. 2.

FIG. 26 shows a preferred down conversion scheme. FIG. 26 depicts portions of FIGS. 2, 24 and 25, and includes the FIR filters 92, 93 which are inside block 21 in FIG. 2.

A small amount of the signal going to the antenna is taken by the directional coupler 242 which is inside block 25 of FIG. 2. The bandpass filters 261, 263, mixer 262 and local oscillator are all contained inside block 26 of FIG. 2. The A/D converter 264 and digital quadrature demodulator 265 are inside block 27 of FIG. 2. The I and Q outputs of the digital quadrature modulator are the $\Gamma s(t)$ 137.

The directional coupler takes a small amount of the RF signal which goes to the antenna. Directional couplers are usually designed to take a portion such as an amount 20 or 30 db below the signal put into them. This amount of energy does not significantly reduce the amount of power going straight through to the antenna, but it is an accurate representation of what is going to the antenna.

The bandpass filter 261 is an image rejection filter which rejects the image which might get converted down to the first IF together with the desired signal. The mixer 262 converts the signal to the first IF. In this illustration, there is only one IF but more may be used. The local oscillator is preferably the same one as the one in FIG. 25. This ensures precision matching of the frequencies of up and down conversion, including phase noise effects. It would be possible to use another or different frequency or oscillator, but it would be much more complicated and difficult to implement the correction if this were to be done. If additional intermediate frequency stages were to be used, then the preference is for oscillators to be the same between up and down conversion. The filter 263 is an anti-aliasing filter which prevents the sampled output of the A/D converter from containing anything but the desired frequency. In the case of oversampling the IF, this can be a low pass filter. If the signal is undersampled, it must be bandpass filter centered around the IF. The A/D converter 264 is a standard component. The digital quadrature demodulator 265 performs the reverse of the digital quadrature modulator. In its simplest form, it requires that the outputs be interpolated and filtered due to an inherent decimation. The use of a digital quadrature demodulator will provide a good representation of the signal at complex baseband. As in the upconversion, there would be some buffering stages between the components in the down conversion.

The differences in the signal paths are due to the total of the distortions in all of the components in the paths. These distortions will be frequency dependent differential time delay, amplitude difference and phase difference. It is important for the correction to be effective over the bandwidth output by the amplifiers. This is a much wider bandwidth than the channel to be occupied by the transmitted signal. It is possible to reduce any residual wideband emissions of the upconversion paths by filtering the output of the amplifier and thereby reduce the requirement for wideband monitoring. A minimum sampling ratio of 4 to 1 compared with the original input sampling rate is typically required. A higher sampling rate up to the 16 to 1 used in the signal component separator reduces the need for output filtering.

In order for the training system to work accurately the baseband signals seen at the output of the demodulator have to be a very accurate representation of the signal actually being transmitted at the amplifier combiner output to the antenna.

It is possible that the antenna may not be properly matched and this can reflect energy back down to the combiner and result in phase and amplitude changes. It is also possible for the antenna to receive unrelated interfering signals from other transmitters which can be seen at the monitoring point. In order to minimize these effects an isolator or circulator 245 should be attached between the monitoring directional coupler 242 and the antenna 241. An isolator directs any energy from the antenna to a separate dummy load 246 as is shown in FIG. 24.

The down conversion process has to be substantially error free because any distortions introduced by it will appear in addition to the effects produced in the upconversion and amplification. This will cause the ACPCE to correct for these impairments as part of the whole. This in turn will result in the transmitted signal having that distortion added to it.

The preferred implementation of the receiver is to first down convert using the same Local Oscillator (LO) as is used in the upconversion. This will result in an intermediate frequency which is the same as that used in the transmit paths and it will cancel any phase and frequency variations introduced by the oscillator in the upconversion paths.

The further down conversion and demodulation of the signals in the receive path can be done using analog or digital techniques. Although analog quadrature demodulators can be fine tuned to produce balanced outputs they are usually subject to distortion which changes over time and temperature which requires continuous correction. Their individual analog outputs also require separate analog to digital converters which are difficult to match absolutely.

Digital quadrature demodulators (DQDM) do not produce the impairments of analog versions and only a single high speed A/D converter is required before the DQDM. Digital techniques are preferred as much as possible to reduce distortion and avoid the parameter drift associated with the analog methods. Digital down conversion can be done using a variety of techniques including undersampling and digital filtering to minimize the amount of analog processing. Undersampling is a technique whereby the analog signal is bandpass filtered as shown in FIG. 26 and then sampled at a rate which is sufficient only to observe the band of interest. This being a rate much lower than that required to sample the actual intermediate frequency.

In the same way that the LO is shared between the upconversion and down conversion the same digital clocks should be used in the DQDM as in the SCS and digital upconversion. This technique greatly simplifies the implementation of fine tuning of the frequency and phase of the carrier in the demodulation chain.

FIG. 26 shows the signal component separator output as the monitoring point for the ideal transmitted signal, not the baseband input to it. This is because the output has samples at a higher rate than the input and therefore it contains more wideband detail. The complex baseband value at any instant could be calculated simply as the vector sum of the two. It is also important in the FIR filter training calculation to know the values of the actual data on the filter taps and this can be read at the SCS output. An additional important detail to note is that the special training signals which are described earlier can only be seen at this point.

The sample measurement amplitudes can be adjusted to take advantage of the full dynamic range available in the digital processing. The full precision helps to make the measurements and the calculated corrections more accurate. The samples of the two phase components $Ph_A(t)$ and $Ph_B(t)$ are always at a constant amplitude but the down converted output may be at any amplitude dependent on the signal being transmitted. The most important consideration is that the A/D converter in the monitoring path is never overloaded because this causes severe distortion. Control of the amplitude of the signals before the A/D converter may be applied using knowledge of the transmitted amplitude from the transmit path. The availability of this information means that overloads should never occur. Another important point is that any analog adjustment of gain in the down conversion would appear as an amplitude error in the feedback path if it is not counteracted numerically by scaling the digital samples. Although this implementation is possible it is a potential source of error.

A simple implementation would be to fix the gain so that the maximum possible output of the amplifier corresponds to just less than the maximum input of the A/D converter.

In a practical product implementation various additional features are required. Monitoring of the amplifier operating conditions and configuration would normally be provided in any amplifier. In a LINC amplifier an individual amplifier failure and balance failure detector should be a requirement to avoid spurious emissions. This could be done by implementing a digital filter at baseband in the receiver to look for out of band energy which would be produced at unacceptable levels under fault conditions. In this event the amplifiers would be switched off and the fault reported. If the fault is serious the bias and power would have to be cut immediately. This possibility is included in the flow diagram of FIG. 11.

Figure 27:
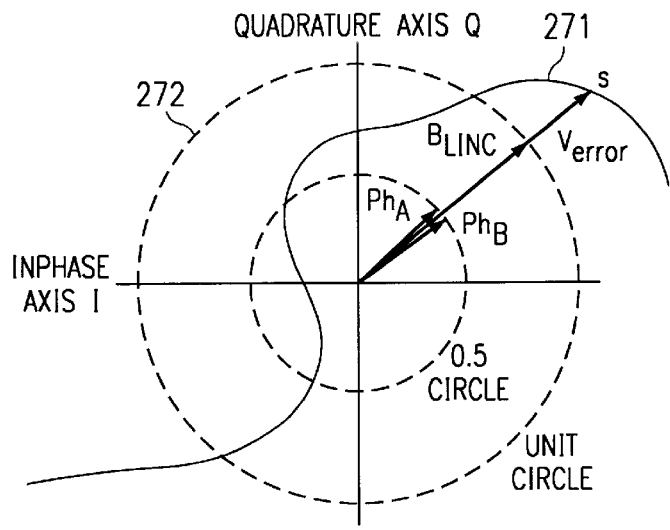
FIG. 27 depicts a graph showing clipping in the operation of the signal component separator of FIG. 2.

Note that the LINC design cannot function correctly over all possible numerical ranges of the input signal I and Q components. That is despite being bandlimited the input signal s(t) is permitted to migrate across the entire complex modulation plane which is unbounded. Examination of equation 3 reveals that the decomposition performed by the signal component separator is only valid when the signal trajectory 271 is within the unit circle 272. The ramifications of this can be seen FIG. 27. Provided the signal component separator is constructed to take care of numerical/computational failure the output of the amplifier will be unable to generate the required amplitude signal because of the maximum finite power level that the amplifier can deliver. Under such circumstances a clipping event will occur at the output of the amplifier and distortion products will be observed. Clearly such scenarios must not be permitted to occur.

Each clipping event will be characterized by a duration and power level, as the clip duration becomes shorter the distortion energy will approach a white broad band Gaussian distribution. However long duration clips will tend to concentrate the distortion energy within the bandwidth of the original signal s(t).

The above scenario can be eliminated or controlled by utilizing a digital automatic gain control stage prior to the signal component separator that causes the signal, s(t) to be constrained within the unit circle. Design and utilization of an AGC stage when employed in a LINC design, requires new design strategies.

In the event that the AGC stage still allows an excessive input to the SCS it must generate signals with the correct phase but on the unit circle. It is not acceptable for spurious phase responses to result from an overload of the SCS input.

In the amplitude scaling block the main implementation consideration is determination of the peak to average ratio of a signal for setting the correct range of amplitudes to be output by the amplifier. Ideally, when the absolute highest peak signal is input to the signal component separator this should produce the condition where both amplifiers are driven in phase for maximum combined output. This will then serve as a reference for the generation of all other amplitudes. Typically this value is not known until it occurs and even when set it may still be possible for occasional signals to exceed this value. In a multi-channel system additional carriers may be keyed on and off, changing the power requirements. Ideally the average power level in such systems should be adjusted so that the addition or removal of carriers does not cause the power of the others to change.

Sample power can be averaged over time and the occurrence of peaks which exceed the maximum output capability noted. If clipping is unacceptably frequent the input signal sample values can be reduced by a scaling factor to reduce the overall output power. The scaling block can avoid clipping problems by scaling the inputs conservatively low at start up and stepping the values up until the best efficiency balance against clipping is achieved. This does not affect the operating point of the amplifiers since they always run at a constant power.

With most types of digital modulation such as 16 QAM the peak to average ratio and clipping statistics are easily calculated and therefore in these applications the amplitude level can be programmed into the LINC amplifier and automatic adjustment becomes relatively simple. Amplitude modulated voice is an example of a signal which has a high and unpredictable peak to average power. In this case the automatic control would be an advantage but in this example a long time average would be needed to avoid the level jumping up and down as the amplitude is corrected.

If the peak which is selected is extremely infrequent and of short duration it may be better for overall efficiency to allow it to be clipped and position the average power closer to the peak. It is then preferable for the amplitude scaling of the AGC to perform the clipping to save the signal component separator from being subjected to an input which exceeds its capability. Setting the average higher in the output range promotes power efficiency because the amplifiers spend more time closer to being co-phased and less power is sent to the dummy load.

Amplifier power output control can be effected using an amplitude scaling block before the signal component separator. There is also the possibility of doing this by attenuation of overall amplifier output and also by altering the bias of the amplifiers. Control in the amplitude scaling block gives very precise manual or automatic control without changing the amplifier operating points. This method of control is the preferred option. Anything which alters the operating points of the amplifiers could require new correction parameters to be calculated to correct for other effects of the change.

Hard limited amplifier classes (C, E and F) are efficient but have very nonlinear transfer characteristics. This might mean that when operating close to or at saturation a large change in the input signal amplitude would be needed to achieve a small change in the output. If FIR filters do not have enough effect on the outputs of amplifiers operating in severe gain compression then alternative means for amplifier gain control might be required.

It is a preferred refinement of the ACPCE control system to allow the overall amplifier gains to be adjusted by controlling the amplifiers directly. This can be done by adjusting their power supplies or bias conditions. This would require digital to analog converters to control the voltages. By adjusting for any bulk gain mismatch in this way the maximum available digital resolution of the FIR filters can all be applied to the fine control of any gain variation across the frequency band in use as well as phase and delay errors. Direct amplifier controls are also a requirement for the power up and down of the amplifiers as described earlier. In a case where the amplifiers have a significant difference in gain, coarse bulk gain adjustments could also be done manually at the time of manufacture.

If the FIR filters still do not affect the amplifier gains effectively then the bias controls can be made to do all of the gain control but this is sufficient only if the amplifiers have substantially flat gain over the operating frequency band. This is likely to be the case when amplifiers are operated far into compression and also when the bandwidth is small compared to the frequency of the channel. For example, 1 MHz at 900 MHz is only 1/900 or 0.0011% bandwidth to frequency ratio.

FIG. 28 shows how the amplifier controls connect to the ACPCE in the LINC amplifier. Since amplifiers 15, 16 are non-linear, they produce a substantially constant output. This means that if they have different gains, which is likely to be the case, the adjustment of their inputs will not have much effect on their outputs. Gain balance is a requirement for successful LINC amplifier operation. It is probable that if any significant amount of bulk gain difference exists between the amplifiers themselves, the algorithms in the ACPCE 28 will drive one of the FIR filters 92, 93 to reduce the signal in one path a lot and boost the other as far as it can. This may still not be enough to achieve balance at the output of the amplifiers. Even if it is, the effect could be detrimental to the effectiveness of other aspects of the correction due to a small, noisy, signal passing through one path with limited digital resolution and precision. All of the dynamic range of the FIR filters 92, 93 might be used up on the one gain balancing effect without leaving numerical precision for other corrections such as gain slope over frequency. This effect, while likely to be slight, might require much of the available FIR dynamic range. It is highly desirable, therefore, to separate out the parameters controlling overall gain balance into a single adjustment which controls the amplifiers directly. This can be applied through bias or power supply voltages to the amplifiers through a pair of slow acting D/A converters 281, 282. Gain control could also be applied to other components in the upconversion paths. With overall gain matched this way, the FIR filters can be used to effectively control any frequency dependent gain differences between the amplifiers which might remain. The bias controls do not have any effect on frequency dependent effects. Note that there is a possible need for bulk delay adjustment which amounts to the same bulk phase shift. This might be set up manually at the time of manufacture, as might bulk gain, or it might be adjusted by another ACPCE controlled structure such as the one described in reference to FIG. 28 for gain.

Ideally a LINC amplifier will be chosen for a task such that it can operate near its peak of efficiency. One of the details of setting up the power level and maximum efficiency is making sure that the peak power really does conform to colinearity, with both amplifiers operating biased at their best efficiency point. A separate automatic amplifier efficiency peaking system could be used to keep the amplifiers on the peak of their efficiency.

It is intended that when an amplifier is made it will be allowed to self train to achieve a good output as part of its initial testing. The filter coefficients are then stored in non-volatile memory which means that when subsequently switched on it has a starting point from which to operate which is much better than starting with no information. This principle of holding, in non-volatile memory, the last calculated correction coefficients will always be used whenever the amplifier is switched off. An additional implementation detail would be to time stamp the data from a continuously running internal clock. If a continuously running internal clock shows that the data stored is too old at switch on then a full start up training and acquisition would be performed.

It is possible for the correction coefficients to be different for different channels that the amplifier may have to be able to transmit. When the frequency of operation is changed substantially to a completely new range by changing the final LO frequency the amplifiers and other components may have different characteristics. It would be ideal to store correction coefficients for each channel of operation. Although this can be done at the factory some channels may be used more than others meaning that the most recent information stored for a particular channel may be old when called for. If the amplifier is called upon to operate on a channel which it either has not got information for or the information is too old. It can interpolate the required data from more recent or available values for channels above and below the one called for. If sufficient qualified data is not available a full start up training and acquisition would be performed.

Figure 29:
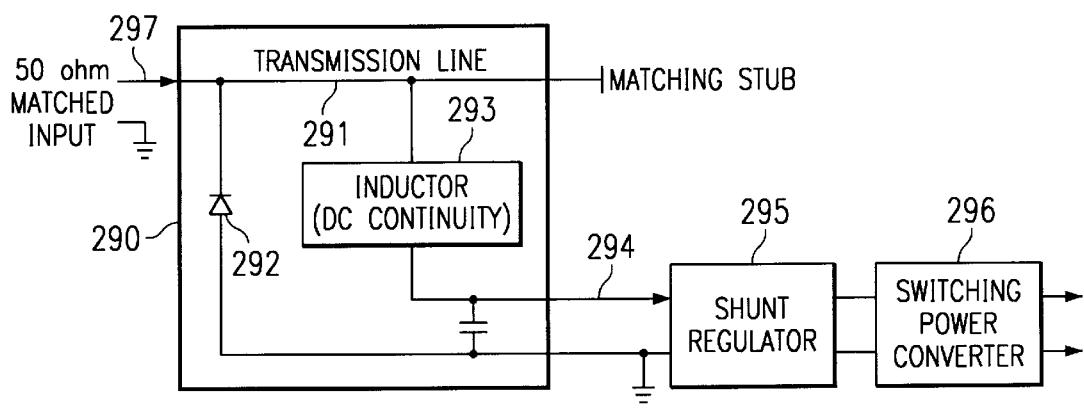
FIG. 29 depicts a schematic diagram of an inventive arrangement to recover waste energy.

The waste energy sent to the dummy load is in the form of a radio frequency signal which can be rectified and recovered. The recovery and use of this energy can help to enhance the overall power consumption efficiency of the amplifier. This type of energy recovery is easier and more economical to implement than recovering the waste heat generated as it is in conventional amplifiers. FIG. 29 is a diagram of a scheme which could be used to recover the waste energy in the place of the dummy load. It has to present a constant 50 ohm impedance to the quadrature coupler output to avoid reflecting RF energy back to the coupler and amplifiers. It also has to convert the varying amount of input to a constant voltage which can be used to do useful work. The power could be used to charge a large reservoir capacitor at the input to the power supplies to the LINC amplifier and reduce its overall power demand from the supply source. Note that the system of FIG. 29 would be connected to the quadrature coupler 244 at FIG. 24 in place of dummy load 243.

Note that the power going into the dummy load 243 can be a significant portion of the total produced by the amplifiers since the nature of LINC operation means that they both run at full power continuously. When the overall amplifier output is intended to be less than the maximum, the excess energy goes to the dummy load 243. Therefore, it is a significant potential aid to power efficiency to recover the energy going to the dummy load. Even if only a relatively small percentage of the energy can be recovered, it significantly improves the overall power conversion efficiency of the amplifier.

The input 297 connects to a transmission line 291 which must appear to be a matched impedance, for example 50 ohms, to the quadrature coupler 244. If the quadrature coupler does not see a matched termination, this can affect the balance of the combining of the two amplifier outputs. A diode 292 is placed to rectify the RF alternating signal to produce a DC output.

The inductor 293 is an RF block which has a low DC resistance but appears as a high resistance to RF frequencies. In the case of UHF frequencies, the inductor 293 could be a part of the overall transmission line structure. The power handling capabilities of individual diodes would not be sufficient to convert all of the available power, so a plurality of the detector structures 290 would be required with their outputs 294 combined in series and parallel to give a useful output to the shunt regulator 295. In addition, the "transmission line" 291 would likely be a much more complicated structure of filters and couplers to maintain the impedance matching and distribute the RF energy input at 297 to multiple detector structures 290. A shunt regulator 295 would be necessary to maintain a constant load on the diodes. The apparent impedance match could otherwise be affected as the power from the RF input varies with the signal being transmitted. In addition, the amount of loading on the switching power converter 296 cannot be assumed invariant. There would be a rapidly varying power input and a varying DC load. The active shunt regulation would dump power to ground when the switching power converter has no load attached to it. The switching power converter 296 changes the available detected power to a constant voltage but with a current which will be dependent on the available detected RF power.

A further efficiency enhancement is to have small amplifiers generate the whole output signal alone when the signal is at a low level. Higher power amplifiers are brought into operation on demand to meet peak output requirements. In a LINC configuration the extra amplifiers can be made to power on in antiphase just before they are required and then contribute their power smoothly when required. The best practical advantage to this method would be in systems where peaks are occasional and very high. A processing delay would have to be allowed to give the high power amplifiers time to warm up before being called upon to contribute to the output.

This invention is applicable to any amplifier for bandlimited RF signals. It can be used for multiple signals and for any modulation scheme or combination of modulations on the EM spectrum or acoustic spectrum. Where multiple signals are amplified they can each have any modulation type.

The inventive LINC amplifier dissipates most of its waste heat externally in a dummy load which allows it to operate cooler and with fewer fans in a smaller enclosure.

Figure 30:
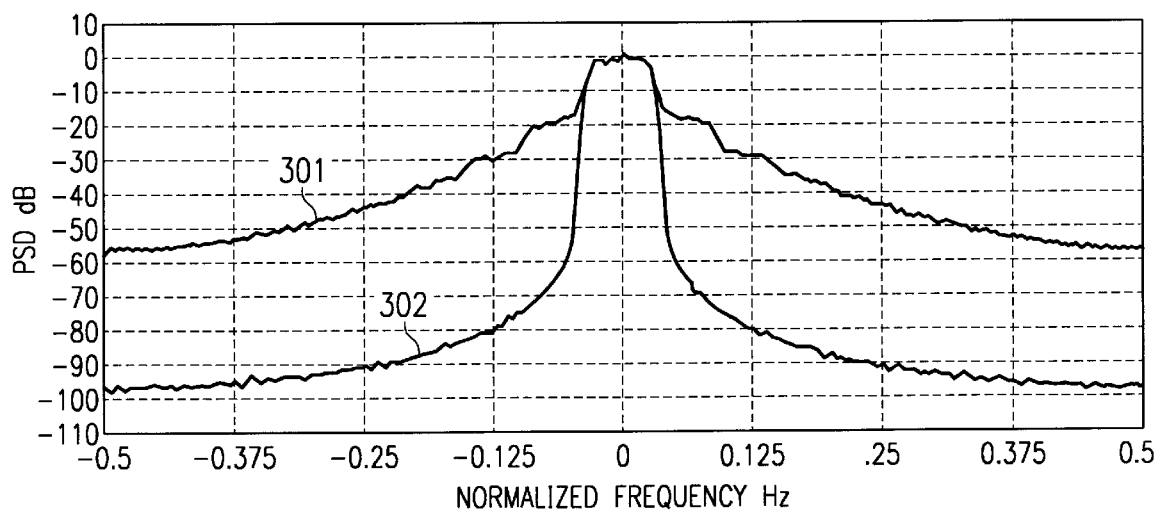
FIG. 30 depicts an idealized graph of the power spectral densities of the amplifiers.
Figure 31A:
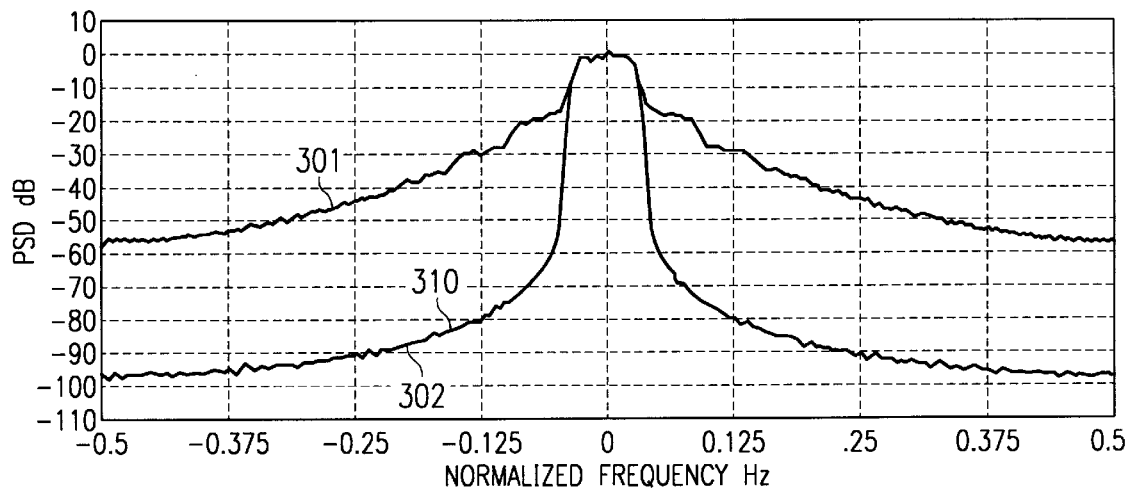
FIGS. 31A–31C depict graphs of the power spectral densities of the amplifiers with various phase imbalances.
Figure 31B:
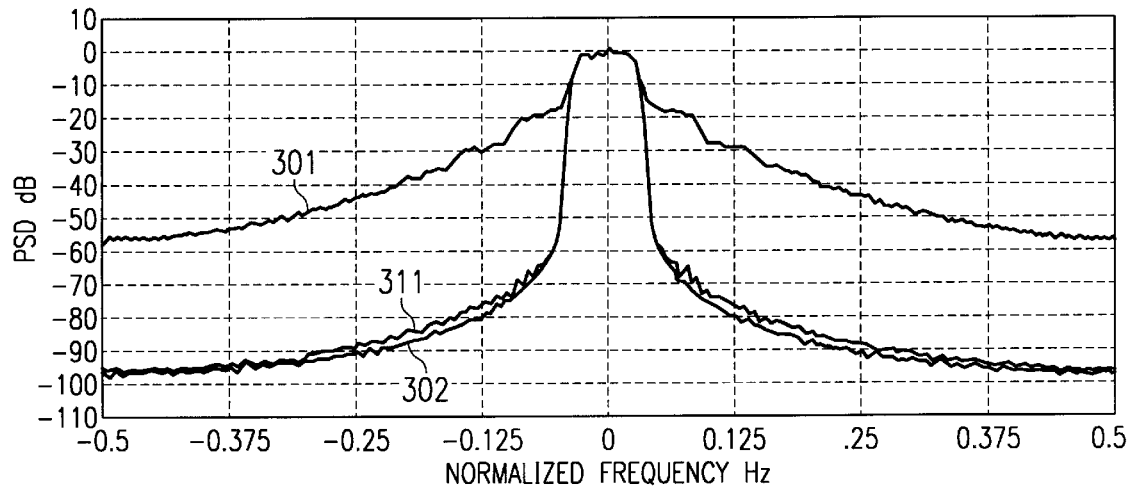
Figure 31C:
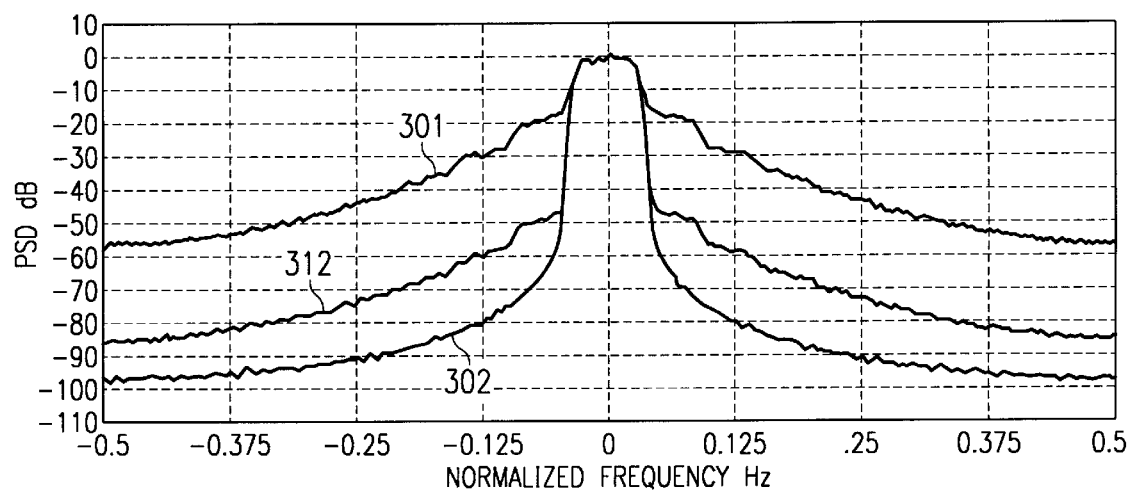

FIG. 30 is similar to FIG. 5 and is an overlaid spectral plot of both of the two amplifier 15, 16 outputs $Ph_{Arf}$ and $Ph_{Brf}$ 301 and the combined output at the antenna under ideal conditions of balance of phase, amplitude and delay 302. The two plots match in the central part of the spectrum, which is the bandwidth of the modulated signal to be transmitted. The modulation spectrum is typical of what might be generated by a 16 QAM or QPSK signal. The trace 302 of FIG. 30 is a reference for all of the plots in FIGS. 31 and 32, and it is calculated with no phase, amplitude or delay difference between $Ph_{Arf}$ and $Ph_{Brf}$. The plots in FIGS. 31 and 32 all have the phase signals and the ideal reference 302 from FIG. 30 for comparison purposes. FIG. 31A shows the effect of amplitude balance but an 001 degree phase imbalance 310. FIG. 31B shows the effect of amplitude balance but an 0.1 degree phase imbalance 311. FIG. 31C shows the effect of amplitude balance but a 1 degree phase imbalance 312. FIG. 32A shows the effect of phase balance but an 0.01 dB amplitude imbalance 320. FIG. 32B shows the effect of phase balance but an 0.1 dB amplitude imbalance 321. FIG. 32C shows the effect of phase balance but a 1 dB amplitude imbalance 322. From these plots, it can be seen that performance is compromised noticeably by phase imbalance of 0.1 degree and amplitude imbalance of 0.01 dB.

Although the present invention and its advantages have been described in detail, it should be understood that various changes, substitutions and alterations can be made herein without departing from the spirit and scope of the invention as defined by the appended claims.

What is claimed is:

1. In a LINC power amplifier, an adaptive method for compensating for an unwanted difference between analog signal paths, comprising:

(a) separating an input transmission signal into at least first and second component signals having envelopes of varying phase and substantially constant amplitude;

(b) amplifying the component signals along respective first and second analog signal paths;

(c) combining the component signals following amplification to produce an output signal;

(d) monitoring and digitally processing at least (i) the component signals prior to amplification, and (ii) the output signal, to generate compensation parameters; and (e) modifying the first and second component signals prior to amplification thereof, based on the compensation parameters, to reduce distortion caused by said unwanted difference.

2. The method of claim 1, wherein step (d) comprises storing digital sequences of the output signal and of the component signals in a memory, and processing the sequences stored within the memory in a non-real-time mode to generate the compensation parameters.

3. The method of claim 2, wherein step (d) comprises processing the sequences at a digital processing rate which is substantially less than a sampling rate of the sequences.

4. The method of claim 1, wherein step (d) comprises implementing at least one of the following digital filtering algorithms to generate the compensation parameters: LMS, RLS, Kalman, Extended Kalman.

5. The method of claim 1, wherein step (d) comprises storing a set of compensation parameters and a time stamp in a memory of the power amplifier for subsequent use.

6. The method of claim 1, wherein step (e) comprises digitally filtering the component signals to add at least one of propagation delay, amplitude gain and phase rotation to the component signals.

7. The method of claim 6, wherein step (e) comprises digitally filtering the component signals using finite impulse response filters.

8. The method of claim 1, wherein step (e) comprises adjusting gain settings of non-linear amplifiers that are used to amplify the first and second component signals.

9. The method of claim 1, further comprising applying training signals to the power amplifier when no input signal is present, and using the training signals in step (a) to generate compensation parameters, the method thereby enabling the compensation parameters to be updated when the power amplifier is not being used to transmit a signal.

10. The method of claim 9, wherein the step of applying training signals comprises generating first and second training signals that are in antiphase with one another so that the training signals substantially cancel each other when combined, the method thereby substantially inhibiting a transmission from the power amplifier during training.

11. The method of claim 9, wherein the step of applying training signals comprises applying a first training signal to the first analog signal path, and concurrently applying a second training signal that is orthogonal to the first training signal to the second analog signal path, the orthogonal first and second training signals allowing bulk imperfections in each analog signal path to be separately measured.

12. The method of claim 1, wherein step (b) comprises switching from a first set of compensation parameters to a second set of compensation parameters using an interpolation process.

13. The method of claim 1, further comprising the steps of:

adaptively generating a numerical model of the first and second analog signal paths, and using the numerical model to generate an initial set of compensation parameters.

14. A power amplifier which receives a bandlimited input transmission signal and provides an output transmission signal, wherein the output transmission signal is a substantially linear amplified representation of the input transmission signal, the amplifier comprising:
 a signal component separator that decomposes the input transmission signal into at least a first component signal and a second component signal, wherein each component signal has a substantially constant amplitude and a varying phase;
 first and second analog signal paths along which the first and second component signals are respectively amplified;
 a combiner that receives and combines the first and second component signals following amplification thereof to compose the output transmission signal;
 a compensation signal processor that digitally modifies at least one of the first component signal and the second component signal prior to amplification to compensate for unwanted differences between the first and second analog signal paths, the compensation signal processor modifying the at least one component signal based on compensation parameters; and
 a compensation estimator which adaptively generates the compensation parameters based on an observation of signals within the amplifier.

15. The power amplifier of claim 14, further comprising a memory which stores sequences of samples of observed signals within the amplifier, and wherein the compensation estimator processes the samples stored within the memory in a non-real-time mode to generate updates to the compensation parameters.

16. The power amplifier of claim 14, further comprising a signal generator which generates training signals to stimulate the first and second analog signal paths when no input transmission signal is present, the training signals enabling the compensation estimator to generate updates to the compensation parameters between transmissions.

17. The power amplifier of claim 16, wherein the signal generator generates first and second training signals which are substantially in antiphase so that the training signals substantially cancel each other when combined.

18. The power amplifier of claim 14, further comprising a circuit which recovers energy associated with signals applied to the first and second analog signal paths.

19. The power amplifier of claim 14, wherein the first and second analog signal paths comprise respective non-linear amplifiers which amplify the first and second component signals.

20. The power amplifier of claim 19, wherein the compensation signal processor further compensates for the unwanted differences by adjusting gain settings of the non-linear amplifiers.

21. The power amplifier of claim 14, wherein the first and second analog signal paths comprise respective Class A, AB, B, C, D, E, F or S amplifiers which amplify the first and second component signals.

22. The power amplifier of claim 14, wherein the first and second analog signal paths further comprise respective up-converters which convert the first and second component signals to RF frequencies, and wherein the compensation signal processor compensates for distortions caused by the up-converters.

23. The power amplifier of claim 14, wherein the first and second analog signal paths further comprise analog quadrature (IQ) modulators, and the compensation signal processor further comprises first and second IQ modulator correction circuits.

24. The power amplifier of claim 14, wherein the compensation signal processor is capable of introducing propagation delays, amplitude gains and phase rotations to the first and second component signals.

25. The power amplifier of claim 14, wherein the compensation signal processor comprises a first multi-tap finite impulse response (FIR) filter which digitally filters the first component signal, and comprises a second multi-tap FIR filter which digitally filters the second component signal, the first and second FIR filters operating based on the compensation parameters.

26. The power amplifier of claim 14, wherein the compensation estimator generates the compensation parameters based on an observation of at least (i) the first and second component signals prior to amplification, and (ii) the output transmission signal.

27. The power amplifier of claim 14, wherein the compensation estimator implements at least one of the following digital filtering algorithms to generate compensation parameters: LMS, RLS, Kalman, Extended Kalman.

28. The power amplifier of claim 14, wherein the compensation estimator generates initial values of the compensation parameters using a numerical model of at least the first and second analog signal paths.

29. A power amplifier which receives an input transmission signal and provides an output transmission signal, wherein the output transmission signal is a substantially linear amplified representation of the input transmission signal, the amplifier comprising:
 means for separating the input transmission signal into a plurality of components signals, wherein each component signal has an amplitude envelope which varies in phase and is substantially constant in amplitude;
 means for adaptively modifying the component signals to generate compensated component signals, the means for adaptively modifying compensating for unwanted differences in analog signal paths along which the compensated component signals are amplified;
 means for amplifying the compensated component signals to generate amplified, compensated component signals; and
 means for combining the amplified, compensated component signals to generate the output transmission signal.

30. The power amplifier of claim 29, further comprising means for capturing and storing digital sequences of at least the output transmission signal and of the component signals, wherein the means for adaptively modifying processes the digital sequences to generate updates to compensation parameters that are used to modify the component signals.

31. The power amplifier of claim 30, wherein the means for adaptively modifying processes the stored sequences at a digital processing rate which is substantially less than a sampling rate of the observation signals.

32. The power amplifier of claim 29, further comprising a signal generation means which generates training signals to stimulate the analog signal paths when no input transmission signal is present, the training signals used by the means for adaptively modifying to make adaptive adjustments between transmissions.

33. The power amplifier of claim 29, further comprising a means for recovering energy associated with the component signals.

34. The power amplifier of claim 29, wherein the means for amplifying comprises non-linear amplifiers which amplify the component signals.

35. The power amplifier of claim 34, wherein the means for adaptively modifying comprises means for adaptively adjusting gain settings of the non-linear amplifiers.

36. The power amplifier of claim 29, wherein the means for amplifying comprises amplifiers which fall within at least one of the following classes: A, AB, B, C, D, E, F and S.

37. The power amplifier of claim 29, wherein the means for adaptively modifying is capable of independently modifying each of the plurality of component signals.

38. The power amplifier of claim 29, wherein the means for adaptively modifying is capable of introducing propagation delays, amplitude gains and phase rotations to the component signals.

39. The power amplifier of claim 29, wherein the means for adaptively modifying implements at least one of the following digital filtering algorithms to generate compensation parameters: LMS, RLS, Kalman, Extended Kalman.

40. The power amplifier of claim 29, wherein the means for adaptively modifying comprises a first multi-tap finite impulse response (FIR) filter which digitally filters a first component signal, and comprises a second multi-tap FIR filter which digitally filters a second component signal.

41. The power amplifier of claim 29, wherein the analog signal paths further comprise analog quadrature (IQ) modulators, and the means for adaptively modifying comprises IQ modulator correction circuits.

* * * * *